United States Patent
Narang et al.

(10) Patent No.: US 6,184,263 B1
(45) Date of Patent: *Feb. 6, 2001

(54) BLENDS CONTAINING PHOTOSENSITIVE HIGH PERFORMANCE AROMATIC ETHER CURABLE POLYMERS

(75) Inventors: Ram S. Narang, Fairport; Timothy J. Fuller, Pittsford, both of NY (US)

(73) Assignee: Xerox Corporation, Stamford, CT (US)

( * ) Notice: Under 35 U.S.C. 154(b), the term of this patent shall be extended for 0 days.

This patent is subject to a terminal disclaimer.

(21) Appl. No.: 09/220,273

(22) Filed: Dec. 23, 1998

Related U.S. Application Data

(62) Division of application No. 08/705,376, filed on Aug. 29, 1996, now Pat. No. 5,958,995.

(51) Int. Cl.$^7$ .............................. G03F 7/038; C08L 71/12; C08L 81/06

(52) U.S. Cl. ........................ 522/111; 522/134; 522/135; 522/146; 522/141; 522/162; 522/163; 522/164; 522/165; 522/166; 522/142; 522/136; 430/270.1; 430/280.1; 525/391; 525/420; 525/471

(58) Field of Search ...................................... 522/162, 163, 522/164, 165, 166, 111, 134, 146, 136, 135, 141, 142; 430/270.1, 280.1; 525/391, 471, 420

(56) References Cited

U.S. PATENT DOCUMENTS

| | | | |
|---|---|---|---|
| 3,455,868 | 7/1969 | D'Alessandro | 260/38 |
| 4,086,209 | 4/1978 | Hara et al. | 260/49 |
| 4,435,496 | 3/1984 | Walls et al. | 430/285 |

(List continued on next page.)

FOREIGN PATENT DOCUMENTS

| | | |
|---|---|---|
| 0-281-808 | 9/1988 | (EP) . |
| 0 452 110 A1 | 10/1991 | (EP) . |
| 0 663 411 A1 | 7/1995 | (EP) . |

(List continued on next page.)

OTHER PUBLICATIONS

Daly, "Chloromethylation of Condensation Polymers Containing an Oxy–1,4–Phenylene Backbone," Polymers Preprints (1979), vol. 20, No. 1, pp. 835–837.

Camps, "Chloromethylstyrene: Synthesis, Polymerization, Transformations, Applications," JMS–REV. Macromol, Chem. Phys., C22(3), 343–407 (1982–83).

(List continued on next page.)

*Primary Examiner*—Susan W. Berman
(74) *Attorney, Agent, or Firm*—Judith L. Byorick

(57) ABSTRACT

A composition which comprises a mixture of (A) a first component comprising a polymer, at least some of the monomer repeat units of which have at least one photosensitivity-imparting group thereon, said polymer having a first degree of photosensitivity-imparting group substitution and being of the formulae specified in the claims, and (B) a second component which comprises either (1) a polymer having a second degree of photosensitivity-imparting group substitution lower than the first degree of photosensitivity-imparting group substitution, wherein said second degree of photosensitivity-imparting group substitution may be zero, wherein the mixture of the first component and the second component has a third degree of photosensitivity-imparting group substitution which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution, wherein the mixture of the first component and the second component has a fifth degree of photosensitivity-imparting group substitution which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture.

20 Claims, 3 Drawing Sheets

U.S. PATENT DOCUMENTS

| | | | |
|---|---|---|---|
| 4,623,558 | 11/1986 | Lin | 427/44 |
| 4,667,010 | 5/1987 | Eldin | 528/125 |
| 4,739,032 | 4/1988 | Jones | 528/230 |
| 4,908,405 | 3/1990 | Bayer et al. | 525/61 |
| 5,268,444 | 12/1993 | Jensen et al. | 528/125 |
| 5,336,720 | 8/1994 | Richards | 525/78 |
| 5,438,082 | 8/1995 | Helmer-Metzmann et al. | 522/149 |
| 5,561,202 | 10/1996 | Helmer-Metzmann et al. | 525/471 |
| 5,681,888 | 10/1997 | Nomura et al. | 524/496 |
| 5,753,783 | 5/1998 | Fuller et al. | 522/71 |
| 5,761,809 | 6/1998 | Fuller et al. | 522/71 |

FOREIGN PATENT DOCUMENTS

| | | |
|---|---|---|
| 53-079-983 | 7/1978 | (JP) . |
| 56-050-928 | 5/1981 | (JP) . |
| 56-50-929 | 5/1981 | (JP) . |
| 6-57-826 | 5/1981 | (JP) . |
| 61-080-242 | 4/1986 | (JP) . |
| 3-011-350 | 1/1991 | (JP) . |

OTHER PUBLICATIONS

Jurek, "Deep UV Photochemistry of Copolymers of Trimethylsilymethyl Methacrylate and Chloromethylstyrene," Polymer Preprints, pp. 546–547, 1988.

Hergenrother, "Poly(arylene ethers)," Polymer, vol. 29, Feb., 1988.

Havens, "Ethynyl–Terminated Polyarylates: Synthesis and Characterization," Journal of Polymer Science: Polymer Chemistry Edition, vol. 22, pp. 3011–3025, 1984.

Hendricks, "Flare, A Low Dielectric Constant, High Tg, Thermally Stable Poly(Arylene Ether) Dielectric for Microelectronic Circuit Interconnect Process Integration: Synthesis, Characterization, Thermomechanical Properties, and Thin–Film Processing Studies," Polymer Preprints 37(1) 150 (1996), vol. 37, No. 1, pp. 150–151, Mar. 1996.

Zupancic, "Styrene Terminated Resins as Interlevel Dielectrics for Multichip Modules," pp. 178–179, 1991.

Tabata, "Pulse Radiolysis Studies on the Mechanism of the High Sensitivity of Chloromethylated Polystryene as an Electron Negative Resist," pp. 287–288, 1984.

Percec, "Functional Polymers and Sequential Copolymers by Phase Transfer Catalysis, 2a)," Makromal Chem., pp. 1867–1880, 1984.

Percec, "Functional Polymers and Sequential Copolymers by Phase Transfer Catalysis, 3a)," Makronal Chem., pp. 2319–2336, 1984.

Percec, "Functional Polymers and Sequential Copolymers by Phase Transfer Catalysis 4. A New and Convenient Synthesis of p– and m–Hydrozymethylphenylacetylene," Polymer Bulletin 10, 223–230, 1983.

Amato, "A New Preparation of Chloromethyl Methyl Ether Free of Bis(chloromethyl) Ether," Georg Thieme Publishers, 1979.

McKillop, "A Simple and Inexpensive Procedure for Chloromethylation of Certain Aromatic Compounds," Tetrahedron Letters, vol. 24, No. 18, pp. 1933–1936, 1983.

Tepenitsyna, "Synthesis of Intermediates for Production of Heat Resistant Polymers (Chloromethylation of Diphenyl Oxide)," Zhurnal Prikladnoi Khimii, vol. 40, No. 11, Nov., pp. 2540–2546, 1967.-

BLENDS CONTAINING PHOTOSENSITIVE HIGH PERFORMANCE AROMATIC ETHER CURABLE POLYMERS

This application is a divisional of application Ser. No. 08/705,376, filed Aug. 29, 1996, now U.S. Pat. No. 5,958,995.

BACKGROUND OF THE INVENTION

The present invention is directed to improved curable compositions. More specifically, the present invention is directed to compositions and processes which enable the preparation of compositions containing curable polymers, said compositions having uniform weight average molecular weight and a uniform degree of substitution with curable groups. One embodiment of the present invention is directed to a composition which comprises a mixture of (A) a first component comprising a polymer, at least some of the monomer repeat units of which have at least one photosensitivity-imparting group thereon, said polymer having a first degree of photosensitivity-imparting group substitution measured in milliequivalents of photosensitivity-imparting group per gram and being of the general formula

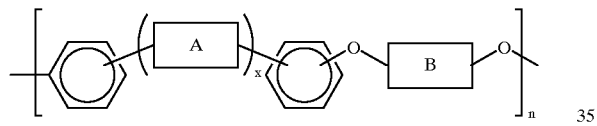

or

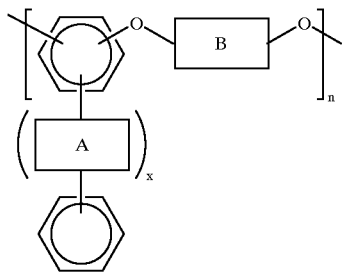

wherein x is an integer of 0 or 1, A is

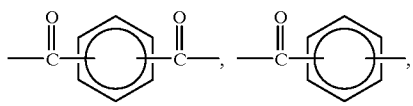

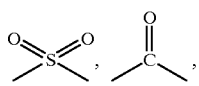

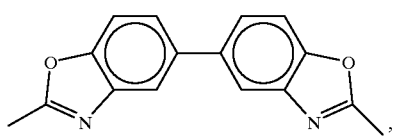

-continued

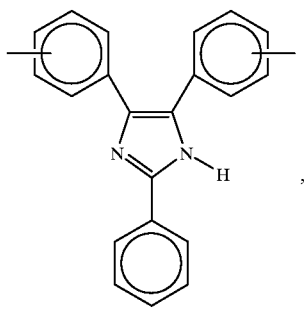

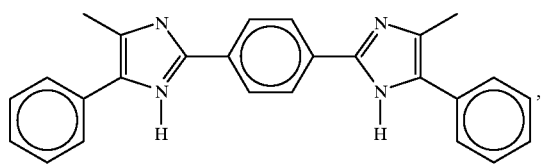

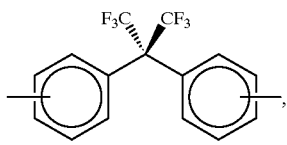

—O—, —C(CH$_3$)$_2$—, or mixtures thereof, B is

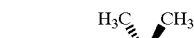

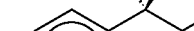

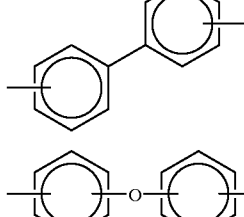

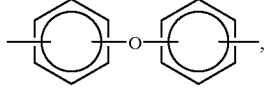

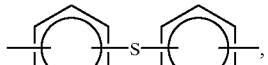

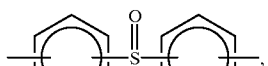

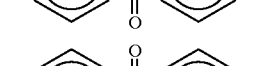

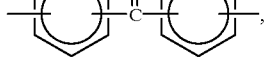

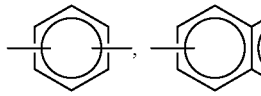

-continued

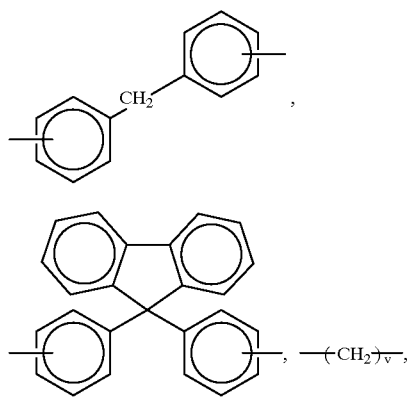

wherein v is an integer from 1 to about 20,

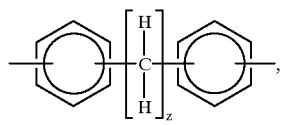

wherein z is an integer from 2 to about 20,

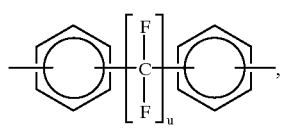

wherein u is an integer from 1 to about 20,

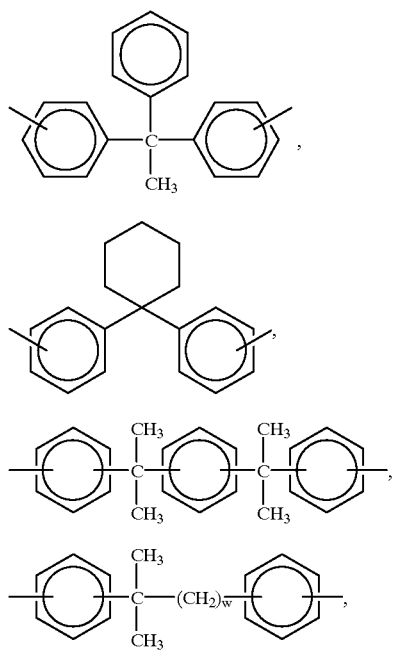

wherein w is an integer of from 1 to about 20,

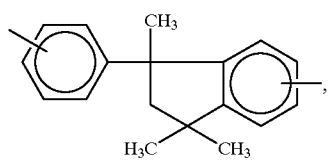

-continued

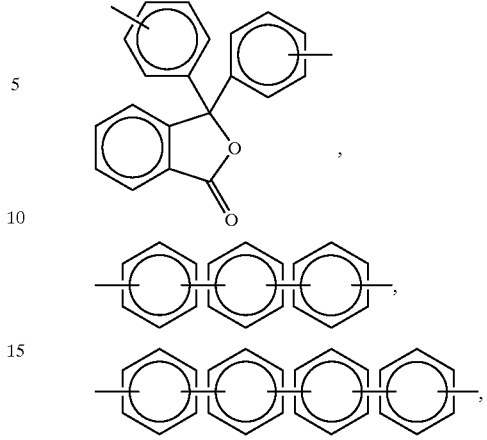

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture.

Another embodiment of the present invention is directed to a process which comprises the steps of:

(a) depositing a layer comprising the above polymer-containing composition onto a lower substrate in which one surface thereof has an array of heating elements and addressing electrodes having terminal ends formed thereon, said polymer being deposited onto the surface having the heating elements and addressing electrodes thereon;

(b) exposing the layer to actinic radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;

(c) removing the polymer from the unexposed areas, thereby forming recesses in the layer, said recesses exposing the heating elements and the terminal ends of the addressing electrodes;

(d) providing an upper substrate with a set of parallel grooves for subsequent use as ink channels and a recess for subsequent use as a manifold, the grooves being open at one end for serving as droplet emitting nozzles; and (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

In microelectronics applications, there is a great need for low dielectric constant, high glass transition temperature, thermally stable, photopatternable polymers for use as interlayer dielectric layers and as passivation layers which protect microelectronic circuitry. Poly(imides) are widely used to satisfy these needs; these materials, however, have disadvantageous characteristics such as relatively high water sorption and hydrolytic instability. There is thus a need for high performance polymers which can be effectively photopatterned and developed at high resolution.

One particular application for such materials is the fabrication of ink jet printheads. Ink jet printing systems generally are of two types: continuous stream and drop-on-demand. In continuous stream ink jet systems, ink is emitted in a continuous stream under pressure through at least one orifice or nozzle. The stream is perturbed, causing it to break up into droplets at a fixed distance from the orifice. At the break-up point, the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, the system is much simpler than the continuous stream type. There are different types of drop-on-demand ink jet systems. One type of drop-on-demand system has as its major components an ink filled channel or passageway having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high quality copies. Drop-on-demand systems which use piezoelectric devices to expel the droplets also suffer the disadvantage of a slow printing speed.

The other type of drop-on-demand system is known as thermal ink jet, or bubble jet, and produces high velocity droplets and allows very close spacing of nozzles. The major components of this type of drop-on-demand system are an ink filled channel having a nozzle on one end and a heat generating resistor near the nozzle. Printing signals representing digital information originate an electric current pulse in a resistive layer within each ink passageway near the orifice or nozzle, causing the ink in the immediate vicinity to vaporize almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles, commonly referred to as the "bubble jet" system, the drop-on-demand ink jet printers provide simpler, lower cost devices than their continuous stream counterparts, and yet have substantially the same high speed printing capability.

The operating sequence of the bubble jet system begins with a current pulse through the resistive layer in the ink filled channel, the resistive layer being in close proximity to the orifice or nozzle for that channel. Heat is transferred from the resistor to the ink. The ink becomes superheated far above its normal boiling point, and for water based ink, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to heat of vaporization. The expansion of the bubble forces a droplet of ink out of the nozzle, and once the excess heat is removed, the bubble collapses. At this point, the resistor is no longer being heated because the current pulse has passed and, concurrently with the bubble collapse, the droplet is propelled at a high rate of speed in a direction towards a recording medium. The surface of the printhead encounters a severe cavitational force by the collapse of the bubble, which tends to erode it. Subsequently, the ink channel refills by capillary action. This entire bubble formation and collapse sequence occurs in about 10 microseconds. The channel can be refired after 100 to 500 microseconds minimum dwell time to enable the channel to be refilled and to enable the dynamic refilling factors to become somewhat dampened. Thermal ink jet equipment and processes are well known and are described in, for example, U.S. Pat. Nos. 4,601,777, 4,251, 824, 4,410,899, 4,412,224, 4,532,530, and 4,774,530, the disclosures of each of which are totally incorporated herein by reference.

The present invention is suitable for ink jet printing processes, including drop-on-demand systems such as thermal ink jet printing, piezoelectric drop-on-demand printing, and the like.

In ink jet printing, a printhead is usually provided having one or more ink-filled channels communicating with an ink supply chamber at one end and having an opening at the opposite end, referred to as a nozzle. These printheads form images on a recording medium such as paper by expelling droplets of ink from the nozzles onto the recording medium. The ink forms a meniscus at each nozzle prior to being expelled in the form of a droplet. After a droplet is expelled, additional ink surges to the nozzle to reform the meniscus.

In thermal ink jet printing, a thermal energy generator, usually a resistor, is located in the channels near the nozzles a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. The rapidly expanding vapor bubble pushes the column of ink filling the channel towards the nozzle. At the end of the current pulse the heater rapidly cools and the vapor bubble begins to collapse. However, because of inertia, most of the column of ink that received an impulse from the exploding bubble continues its forward motion and is ejected from the nozzle as an ink drop. As the bubble begins to collapse, the ink still in the channel between the nozzle and bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity of the droplet in a substantially straight line direction towards a recording medium, such as paper.

Ink jet printheads include an array of nozzles and may, for example, be formed of silicon wafers using orientation dependent etching (ODE) techniques. The use of silicon wafers is advantageous because ODE techniques can form structures, such as nozzles, on silicon wafers in a highly precise manner. Moreover, these structures can be fabricated efficiently at low cost. The resulting nozzles are generally triangular in cross-section. Thermal ink jet printheads made by using the above-mentioned ODE techniques typically comprise a channel plate which contains a plurality of nossle-defining channels located on a lower surface thereof bonded to a heater plate having a plurality of resistive heater elements formed on an upper surface thereof and arranged so that a heater element is located in each channel. The upper surface of the heater plate typically includes an insulative layer which is patterned to form recesses exposing the individual heating elements. This insulative layer is referred to as a "pit layer" and is sandwiched between the channel plate and heater plate. For examples of printheads employing this construction, see U.S. Pat. Nos. 4,774,530 and 4,829,324, the disclosures of each of which are totally incorporated herein by reference. Additional examples of thermal ink jet printheads are disclosed in, for example, U.S. Pat. Nos. 4,835,553, 5,057,853, and 4,678,529, the disclosures of each of which are totally incorporated herein by reference.

The photopatternable polymers prepared by the process of the present invention are also suitable for other photoresist applications, including other microelectronics applications, printed circuit boards, lithographic printing processes, interlayer dielectrics, and the like.

U.S. Pat. No. 3,914,194 (Smith), the disclosure of which is totally incorporated herein by reference, discloses a formaldehyde copolymer resin having dependent unsaturated groups with the repeating unit

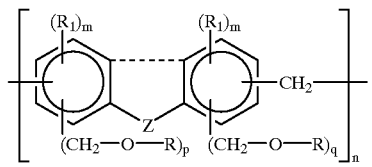

wherein R is an aliphatic acyl group derived from saturated acids having 2 to 6 carbons, olefinically unsaturated acids having 3 to 20 carbons, or an omega-carboxy-aliphotic acyl group derived from olefinically unsaturated dicarboxylic acids having 4 to 12 carbons or mixtures thereof, $R_1$ is independently hydrogen, an alkyl group of 1 to 10 carbon atoms, or halogen, Z is selected from oxygen, sulfur, the group represented by Z taken with the dotted line represents dibenzofuran and dibenzothiophene moieties, or mixtures thereof, n is a whole number sufficient to give a weight average molecular weight greater than about 500, m is 0 to 2, p and q have an average value of 0 to 1 with the proviso that the total number of p and q groups are sufficient to give greater than one unsaturated group per resin molecule. These resins are useful to prepare coatings on various substrates or for potting electrical components by mixing with reactive diluents and curing agents and curing.

"Chloromethylation of Condensation Polymers Containing an oxy-1,4-phenylene Backbone," W. H. Daly et al., *Polymer Preprints,* Vol. 20, No. 1, 835 (1979), the disclosure of which is totally incorporated herein by reference, discloses the chloromethylation of polymers containing oxyphenylene repeat units to produce film forming resins with high chemical reactivity. The utility of 1,4-bis (chloromethoxy) butane and 1-chloromethoxy-4-chlorobutane as chloromethylating agents are also described.

European Patent Application EP-0,698,823-A1 (Fahey et al.), the disclosure of which is totally incorporated herein by reference, discloses a copolymer of benzophenone and bisphenol A which was shown to have deep ultraviolet absorption properties. The copolymer was found useful as an antireflective coating in microlithography applications. Incorporating anthracene into the copolymer backbone enhanced absorption at 248 nm. The encapper used for the copolymer varied depending on the needs of the user and was selectable to promote adhesion, stability, and absorption of different wavelengths.

M. Camps. M. Chatzopoulos, and J. Montheard, "Chloromethyl Styrene: Synthesis, Polymerization, Transformations, Applications," *JMS—Rev. Macromol. Chem. Phys.,* C22(3), 343–407 (1982–3), the disclosure of which is totally incorporated herein by reference, discloses processes for the preparation of chloromethyl-substituted polystyrenes, as well as applications thereof.

Y. Tabata, S. Tagawa, and M. Washio, "Pulse Radiolysis Studies on the Mechanism of the High Sensitivity of Chloromethylated Polystyrene as an Electron Negative Resist," *Lithography,* 25(1), 287 (1984), the disclosure of which is totally incorporated herein by reference, discloses the use of chloromethylated polystyrene in resist applications.

M. J. Jurek, A. E. Novembre, I. P. Heyward, R. Gooden, and E. Reichmanis, "Deep UV Photochemistry of Copolymers of Trimethyl-Silylmethyl Methacrylate and Chloromethylstyrene," *Polymer Preprints,* 29(1) (1988), the disclosure of which is totally incorporated herein by reference, discloses the use of an organosilicon polymer of chloromethylstyrene for resist applications.

P. M. Hergenrother, B. J. Jensen, and S. J. Havens, "Poly(arylene ethers)," *Polymer,* 29, 358 (1988), the disclosure of which is totally incorporated herein by reference, discloses several arylene ether homopolymers and copolymers prepared by the nucleophilic displacement of aromatic dihalides with aromatic potassium bisphenates. Polymer glass transition temperatures ranged from 114 to 310° C. and some were semicrystalline. Two ethynyl-terminated polyarylene ethers) were synthesized by reacting hydroxyterminated oligomers with 4-ethynylbenzoyl chloride. Heat induced reaction of the acetylenic groups provided materials with good solvent resistance. The chemistry, physical, and mechanical properties of the polymers are also disclosed.

S. J. Havens, "Ethynyl-Terminated Polyarylates: Synthesis and Characterization," *Journal of Polymer Science: Polymer Chemistry Edition,* vol. 22, 3011–3025 (1984), the disclosure of which is totally incorporated herein by reference, discloses hydroxy-terminated polyarylates with number average molecular weights of about 2500, 5000, 7500, and 10,000 which were synthesized and converted to corresponding 4-ethynylbenzoyloxy-terminated polyarylates by reaction with 4-ethynylbenzoyl chloride. The terminal ethynyl groups were thermally reacted to provide chain extension and crosslinking. The cured polymer exhibited higher glass transition temperatures and better solvent resistance than a high molecular weight linear polyarylate. Solvent resistance was further improved by curing 2,2-bis (4-ethynylbenzoyloxy-4'-phenyl)propane, a coreactant, with the ethynyl-terminated polymer at concentrations of about 10 percent by weight.

N. H. Hendricks and K. S. Y. Lau, "Flare, a Low Dielectric Constant, High Tg, Thermally Stable Poly(arylene ether)

Dielectric for Microelectronic Circuit Interconnect Process Integration: Synthesis, Characterization, Thermomechanical Properties, and Thin-Film Processing Studies," *Polymer Preprints,* 37(1), 150 (1996), the disclosure of which is totally incorporated herein by reference, discloses non-carbonyl containing aromatic polyethers such as fluorinated poly(arylene ethers) based on decafluorobiphenyl as a class of intermetal dielectrics for applications in sub-half micron multilevel interconnects.

J. J. Zupancic, D. C. Blazej, T. C. Baker, and E. A. Dinkel, "Styrene Terminated Resins as Interlevel Dielectrics for Multichip Models," *Polymer Preprints,* 32, (2), 178 (1991), the disclosure of which is totally incorporated herein by reference, discloses vinylbenzyl ethers of polyphenols (styrene terminated resins) which were found to be photochemically and thermally labile, generating highly crosslinked networks. The resins were found to yield no volatile by-products during the curing process and high glass transition, low dielectric constant coatings. One of the resins was found to be spin coatable to varying thickness coatings which could be photodefined, solvent developed, and then hard baked to yield an interlevel dielectric.

Japanese Patent Kokai JP 04294148-A, the disclosure of which is totally incorporated herein by reference, discloses a liquid injecting recording head containing the cured matter of a photopolymerizable composition comprising (1) a graft polymer comprising (A) alkyl methacrylate, acrylonitrile, and/or styrene as the trunk chain and an —OH group-containing acryl monomer, (B) amino or alkylamino group-containing acryl monomer, (C) carboxyl group-containing acryl or vinyl monomers, (D) N-vinyl pyrrolidone, vinyl pyridine or its derivatives, and/or (F) an acrylamide as the side chain; (2) a linear polymer containing constitutional units derived from methyl methacrylate, ethyl methacrylate, isobutyl methacrylate, t-butyl methacrylate, benzyl methacrylate, acrylonitrile, isobornyl methacrylate, tricyclodecane acrylate, tricyclodecane oxyethyl methacrylate, styrene, dimethylaminoethyl methacrylate, and/or cyclohexyl methacrylate, and constitutional unit derived from the above compounds (A), (B), (C), (D), (E), or (F) above; (3) an ethylenic unsaturated bond containing monomer; and (4) a photopolymerization initiator which contains (a) an organic peroxide, s-triazine derivative, benzophenone or its derivatives, quinones, N-phenylglycine, and/or alkylarylketones as a radical generator and (b) coumarin dyes, ketocoumarin dyes, cyanine dyes, merocyanine dyes, and/or xanthene dyes as a sensitizer.

"Functional Polymers and Sequential Copolymers by Phase Transfer Catalysis, 2a: Synthesis and Characterization of Aromatic Poly(ether sulfone)s Containing Vinylbenzyl and Ethynylbenzyl Chain Ends," V. Percec and B. C. Auman, *Makromol. Chem.,* 185, 1867–1880 (1984), the disclosure of which is totally incorporated herein by reference, discloses a method for the synthesis of α,ω-bis (vinylbenzyl) aromatic poly(ether sulfone)s and their transformation into α,ω-bis(ethynylbenzyl) aromatic poly(ether sulfone)s. The method entails a fast and quantitative Williamson etherification of the α,ω-bis(hydroxyphenyl) polysulfone with a mixture of p- and m-chloromethylstyrenes in the presence of tetrabutylammonium hydrogen sulfate as phase transfer catalyst, a subsequent bromination, and then a dehydrobromination with potassium tert-butoxide. The DSC study of the thermal curing of the α,ω-bis(vinylbenzyl) aromatic poly(ether sulfone)s and α,ω-bis(ethynylbenzyl) aromatic poly(ether sulfone)s demonstrates high thermal reactivity for the styrene-terminated oligomers.

"Functional Polymers and Sequential Copolymers by Phase Transfer Catalysis, 3a: Synthesis and Characterization of Aromatic Poly(ether sulfone)s and Poly(oxy-2,6-dimethyl-1,4-phenylene) Containing Pendent Vinyl Groups," V. Percec and B. C. Auman, *Makromol. Chem.,* 185, 2319–2336 (1984), the disclosure of which is totally incorporated herein by reference, discloses a method for the syntheses of α,ω-benzyl aromatic poly(ether sulfone)s (PSU) and poly(oxy-2,6-dimethyl-1,4-phenylene) (POP) containing pendant vinyl groups. The first step of the synthetic procedure entails the chloromethylation of PSU and POP to provide polymers with chloromethyl groups. POP, containing bromomethyl groups, was obtained by radical bromination of the methyl groups. Both chloromethylated and bromomethylated starting materials were transformed into their phosphonium salts, and then subjected to a phase transfer catalyzed Wittig reaction to provide polymers with pendant vinyl groups. A PSU with pendant ethynyl groups was prepared by bromination of the PSU containing vinyl groups, followed by a phase transfer catalyzed dehydrobromination. DSC of the thermal curing of the polymers containing pendant vinyl and ethynyl groups showed that the curing reaction is much faster for the polymers containing vinyl groups. The resulting network polymers are flexible when the starting polymer contains vinyl groups, and very rigid when the starting polymer contains ethynyl groups.

"Functional Polymers and Sequential Copolymers by Phase Transfer Catalysis," V. Percec and P. L. Rinaldi, *Polymer Bulletin,* 10, 223 (1983), the disclosure of which is totally incorporated herein by, reference, discloses the preparation of p- and m-hydroxymethylphenylacetylenes by a two step sequence starting from a commercial mixture of p- and m-chloromethylstyrene, i.e., by the bromination of the vinylic monomer mixture followed by separation of m- and p-brominated derivatives by fractional crystallization, and simultaneous dehydrobromination and nucleophilic substitution of the —Cl with —OH.

U.S. Pat. No. 4,110,279 (Nelson et al.), the disclosure of which is totally incorporated herein by reference, discloses a polymer derived by heating in the presence of an acid catalyst at between about 65° C. and about 250° C.: I. a reaction product, a cogeneric mixture of alkoxy functional compounds, having average equivalent weights in the range of from about 220 to about 1200, obtained by heating in the presence of a strong acid at about 50° C. to about 250° C.: (A) a diaryl compound selected from naphthalene, diphenyl oxide, diphenyl sulfide, their alkylated or halogenated derivatives, or mixtures thereof, (B) formaldehyde or formaldehyde yielding derivative, (C) water, and (D) a hydroxy aliphatic hydrocarbon compound having at least one free hydroxyl group and from 1 to 4 carbon atoms, which mixture contains up to 50 percent unreacted (A); with II. at least one monomeric phenolic reactant selected from the group

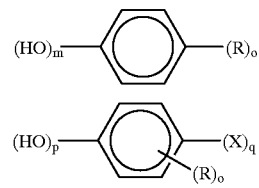

wherein R is selected from the group consisting of hydrogen, alkyl radical of 1 to 20 carbon atoms, aryl radical of 6 to 20 carbon atoms, wherein $R_1$ represents hydrogen, alkyl, or aryl, m represents an integer from 1 to 3, o represents an integer from 1 to 5, p represents an integer from 0 to 3, X represents oxygen, sulfur, or alkylidene, and q represents an integer from 0 to 1; and III. optionally an aldehyde or aldehyde-yielding derivative or ketone, for from several minutes to several hour. The polymeric materials are liquids or low melting solids which are capable of further modification to thermoset resins. These polymers are capable of being thermoset by heating at a temperature of from about 130° C. to about 260° C. for from several minutes to several hours in the presence of a formaldehyde-yielding compound. These polymers are also capable of further modification by reacting under basic conditions with formaldehyde with or without a phenolic compound. The polymers, both base catalyzed resoles and acid catalyzed novolacs, are useful as laminating, molding, film-forming, and adhesive materials. The polymers, both resoles and novolacs, can be epoxidized as well as reacted with a drying oil to produce a varnish resin.

U.S. Pat. No. 3,367,914 (Herbert), the disclosure of which is totally incorporated herein by reference, discloses thermosetting resinous materials having melting points in the range of from 150° C. to 350° C. which are made heating at a temperature of from −10° C. to 100° C. for 5 to 30 minutes an aldehyde such as formaldehyde or acetaldehyde with a mixture of poly(aminomethyl) diphenyl ethers having an average of from about 1.5 to 4.0 aminomethyl groups. After the resins are cured under pressure at or above the melting point, they form adherent tough films on metal substrates and thus are useful as wire coatings for electrical magnet wire for high temperature service at 180° C. or higher.

J. S. Amato, S. Karady, M. Sletzinger, and L. M. Weinstock, "A New Preparation of Chloromethyl Methyl Ether Free of Bis(chloromethyl) Ether," Synthesis, 970 (1979), the disclosure of which is totally incorporated herein by reference, discloses the synthesis of chloromethyl methyl ether by the addition of acetyl chloride to a slight excess of anhydrous dimethoxymethane containing a catalytic amount of methanol at room temperature. The methanol triggers a series of reactions commencing with formation of hydrogen chloride and the reaction of hydrogen chloride with dimethoxymethane to form chloromethyl methyl ether and methanol in an equilibrium process. After 36 hours, a near-quantitative conversion to an equimolar mixture of chloromethyl methyl ether and methyl acetate is obtained.

A. McKillop, F. A. Madjdabadi, and D. A. Long, "A Simple and Inexpensive Procedure for Chloromethylation of Certain Aromatic Compounds," Tetrahedron Letters, Vol. 24, No. 18, pp. 1933–1936 (1983), the disclosure of which is totally incorporated herein by reference, discloses the reaction of a range of aromatic compounds with methoxyacetyl chloride and aluminum chloride in either nitromethane or carbon disulfide to result in chloromethylation in good to excellent yield.

E. P. Tepenitsyna, M. I. Farberov, and A. P. Ivanovskii, "Synthesis of Intermediates for Production of Heat Resistant Polymers (Chloromethylation of Diphenyl Oxide)," Zhurnal Prikladnoi Khimii, Vol. 40, No. 11, pp. 2540–2546 (1967), the disclosure of which is totally incorporated herein by reference, discloses the chloromethylation of diphenyl oxide by (1) the action of paraformaldehyde solution in glacial acetic acid saturated with hydrogen chloride, and by (2) the action of paraformaldehyde solution in concentrated hydrochloric acid.

U.S. Pat. No. 2,125,968 (Theimer), the disclosure of which is totally incorporated herein by reference, discloses the manufacture of aromatic alcohols by the Friedel-Crafts reaction, in which an alkylene oxide is condensed with a Friedel-Crafts reactant in the presence of an anhydrous metal halide.

Copending application U.S. Ser. No. 08/705,914 filed Aug. 29, 1996, entitled "Thermal Ink Jet Printhead With Ink Resistant Heat Sink Coating," with the named inventors Ram S. Narang and Timothy J. Fuller, the disclosure of which is totally incorporated herein by reference, discloses a heat sink for a thermal ink jet printhead having improved resistance to the corrosive effects of ink by coating the surface of the heat sink with an ink resistant film formed by electrophoretically depositing a polymeric material on the heat sink surface. In one described embodiment, a thermal ink jet printer is formed by bonding together a channel plate and a heater plate. Resistors and electrical connections are formed in the surface of the heater plate. The heater plate is bonded to a heat sink comprising a zinc substrate having an electrophoretically deposited polymeric film coating. The film coating provides resistance to the corrosion of higher pH inks. In another embodiment, the coating has conductive fillers dispersed therethrough to enhance the thermal conductivity of the heat sink. In one embodiment, the polymeric material is selected from the group consisting of polyethersulfones, polysulfones, polyamides, polyimides, polyamide-imides, epoxy resins, polyetherimides, polyarylene ether ketones, chloromethylated polyarylene ether ketones, acryloylated polyarylene ether ketones, polystyrene and mixtures thereof.

Copending application U.S. Ser. No. 08/703,138, filed Aug. 29, 1996, now U.S. Pat. No. 5,843,259, entitled "Method for Applying an Adhesive Layer to a Substrate Surface," with the named inventors Ram S. Narang, Stephen F. Pond, and Timothy J. Fuller, the disclosure of which is totally incorporated herein by reference, discloses a method for uniformly coating portions of the surface of a substrate which is to be bonded to another substrate. In a described embodiment, the two substrates are channel plates and heater plates which, when bonded together, form a thermal ink jet printhead. The adhesive layer is electrophoretically deposited over a conductive pattern which has been formed on the binding substrate surface. The conductive pattern forms an electrode and is placed in an electrophoretic bath comprising a colloidal emulsion of a preselected polymer adhesive. The other electrode is a metal container in which the solution is placed or a conductive mesh placed within the container. The electrodes are connected across a voltage source and a field is applied. The substrate is placed in contact with the solution, and a small current flow is carefully controlled to create an extremely uniform thin deposition of charged adhesive micelles on the surface of the conductive pattern. The substrate is then removed and can be bonded to a second substrate and cured. In one embodiment, the polymer adhesive is selected from the group consisting of polyamides, polyimides, polyamide-imides, epoxy resins, polyetherimides, polysulfones, polyether sulfones, polyarylene ether ketones, polystyrenes, chloromethylated polyarylene ether ketones, acryloylated plyarylene ether ketones, and mixtures thereof.

Copending application U.S. Ser. No. 08/697,750 filed Aug. 29, 1996, entitled "Electrophoretically Deposited Coating For the Front Face of an Ink Jet Printhead," with the named inventors Ram S. Narang, Stephen F. Pond, and Timothy J. Fuller, the disclosure of which is totally incorporated herein by reference, discloses an electrophoretic deposition technique for improving the hydrophobicity of a metal surface, in one embodiment, the front face of a thermal ink jet printhead. For this example, a thin metal layer is first deposited on the front face. The front face is then lowered into a colloidal bath formed by a fluorocarbon-doped organic system dissolved in a solvent and then dispersed in a non-solvent. An electric field is created and a small amount of current through the bath causes negatively charged particles to be deposited on the surface of the metal coating. By controlling the deposition time and current strength, a very uniform coating of the fluorocarbon compound is formed on the metal coating. The electrophoretic coating process is conducted at room temperature and enables a precisely controlled deposition which is limited only to the front face without intrusion into the front face orifices. In one embodiment, the organic compound is selected from the group consisting of polyimides, polyamides, polyamide-imides, polysulfones, polyarylene ether ketones, polyethersulfones, polytetrafluoroethylenes, polyvinylidene fluorides, polyhexafluoro-propylenes, epoxies, polypentafluorostyrenes, polystyrenes, copolymers thereof, terpolymers thereof, and mixtures thereof.

Copending application U.S. Ser. No. 08/705,916, filed Aug. 29, 1996, now U.S. Pat. No. 5,939,206, entitled "Stabilized Graphite Substrates," with the named inventors Gary A. Kneezel, Ram S. Narang, Timothy J. Fuller, and Peter J. John, the disclosure of which is totally incorporated herein by reference, discloses an apparatus which comprises at least one semiconductor chip mounted on a substrate, said substrate comprising a graphite member having electrophoretically deposited thereon a coating of a polymeric material. In one embodiment, the semiconductor chips are thermal ink jet printhead subunits. In one embodiment, the polymeric material is of the general formula

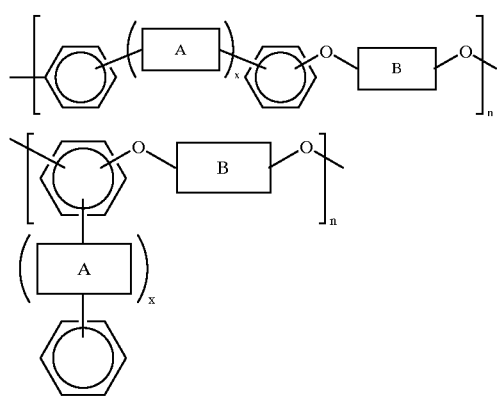

wherein x is an integer of 0 or 1, A is one of several specified groups, such as

B is one of several specified groups, such as

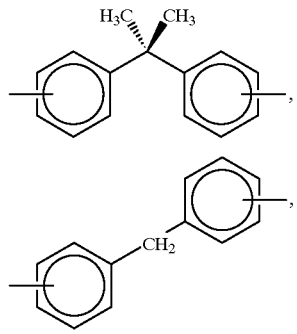

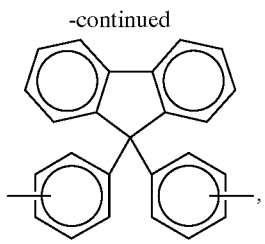

or mixtures thereof, and n is an integer representing the number of repeating monomer units.

Copending application U.S. Ser. No. 08/705,375, filed Aug. 29, 1996, now U.S. Pat. No. 5,994,425 entitled "Improved Curable Compositions," with the named inventors Timothy J. Fuller, Ram S. Narang, Thomas W. Smith, David J. Luca, and Ralph A. Mosher, the disclosure of which is totally incorporated herein by reference, discloses an improved composition comprising a photopatternable polymer containing at least some monomer repeat units with photosensitivity-imparting substituents, said photopatternable polymer being of the general formula

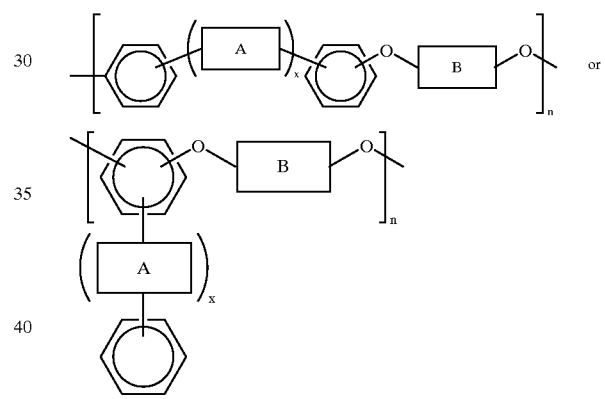

wherein x is an integer of 0 or 1, A is one of several specified groups, such as

B is one of several specified groups, such as

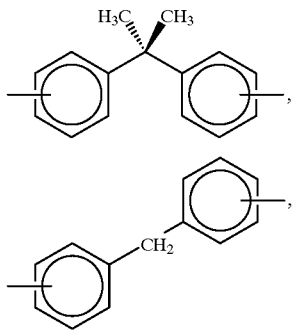

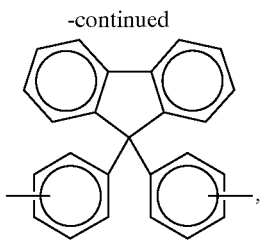

or mixtures thereof, and n is an integer representing the number of repeating monomer units. Also disclosed is a process for preparing a thermal ink jet printhead with the aforementioned polymer and a thermal ink jet printhead containing therein a layer of a crosslinked or chain extended polymer of the above formula.

Copending application U.S. Ser. No. 08/705,365, filed Aug. 29, 1996, now U.S. Pat. No. 5,849,809 entitled "Hydroxyalkylated High Performance Curable Polymers," with the named inventors Ram S. Narang and Timothy J. Fuller, the disclosure of which is totally incorporated herein by reference, discloses a composition which comprises (a) a polymer containing at least some monomer repeat units with photosensitivity-imparting substituents which enable crosslinking or chain extension of the polymer upon exposure to actinic radiation, said polymer being of the formula

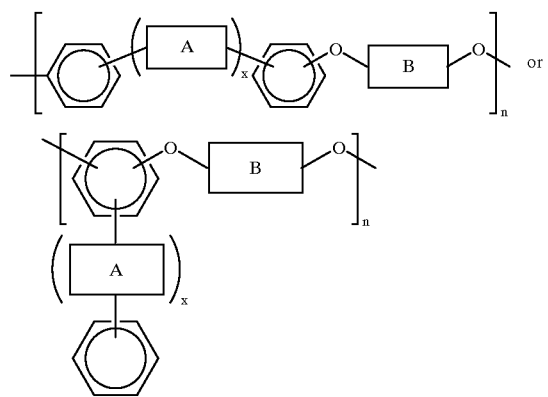

wherein x is an integer of 0 or 1, A is one of several specified groups, such as

B is one of several specified groups, such as

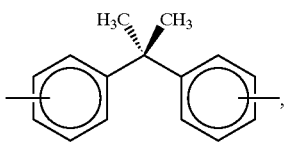

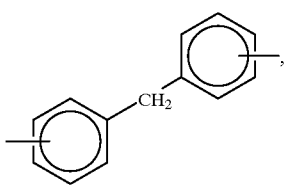

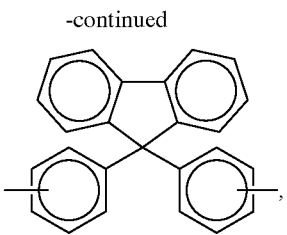

or mixtures thereof, and n is an integer representing the number of repeating monomer units, wherein said photosensitivity-imparting substituents are hydroxyalkyl groups; (b) at least one member selected from the group consisting of photoinitiators and sensitizers; and (c) an optional solvent. Also disclosed are processes for preparing the above polymers and methods of preparing thermal ink jet printheads containing the above polymers.

Copending application U.S. Ser. No. 08/705,488, filed Aug. 29, 1996, entitled "Improved High Performance Polymer Compositions," with the named inventors Thomas W. Smith, Timothy J. Fuller, Ram S. Narang, and David J. Luca, the disclosure of which is totally incorporated herein by reference, discloses a composition comprising a polymer with a weight average molecular weight of from about 1,000 to about 65,000, said polymer containing at least some monomer repeat units with a first, photosensitivity-imparting substituent which enables crosslinking or chain extension of the polymer upon exposure to actinic radiation, said polymer also containing a second, thermal sensitivity-imparting substituent which enables further polymerization of the polymer upon exposure to temperatures of about 140° C. and higher, wherein the first substituent is not the same as the second substituent, said polymer being selected from the group consisting of polysulfones, polyphenylenes, polyether sulfones, polyimides, polyamide imides, polyarylene ethers, polyphenylene sulfides, polyarylene ether ketones, phenoxy resins, polycarbonates, polyether imides, polyquinoxalines, polyquinolines, polybenzimidazoles, polybenzoxazoles, polybenzothiazoles, polyoxadiazoles, copolymers thereof, and mixtures thereof.

Copending application U.S. Ser. No. 08/697,761, filed Aug. 29, 1996, now U.S. Pat. No. 5,889,077 entitled "Process for Direct Substitution of High Performance Polymers with Unsaturated Ester Groups," with the named inventors Timothy J. Fuller, Ram S. Narang, Thomas W. Smith, David J. Luca, and Raymond K. Crandall, the disclosure of which is totally incorporated herein by reference, discloses a process which comprises reacting a polymer of the general formula

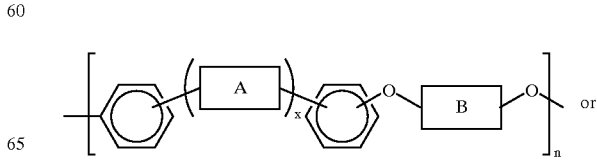

-continued

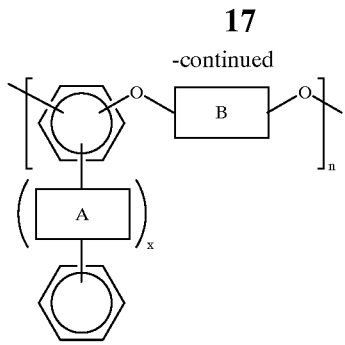

wherein x is an integer of 0 or 1, A is one of several specified groups, such as

B is one of several specified groups, such as

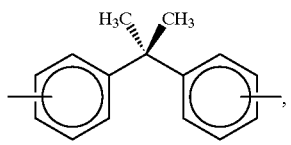

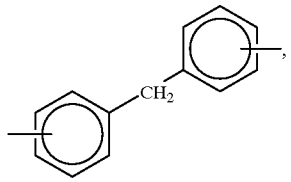

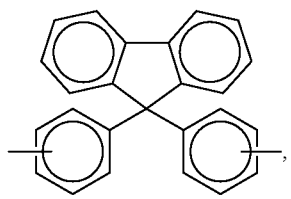

or mixtures thereof, and n is an integer representing the number of repeating monomer units, with (i) a formaldehyde source, and (ii) an unsaturated acid in the presence of an acid catalyst, thereby forming a curable polymer with unsaturated ester groups. Also disclosed is a process for preparing an ink jet printhead with the above polymer.

Copending application U.S. Ser. No. 08/705,463, filed Aug. 29, 1996, now U.S. Pat. No. 5,739,254 entitled "Process for Haloalkylation of High Performance Polymers," with the named inventors Timothy J. Fuller, Ram S. Narang, Thomas W. Smith, David J. Luca, and Raymond K. Crandall, the disclosure of which is totally incorporated herein by reference, discloses a process which comprises reacting a polymer of the general formula

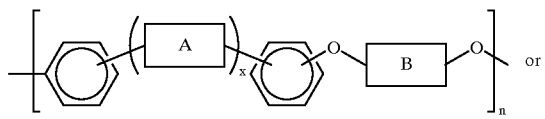 or

-continued

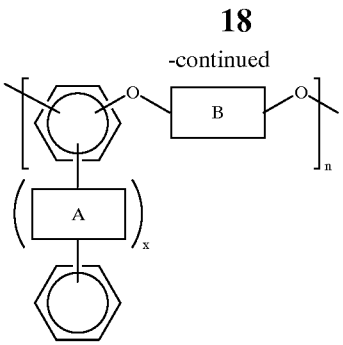

wherein x is an integer of 0 or 1, A is one of several specified groups, such as B is one of several specified groups, such as or mixtures thereof, and n is an integer representing the number of repeating monomer units, with an acetyl halide and dimethoxymethane in the presence of a halogen-containing Lewis acid catalyst and methanol, thereby forming a haloalkylated polymer. In a specific embodiment, the haloalkylated polymer is then reacted further to replace at least some of the haloalkyl groups with photosensitivity-imparting groups. Also disclosed is a process for preparing a thermal ink jet printhead with the aforementioned polymer.

Copending application U.S. Ser. No. 08/705,479, filed Aug. 29, 1996, now U.S. Pat. No. 5,761,809 entitled "Processes for Substituting Haloalkylated Polymers With Unsaturated Ester, Ether, and Alkylcarboxymethylene Groups," with the named inventors Timothy J. Fuller, Ram S. Narang, Thomas W. Smith, David J. Luca, and Raymond K. Crandall, the disclosure of which is totally incorporated herein by reference, discloses a process which comprises reacting a haloalkylated aromatic polymer with a material selected from the group consisting of unsaturated ester salts, alkoxide salts, alkylcarboxylate salts, and mixtures thereof, thereby forming a curable polymer having functional groups corresponding to the selected salt. Another embodiment of the invention is directed to a process for preparing an ink jet printhead with the curable polymer thus prepared.

Copending application U.S. Ser. No. 08/705,372, filed Aug. 29, 1996, now U.S. Pat. No. 5,945,253 entitled "High Performance Curable Polymers and Processes for the Preparation Thereof," with the named inventors Ram S. Narang and Timothy J. Fuller, the disclosure of which is totally incorporated herein by reference, discloses a composition which comprises a polymer containing at least some monomer repeat units with photosensitivity-imparting substituents which enable crosslinking or chain extension of the polymer upon exposure to actinic radiation, said polymer being of the formula

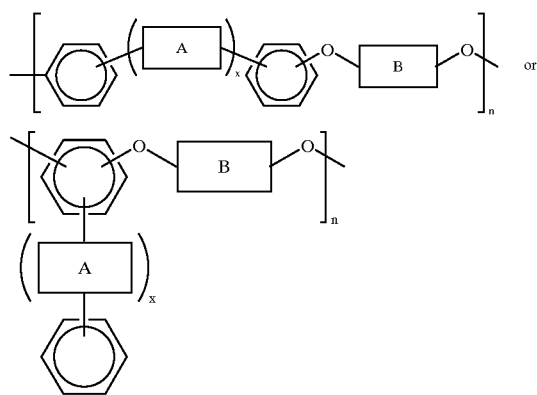

wherein x is an integer of 0 or 1, A is one of several specified groups, such as

B is one of several specified groups, such as

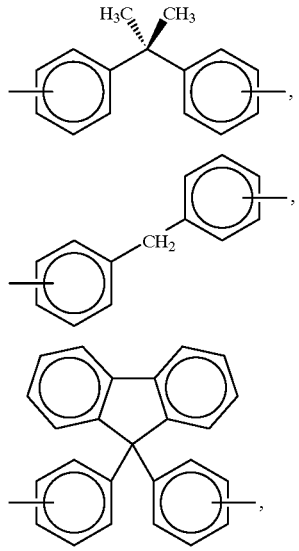

or mixtures thereof, and n is an integer representing the number of repeating monomer units, wherein said photosensitivity-imparting substituents are allyl ether groups, epoxy groups, or mixtures thereof. Also disclosed are a process for preparing a thermal ink jet printhead containing the aforementioned polymers and processes for preparing the aforementioned polymers.

Copending application U.S. Ser. No. 08/705,490, filed Aug. 29, 1996, now U.S. Pat. No. 5,863,963 entitled "Halomethylated High Performance Curable Polymers," with the named inventors Ram S. Narang and Timothy J. Fuller, the disclosure of which is totally incorporated herein by reference, discloses a process which comprises the steps of (a) providing a polymer containing at least some monomer repeat units with halomethyl group substituents which enable crosslinking or chain extension of the polymer upon exposure to a radiation source which is electron beam radiation, x-ray radiation, or deep ultraviolet radiation, said polymer being of the formula

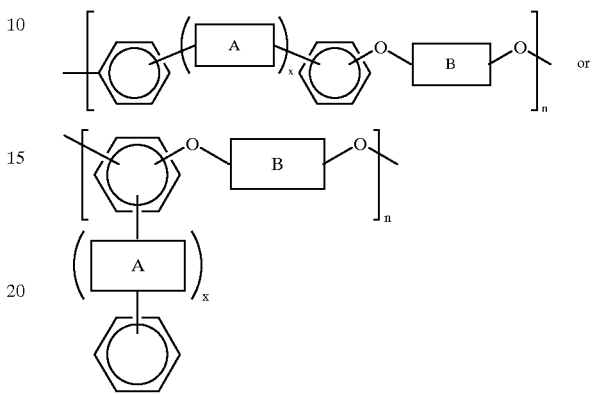

wherein x is an integer of 0 or 1, A is one of several specified groups, such as

B is one of several specified groups, such as

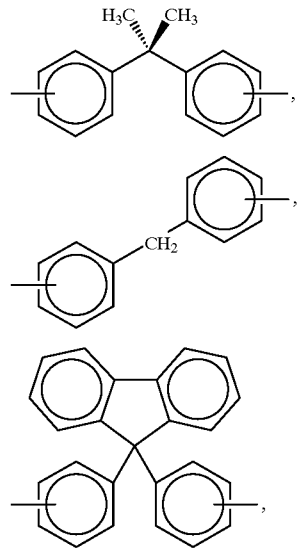

or mixtures thereof, and n is an integer representing the number of repeating monomer units, and (b) causing the polymer to become crosslinked or chain extended through the photosensitivity-imparting groups. Also disclosed is a process for preparing a thermal ink jet printhead by the aforementioned curing process.

Copending application U.S. Ser. No. 08/697,760 filed Aug. 29, 1996, nwo U.S. Pat. No. 6,007,877 entitled "Aqueous Developable High Performance Curable Polymers," with the named inventors Ram S. Narang and Timothy J. Fuller, the disclosure of which is totally incorporated herein by reference, discloses a composition which comprises a polymer containing at least some monomer repeat units with water-solubility-imparting substituents and at least some monomer repeat units with photosensitivity-imparting substituents which enable crosslinking or chain extension of the polymer upon exposure to actinic radiation, said polymer being of the formula

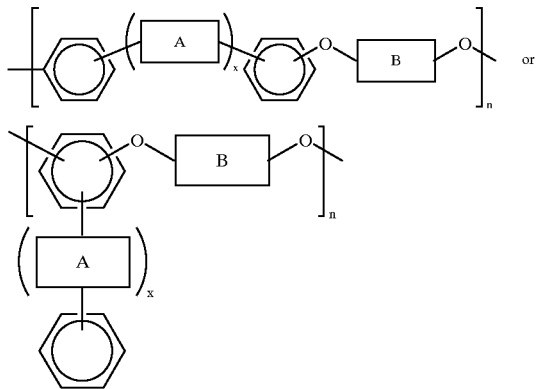

wherein x is an integer of 0 or 1, A is one of several specified groups, such as

B is one of several specified groups, such as

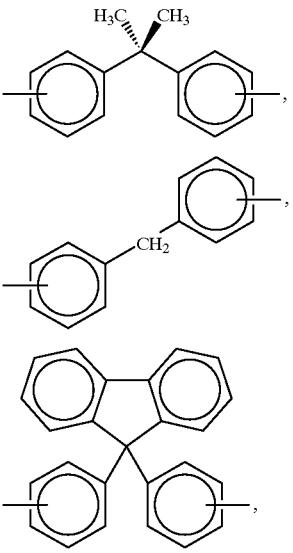

or mixtures thereof, and n is an integer representing the number of repeating monomer units. In one embodiment, a single functional group imparts both photosensitivity and water solubility to the polymer. In another embodiment, a first functional group imparts photosensitivity to the polymer and a second functional group imparts water solubility to the polymer. Also disclosed is a process for preparing a thermal ink jet printhead with the aforementioned polymers.

While known compositions and processes are suitable for their intended purposes, a need remains for improved materials suitable for microelectronics applications. A need also remains for improved ink jet printheads. Further, there is a need for photopatternable polymeric materials which are heat stable, electrically insulating, and mechanically robust. Additionally, there is a need for photopatternable polymeric materials which are chemically inert with respect to the materials that might be employed in ink jet ink compositions. There is also a need for photopatternable polymeric materials which exhibit low shrinkage during post-cure steps in microelectronic device fabrication processes. In addition, a need remains for photopatternable polymeric materials which exhibit a relatively long shelf life. Further, there is a need for photopatternable polymeric materials which can be patterned with relatively low photo-exposure energies. Additionally, a need remains for photopatternable polymeric materials which, in the cured form, exhibit good solvent resistance. There is also a need for photopatternable polymeric materials which, when applied to microelectronic devices by spin casting techniques and cured, exhibit reduced edge bead and no apparent lips and dips. In addition, there remains a need for processes for preparing photopatternable polymeric materials with the above advantages. Further, a need remains for methods of maintaining consistent and uniform imaging qualities when preparing batches of photopatternable polymeric materials. Additionally, there is a need for methods of controlling the degree of photosensitivity-imparting group substitution in a photoresist composition containing photosensitivity-imparting group substituted photopatternable polymers. Further, a need remains for photopatternable polymeric materials which exhibit no flow and no loss in patterned features subsequent to imaging, development, and thermal aging. In addition, there remains a need for photopatternoble polymeric materials which have relatively low dielectric constants. Further, there is a need for photopatternable polymeric materials which exhibit reduced water sorption. Additionally, a need remains for photopatternable polymeric materials which exhibit improved hydrolytic stability, especially upon exposure to alkaline solutions. A need also remains for photopatternable polymeric materials which are stable at high temperatures, typically greater than about 150° C. There is also a need for photopatternable polymeric materials which either have high glass transition temperatures or are sufficiently crosslinked that there are no low temperature phase transitions subsequent to photoexposure. Further, a need remains for photopatternable polymeric materials with low coefficients of thermal expansion. In addition, there is a need for methods of preparing photoresist compositions with consistent processing conditions from different base resins. A need further remains for photoresist compositions with good to excellent reproducible processing characteristics. There is a need for polymers which are thermally stable, patternable as thick films of about 30 microns or more, exhibit low $T_g$ prior to photoexposure, have low dielectric constants, are low in water absorption, have low coefficients of expansion, have desirable mechanical and adhesive characteristics, and are generally desirable for interlayer dielectric applications, including those at high temperatures, which are also photopatternable. There is also a need for photoresist compositions with good to excellent processing characteristics.

SUMMARY OF THE INVENTION

It is an object of the present invention to provide polymeric materials with the above noted advantages.

It is another object of the present invention to provide improved materials suitable for microelectronics applications.

It is yet another object of the present invention to provide improved ink jet printheads.

It is still another object of the present invention to provide photopatternable polymeric materials which are heat stable, electrically insulating, and mechanically robust.

Another object of the present invention is to provide photopatternable polymeric materials which are chemically inert with respect to the materials that might be employed in ink jet ink compositions.

Yet another object of the present invention is to provide photopatternable polymeric materials which exhibit low shrinkage during post-cure steps in microelectronic device fabrication processes.

Still another object of the present invention is to provide photopatternable polymeric materials which exhibit a relatively long shelf life.

It is another object of the present invention to provide photopatternable polymeric materials which can be patterned with relatively low photo-exposure energies.

It is yet another object of the present invention to provide photopatternable polymeric materials which, in the cured form, exhibit good solvent resistance.

It is still another object of the present invention to provide photopatternable polymeric materials which, when applied to microelectronic devices by spin casting techniques and cured, exhibit reduced edge bead and no apparent lips and dips.

Another object of the present invention is to provide processes for preparing photopatternable polymeric materials with the above advantages.

Yet another object of the present invention is to provide methods of maintaining consistent and uniform imaging qualities when preparing batches of photopatternable polymeric materials.

Still another object of the present invention is to provide methods of controlling the degree of photosensitivity-imparting group substitution in a photoresist composition containing photosensitivity-imparting group substituted photopatternable polymers.

It is another object of the present invention to provide photopatternable polymeric materials which exhibit no flow and no loss in patterned features subsequent to imaging, development, and thermal aging.

It is yet another object of the present invention to provide photopatternable polymeric materials which have relatively low dielectric constants.

It is still another object of the present invention to provide photopatternable polymeric materials which exhibit reduced water sorption.

Another object of the present invention is to provide photopatternable polymeric materials which exhibit improved hydrolytic stability, especially upon exposure to alkaline solutions.

Yet another object of the present invention is to provide photopatternable polymeric materials which are stable at high temperatures, typically greater than about 150° C.

Still another object of the present invention is to provide photopatternable polymeric materials which either have high glass transition temperatures or are sufficiently crosslinked that there are no low temperature phase transitions subsequent to photoexposure.

It is another object of the present invention to provide photopatternable polymeric materials with low coefficients of thermal expansion.

It is yet another object of the present invention to provide methods of preparing photoresist compositions with consistent processing conditions from different base resins.

It is still another object of the present invention to provide photoresist compositions with good to excellent reproducible processing characteristics.

Another object of the present invention is to provide polymers which are thermally stable, patternable as thick films of about 30 microns or more, exhibit low $T_g$ prior to photoexposure, have low dielectric constants, are low in water absorption, have low coefficients of expansion, have desirable mechanical and adhesive characteristics, and are generally desirable for interlayer dielectric applications, including those at high temperatures, which are also photopatternable.

Yet another object of the present invention is to provide photoresist compositions with good to excellent processing characteristics.

These and other objects of the present invention (or specific embodiments thereof) can be achieved by providing a composition which comprises a mixture of (A) a first component comprising a polymer, at least some of the monomer repeat units of which have at least one photosensitivity-imparting group thereon, said polymer having a first degree of photosensitivity-imparting group substitution measured in milliequivalents of photosensitivity-imparting group per gram and being of the general formula

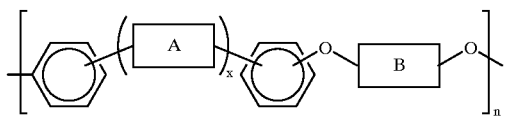

or

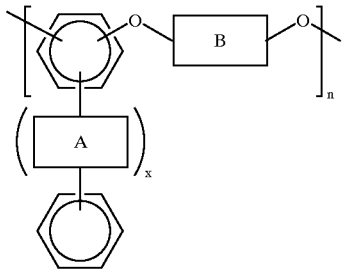

wherein x is an integer of 0 or 1, A is

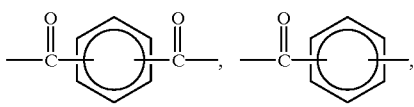

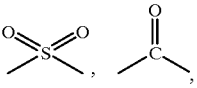

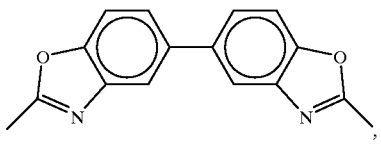

25
-continued
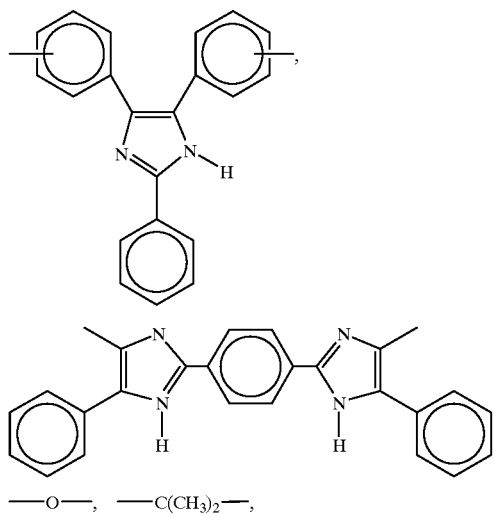
—O—, —C(CH₃)₂—,
or mixtures thereof, B is
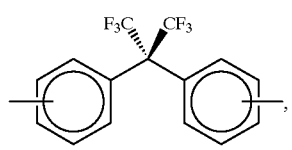
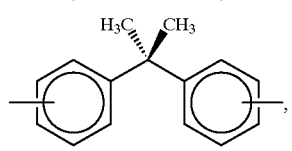
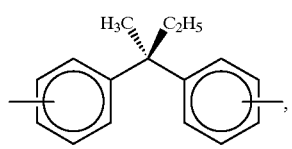
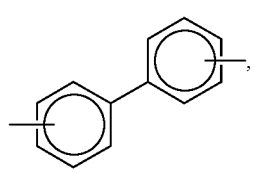
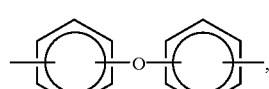
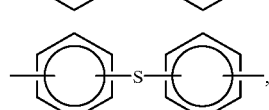
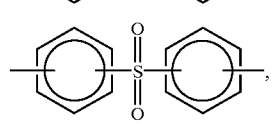
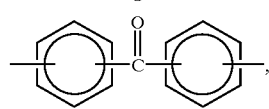
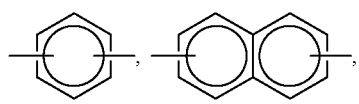
26
-continued
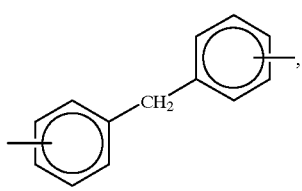
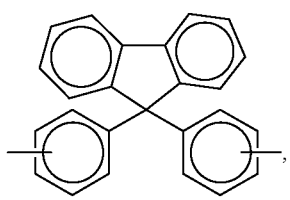
—(CH₂)ᵥ—,
wherein v is an integer of from 1 to about 20,
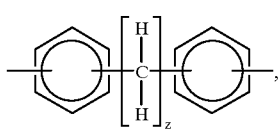
wherein z is an integer of from 2 to about 20,
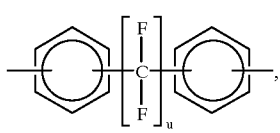
wherein u is an integer of from 1 to about 20,
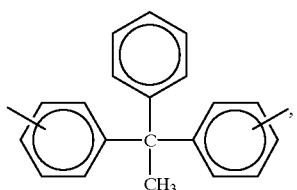
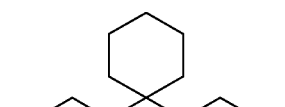
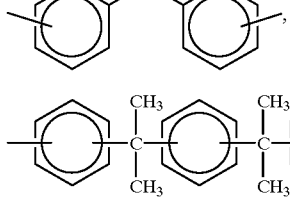
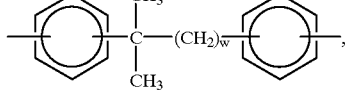
wherein w is an integer of from 1 to about 20,
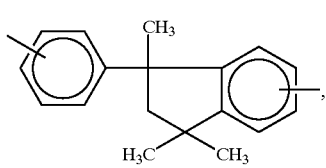

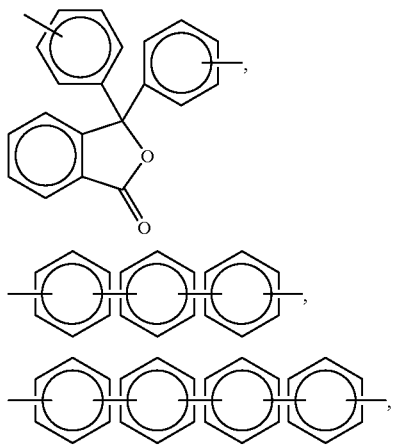

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture. Another embodiment of the present invention is directed to a process which comprises the steps of:

(a) depositing a layer comprising the above polymer-containing composition onto a lower substrate in which one surface thereof has an array of heating elements and addressing electrodes having terminal ends formed thereon, said polymer being deposited onto the surface having the heating elements and addressing electrodes thereon;

(b) exposing the layer to actinic radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;

(c) removing the polymer from the unexposed areas, thereby forming recesses in the layer, said recesses exposing the heating elements and the terminal ends of the addressing electrodes;

(d) providing an upper substrate with a set of parallel grooves for subsequent use as ink channels and a recess for subsequent use as a manifold, the grooves being open at one end for serving as droplet emitting nozzles; and (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

DETAILED DESCRIPTION OF THE INVENTION

Figure 1:
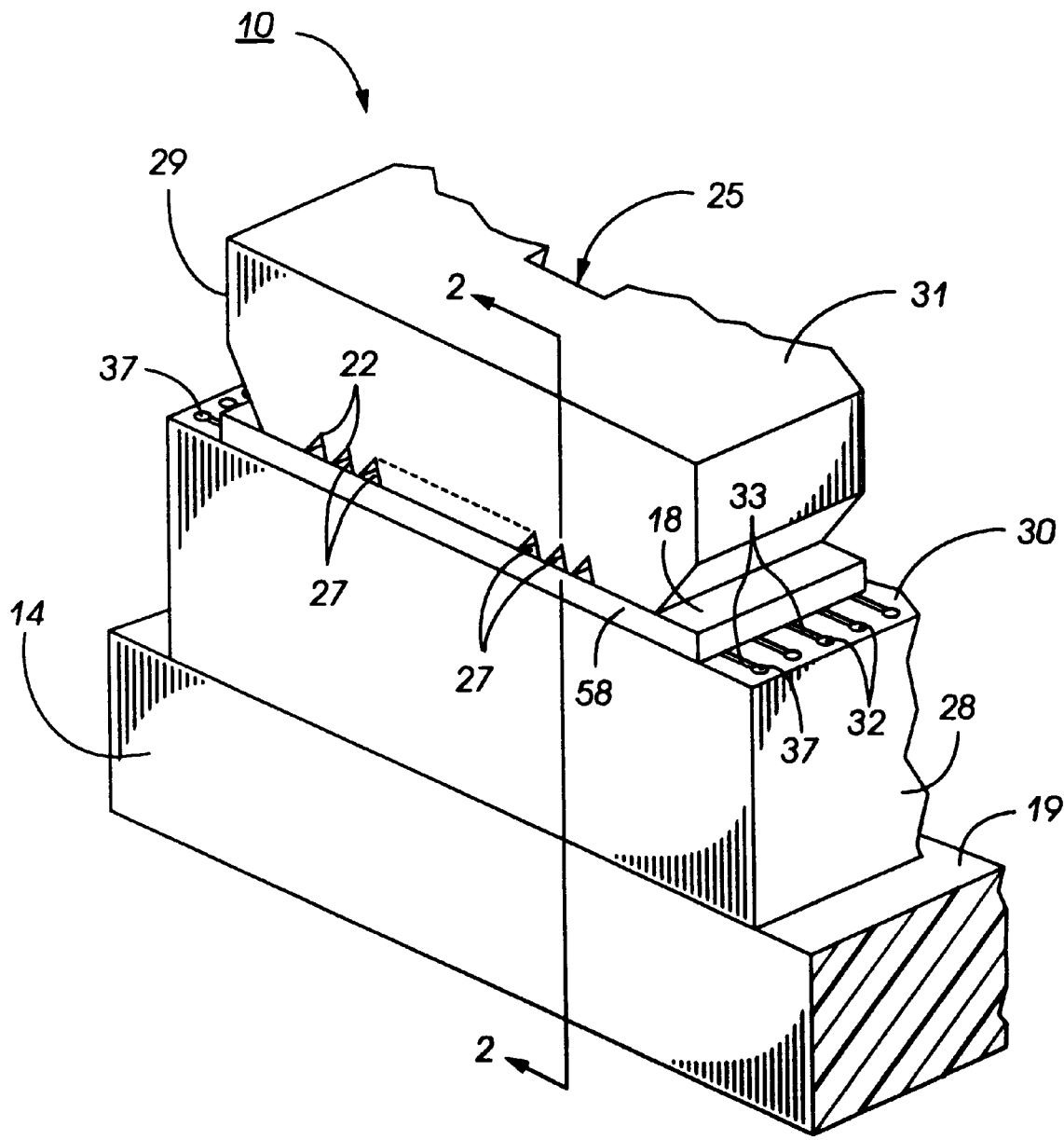
FIG. 1 is an enlarged schematic isometric view of an example of a printhead mounted on a daughter board showing the droplet emitting nozzles.

The present invention is directed to compositions and processes which enable the preparation of photosensitivity-imparting-group substituted polymer blends which have uniform weight average molecular weight and a uniform degree of substitution.

The polymers of the present invention are prepared from polymers of the following formula:

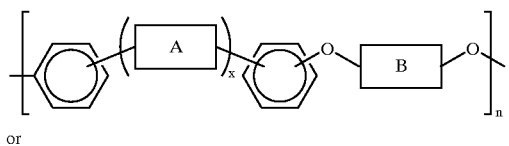

or

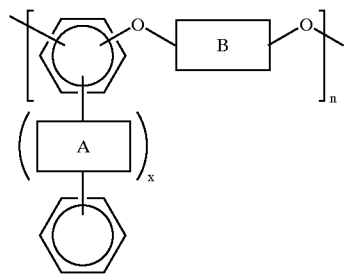

wherein x is an integer of 0 or 1, A is

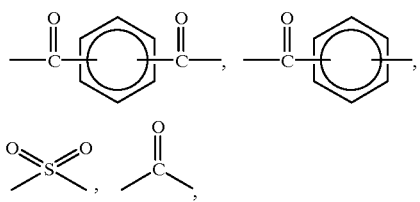

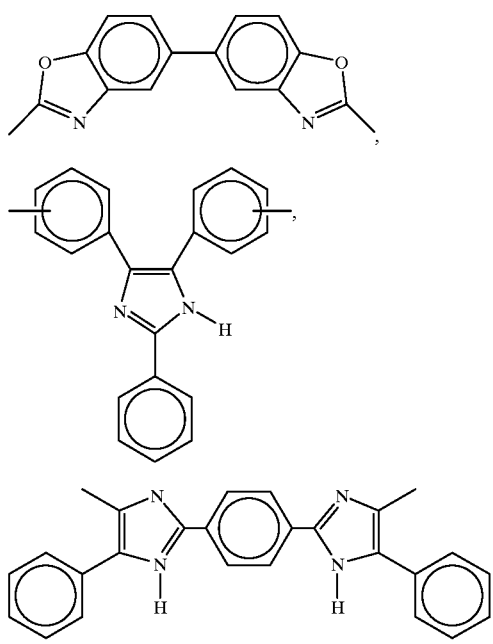
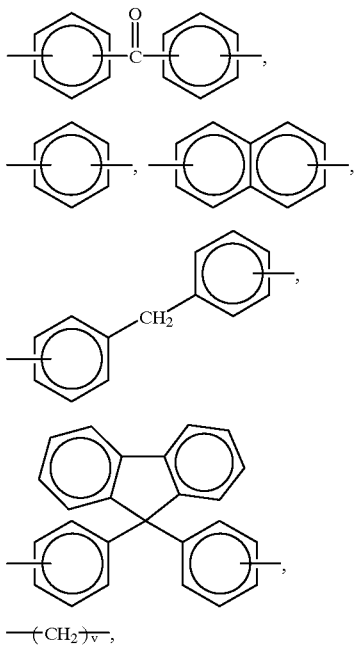
—O—, —C(CH₃)₂—,
or mixtures thereof, B is
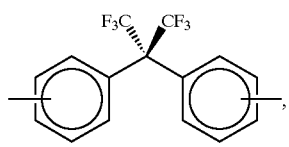
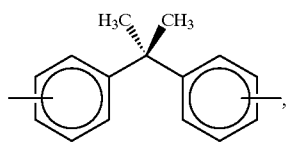
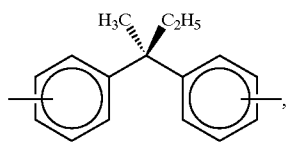
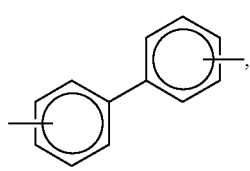
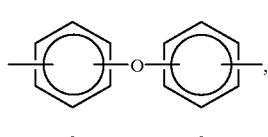
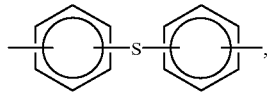
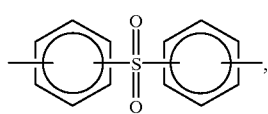
—(CH₂)$_v$—,
wherein v is an integer of from 1 to about 20, and preferably from 1 to about 10,
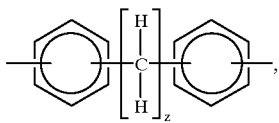
wherein z is an integer of from 2 to about 20, and preferably from 2 to about 10,
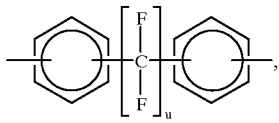
wherein u is an integer of from 1 to about 20, and preferably from 1 to about 10,
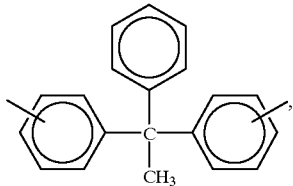
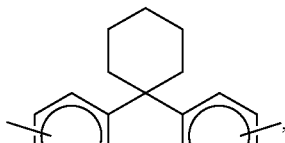
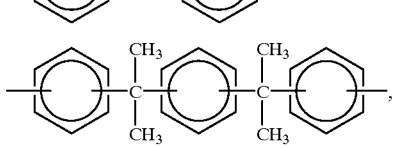
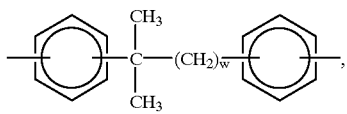

-continued wherein w is an integer of from 1 to about 20, and preferably from 1 to about 10,

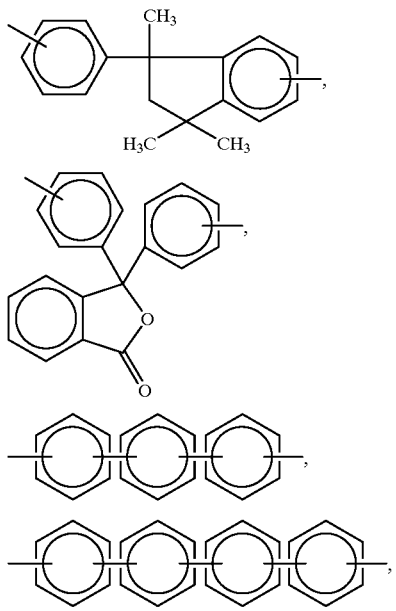

other similar bisphenol derivatives, or mixtures thereof, and n is an integer representing the number of repeating monomer units. The value of n is such that the weight average molecular weight of the material typically is from about 1,000 to about 100,000, preferably from about 1,000 to about 65,000, more preferably from about 1,000 to about 40,000, and even more preferably from about 3,000 to about 25,000, although the weight average molecular weight can be outside these ranges. Preferably, n is an integer of from about 2 to about 70, more preferably from about 5 to about 70, and even more preferably from about 8 to about 50, although the value of n can be outside these ranges. The phenyl groups and the A and/or B groups may also be substituted, although the presence of two or more substituents on the B group ortho to the oxygen groups can render substitution difficult. Substituents can be present on the polymer either prior to or subsequent to the placement of photosensitivity-imparting functional groups thereon. Substituents can also be placed on the polymer during the process of placement of photosensitivity-imparting functional groups thereon. Examples of suitable substituents include (but are not limited to) alkyl groups, including saturated, unsaturated, and cyclic alkyl groups, preferably with from 1 to about 6 carbon atoms, substituted alkyl groups, including saturated, unsaturated, and cyclic substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. Processes for the preparation of these materials are known, and disclosed in, for example, P. M. Hergenrother, *J. Macromol. Sci. Rev. Macromol. Chem.,* C19 (1), 1–34 (1980); P. M. Hergenrother, B. J. Jensen, and S. J. Havens, *Polymer,* 29, 358 (1988); B. J. Jensen and P. M. Hergenrother, "High Performance Polymers," Vol. 1, No. 1) page 31 (1989), "Effect of Molecular Weight on Poly(arylene ether ketone) Properties"; V. Percec and B. C. Auman, *Makromol. Chem.* 185, 2319 (1984); "High Molecular Weight Polymers by Nickel Coupling of Aryl Polychlorides," I. Colon, G. T. Kwaiatkowski, *J. of Polymer Science, Part A, Polymer Chemistry,* 28, 367 (1990); M. Ueda and T. Ito, *Polymer J.,* 23 (4), 297 (1991); "Ethynyl-Terminated Polyarylates: Synthesis and Characterization," S. J. Havens and P. M. Hergenrother, *J. of Polymer Science: Polymer Chemistry Edition,* 22, 3011 (1984); "Ethynyl-Terminated Polysulfones: Synthesis and Characterization," P. M. Hergenrother, *J. of Polymer Science: Polymer Chemistry Edition,* 20, 3131 (1982); K. E. Dukes, M. D. Forbes, A. S. Jeevarajan, A. M. Belu, J. M. DeDimone, R. W. Linton, and V. V. Sheares, *Macromolecules,* 29, 3081 (1996); G. Hougham, G. Tesoro, and J. Shaw, *Polym. Mater. Sci. Eng.,* 61, 369 (1989); V. Percec and B. C. Auman, *Makromol. Chem,* 185, 617 (1984); "Synthesis and characterization of New Fluorescent Poly(arylene ethers)," S. Matsuo, N. Yakoh, S. Chino, M. Mitani, and S. Tagami, *Journal of Polymer Science: Part A: Polymer Chemistry,* 32, 1071 (1994); "Synthesis of a Novel Naphthalene-Based Poly(arylene ether ketone) with High Solubility and Thermal Stability," Mami Ohno, Toshikazu Takata, and Takeshi Endo, *Macromolecules,* 27, 3447 (1994); "Synthesis and Characterization of New Aromatic Poly(ether ketones)," F. W. Mercer, M. T. Mckenzie, G. Merlino, and M. M. Fone, *J. of Applied Polymer Science,* 56, 1397 (1995); H. C. Zhang, T. L. Chen, Y. G. Yuan, Chinese Patent CN 85108751 (1991); "Static and laser light scattering study of novel thermoplastics. 1. Phenolphthalein poly (aryl ether ketone)," C. Wu, S. Bo, M. Siddiq, G. Yang and T. Chen, *Macromolecules,* 29, 2989 (1996); "Synthesis of t-Butyl-Substituted Poly(ether ketone) by Nickel-Catalyzed Coupling Polymerization of Aromatic Dichloride", M. Ueda, Y. Seino, Y. Haneda, M. Yoneda, and J.-I. Sugiyama, *Journal of Polymer Science: Part A: Polymer Chemistry,* 32, 675 (1994); "Reaction Mechanisms: Comb-Like Polymers and Graft Copolymers from Macromers 2. Synthesis, Characterzation and Homopolymerization of a Styrene Macromer of Poly(2,6-dimethyl-1,4-phenylene Oxide)," V.

Percec, P. L. Rinaldi, and B. C. Auman, *Polymer Bulletin*, 10, 397 (1983); *Handbook of Polymer Synthesis Part A*, Hans R. Kricheldorf, ed., Marcel Dekker, Inc., New York-Basel-Hong Kong (1992); and "Introduction of Carboxyl Groups into Crosslinked Polystyrene," C. R. Harrison, P. Hodge, J. Kemp, and G. M. Perry, *Die Makromolekulare Chemie*, 176, 267 (1975), the disclosures of each of which are totally incorporated herein by reference. Further background on high performance polymers is disclosed in, for example, U.S. Pat. Nos. 2,822,351; 3,065,205; British Patent 1,060,546; British Patent 971,227; British Patent 1,078,234; U.S. Pat. No. 4,175,175; N. Yoda and H. Hiramoto, *J. Macromol. Sci.-Chem.*, A21(13 & 14) pp. 1641 (1984) (Toray Industries, Inc., Otsu, Japan; B. Sillion and L. Verdet, "Polyimides and other High-Temperature polymers", edited by M. J. M. Abadie and B. Sillion, Elsevier Science Publishers B. V. (Amsterdam 1991); "Polyimides with Alicyclic Diamines. II. Hydrogen Abstraction and Photocrosslinking Reactions of Benzophenone Type Polyimides," Q. Jin, T. Yamashita, and K. Horie, *J. of Polymer Science: Part A: Polymer Chemistry*, 32, 503 (1994); Probimide™ 300, product bulletin, Ciba-Geigy Microelectronics Chemicals, "Photosensitive Polyimide System"; High Performance Polymers and Composites, J. I. Kroschwitz (ed.), John Wiley & Sons (New York 1991); and T. E. Atwood, D. A. Barr, T. A. King, B. Newton, and B. J. Rose, *Polymer*, 29, 358 (1988), the disclosures of each of which are totally incorporated herein by reference. Further information on radiation curing is disclosed in, for example, *Radiation Curing: Science and Technology*, S. Peter Pappas, ed., Plenum Press (New York 1992), the disclosure of which is totally incorporated herein by reference.

For applications wherein the photopatternable polymer is to be used as a layer in a thermal ink jet printhead, the polymer preferably has a number average molecular weight of from about 3,000 to about 20,000 Daltons, more preferably from about 3,000 to about 10,000 Daltons, and even more preferably from about 3,500 to about 6,500 Daltons, although the molecular weight can be outside this range.

The photopatternable polymers of the present invention contain in at least some of the monomer repeat units thereof photosensitivity-imparting substituents which enable crosslinking or chain extension of the polymer upon exposure to actinic radiation. Radiation which activates crosslinking or chain extension can be of any desired source and any desired wavelength, including (but not limited to) visible light, infrared light, ultraviolet light, electron beam radiation, x-ray radiation, or the like. Examples of suitable photosensitivity imparting groups include unsaturated ester groups, such as acryloyl groups, methacryloyl groups, cinnamoyl groups, crotonoyl groups, ethacryloyl groups, oleoyl groups, linoleoyl groups, maleoyl groups, fumaroyl groups, itaconoyl groups, citraconoyl groups, phenylmaleoyl groups, esters of 3-hexene-1,6-dicarboxylic acid, and the like. Also suitable are alkylcarboxymethylene and ether groups. Under certain conditions, such as imaging with electron beam, deep ultraviolet, or x-ray radiation, halomethyl groups are also photoactive. Epoxy groups, allyl ether groups, hydroxyalkyl groups, and unsaturated ammonium, unsaturated phosphonium, and unsaturated ether groups are also suitable photoactive groups.

The photopatternable polymers containing these groups can be prepared by any suitable or desired process. For example, the desired functional group or groups can be applied directly to the polymer. Alternatively, one or more intermediate materials can be prepared. For example, the polymer backbone can be functionalized with a substituent which allows for the facile derivatization of the polymer backbone, such as hydroxyl groups, carboxyl groups, haloalkyl groups such as chloromethyl groups, hydroxyalkyl groups such as hydroxy methyl groups, alkoxy methyl groups, alkylcarboxymethylene groups, and the like.

Unsaturated ester groups can be placed on the polymer backbone by any suitable or desired process. For example, substitution of the polymer can be accomplished by reacting the polymer in solution with (a) the appropriate unsaturated acid (such as acrylic acid, methacrylic acid, cinnamic acid, crotonic acid, ethacrylic acid, oleic acid, linoleic acid, maleic acid, fumaric acid, itaconic acid, citraconic acid, phenylmaleic acid, 3-hexene-1,6-dicarboxylic acid, or the like), and (b) a formaldehyde source (i.e., either formaldehyde or a material which, under the conditions of the reaction, generates formaldehyde; examples of formaldehyde sources in addition to formaldehyde include paraformaldehyde, trioxane, methylal, dimethoxymethane, and the like). The reaction is direct acid catalyzed; the polymer is dissolved in a suitable solvent and is allowed to react with the formaldehyde source at about 105° C. in the presence of catalytic amounts of para-toluenesulfonic acid. Examples of solvents suitable for the reaction include 1,1, 2,2-tetrachloroethane and, if a suitable pressure reactor is used, methylene chloride. Typically, the reactants are present in relative amounts with respect to each other (by weight) of about 10 parts polymer, about 5 parts formaldehyde source, about 1 part para-toluenesulfonic acid, about 15.8 parts of the appropriate acid (i.e., acrylic acid, methacrylic acid, or the like), about 0.2 parts hydroquinone methyl ether, and about 162 parts 1,1,2,2-tetrachloroethane.

The general reaction scheme, illustrated below for the reaction with acrylic add, is as follows:

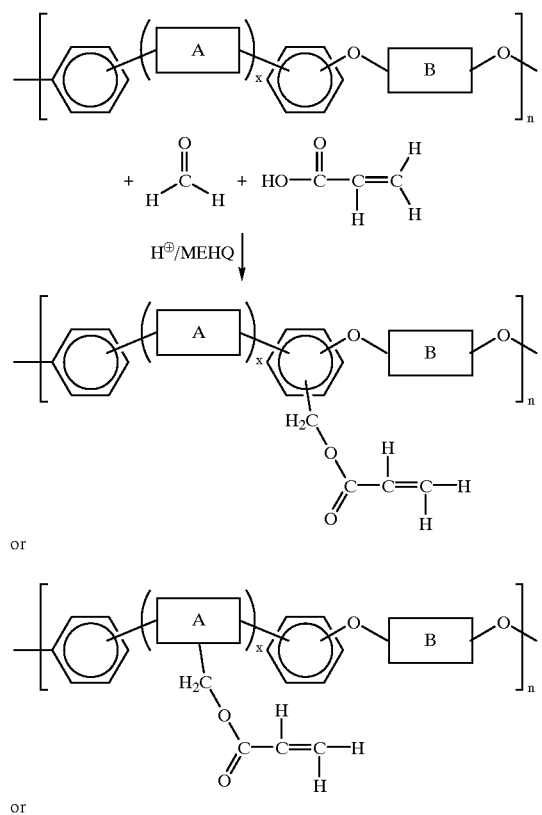

-continued

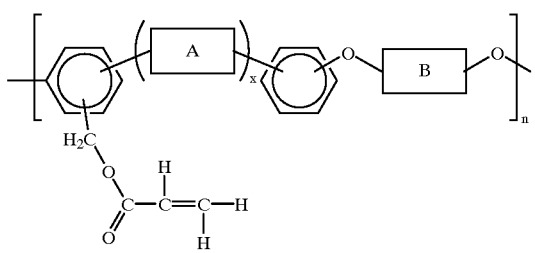

or

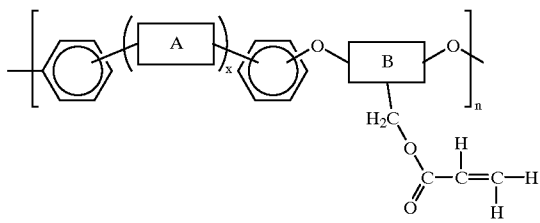

The resulting material is of the general formula

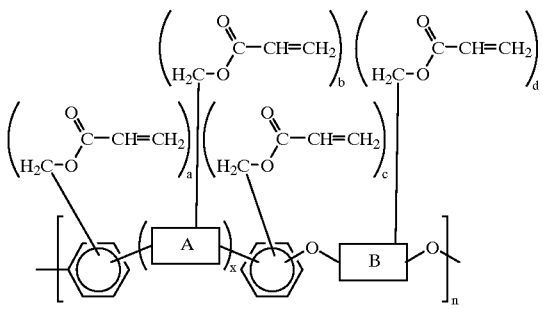

wherein a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. When methacrylic acid is used, the reaction proceeds as shown above except that the

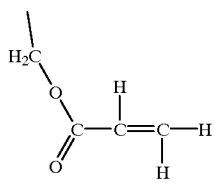

groups shown above are replaced with

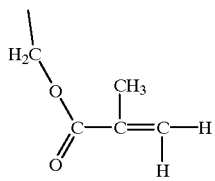

groups. When cinnamic acid is used, the reaction proceeds as shown above except that the

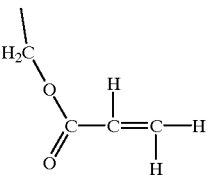

groups shown above are replaced with

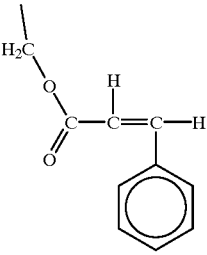

groups. Substitution is generally random, although the substituent may show a preference for the B group, and any given monomer repeat unit may have no substituents, one substituent, or two or more substituents. The most likely result of the reaction is that a monomer repeat unit will have 0 or 1 substituents.

Typical reaction temperatures are from about 25 to about 145° C., and preferably at about 105° C., although the temperature can be outside this range. Typical reaction times are from about 1 to about 6 hours, and preferably from about 2 to about 4 hours, although the time can be outside these ranges. Longer reaction times generally result in higher degrees of substitution. Higher degrees of substitution generally lead to greater photosensitivity of the polymer, and different degrees of substitution may be desirable for different applications. Too high a degree of substitution may lead to excessive sensitivity, resulting in crosslinking or chain extension of both exposed and unexposed polymer material when the material is exposed imagewise to activating radiation. Too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of unsaturated ester groups per monomer repeat unit) preferably is from about 0.25 to about 1.2, and more preferably from about 0.65 to about 0.8, although the degree of substitution can be outside these ranges for ink jet printhead applications. This degree of substitution generally corresponds to from about 0.5 to about 1.3 milliequivalents of unsaturated ester groups per gram of resin.

The polymers of the above general formula can also be substituted with photosensitivity-imparting groups such as unsaturated ester groups, ether groups, or alkylcarboxymethylene groups by first preparing the haloalkylated derivative and then replacing at least some of the haloalkyl groups with unsaturated ester, ether, or alkylcarboxymethylene groups. For example, the haloalkylated polymer can be substituted with unsaturated ester, ether, or alkylcarboxymethylene groups by reacting the haloalkylated polymer with an unsaturated ester, alkoxide, or alkylcarboxylate salt in solution. Examples of suitable reactants include selected salts of Groups IA, IIB, IIIB, IVB, VB, VIB, VIIB, VIIIB, IB, IIB, IIIA, IVA, and the like, of the periodic table with the appropriate unsaturated ester, such as the ester salts of acrylic acid, methacrylic acid, cinnamic acid, crotonic acid, ethacrylic acid, oleic acid, linoleic acid, maleic acid, fumaric acid, itaconic acid, citraconic acid, phenylmaleic acid, 3-hexene-1,6-dicarboxylic acid, and the like, or the appropriate alkoxide or alkylcarboxylate, with specific examples including sodium, potassium, quaternary ammonium, phosphonium, and the like salts of acrylate, methacrylate, cinnamate, methoxide, acetate, and the like. Examples of solvents suitable for the reaction include polar aprotic solvents such as N,N-dimethylacetamide, dimethylsulfoxide, N-methylpyrrolidinone, dimethylformamide, and the like. Typically, the reactants are present in relative amounts with respect to each other by weight of about 10 parts haloalkylated polymer, about 66.5 parts solvent, and about 5.7 parts unsaturated ester salt.

The general reaction scheme, illustrated below for the acryloylation of the chloromethylated polymer, is as follows:

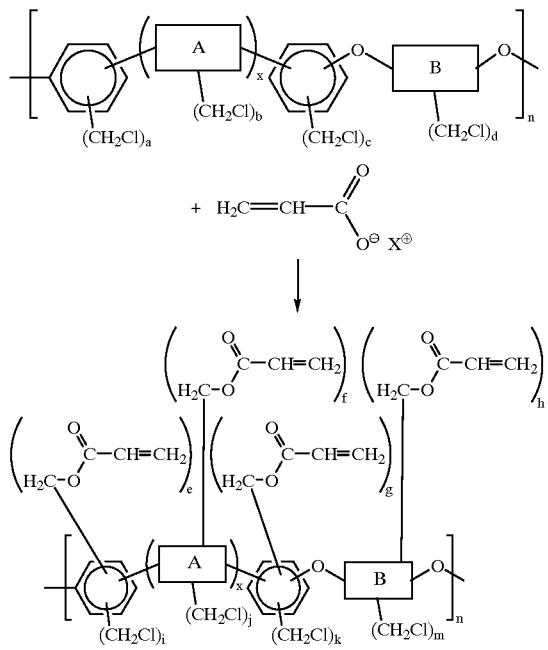

wherein X is any suitable cation, such as sodium, potassium, or the like, a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units. In the corresponding reaction with the methacrylate salt, the reaction proceeds as shown above except that the

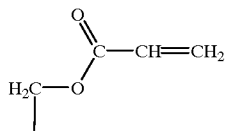

groups shown above are replaced with

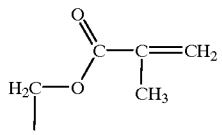

groups.

Ether groups and alkylcarboxymethylene groups can also be placed on the haloalkylated polymer by a process analogous to that employed to place unsaturated ester groups on the haloalkylated polymer, except that the corresponding alkylcarboxylate or alkoxide salt is employed as a reactant. In the corresponding reaction with the alkoxide salt, the reaction proceeds as shown above except that the

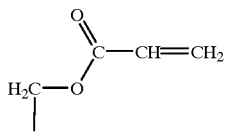

groups shown above are replaced with

groups. Suitable ether groups include those wherein R is an alkyl group, preferably with from 1 to about 30 carbon atoms, more preferably with from 1 to about 15 carbon atoms, and most preferably with 1 carbon atom. In the corresponding reaction with the alkylcarboxylate salt, the reaction proceeds as shown above except that the

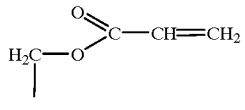

groups shown above are replaced with

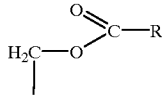

groups, wherein R is an alkyl group (including saturated, unsaturated, and cyclic alkyl groups), preferably with from 1 to about 30 carbon atoms, more preferably with from 1 to about 6 carbon atoms, a substituted alkyl group, an aryl group, preferably with from 6 to about 30 carbon atoms, more preferably with from 1 to about 2 carbon atoms, a substituted aryl group, an arylalkyl group, preferably with from 7 to about 35 carbon atoms, more preferably with from 7 to about 15 carbon atoms, or a substituted arylalkyl group, wherein the substituents on the substituted alkyl, aryl, and arylalkyl groups can be (but are not limited to) alkoxy groups, preferably with from 1 to about 6 carbon atoms, aryloxy groups, preferably with from 6 to about 24 carbon atoms, arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein two or more substituents can be joined together to form a ring.

Higher degrees of haloalkylation generally enable higher degrees of substitution with unsaturated ester, ether, and/or alkylcarboxymethylene groups and thereby enable greater photosensitivity of the polymer. Different degrees of substitution with unsaturated ester, ether, and/or alkylcarboxymethylene groups may be desirable for different applications. Too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of unsaturated ester, ether, and/or alkylcarboxymethylene groups per monomer repeat unit) preferably is from about 0.5 to about 1.2, and more preferably from about 0.65 to about 0.8, although the degree of substitution can be outside these ranges for ink jet printhead applications. Optimum amounts of substitution with unsaturated ester, ether, and/or alkylcarboxymethylene groups are from about 0.8 to about 1.3 milliequivalents of unsaturated ester, ether, and/or alkylcarboxymethylene groups per gram of resin.

Some or all of the haloalkyl groups can be replaced with unsaturated ester, ether, and/or alkylcarboxymethylene substituents. Longer reaction times generally lead to greater degrees of substitution of haloalkyl groups with unsaturated ester, ether, and/or alkylcarboxymethylene substituents.

Typical reaction temperatures are from about 20 to about 35° C., and preferably about 250° C., although the temperature can be outside this range. Typical reaction times are from about 30 minutes to about 15 days, and preferably from about 2 hours to about 2 days, although the time can be outside these ranges. The reaction time can be reduced with the use of a catalyst, such as Adogen 464 (available from Aldrich Chemical Co., Milwaukee, Wis., or from Ashland Oil Co.), a long chain quaternary ammonium chloride salt, or the like. Adogen 464 is used at approximately 0.4 weight percent with respect to resin solids, and this catalyst results in a doubling of the reaction rate. Adogen 464 is sometimes difficult to remove from the product even after several water and methanol washes. Consequently, this catalyst sometimes results in cloudy photoresist solutions. The reaction can be accelerated slightly by the addition of 0.4 weight percent water, and can be inhibited by the addition of the same amount of methanol.

The haloalkylated polymer can be allyl ether substituted or epoxidized by reacting the haloalkylated polymer with an unsaturated alcohol salt, such as an allyl alcohol salt, in solution. Examples of suitable unsaturated alcohol salts and allyl alcohol salts include sodium 2-allylphenolate, sodium 4-allylphenolate, sodium allyl alcoholate, corresponding salts with lithium, potassium, cesium, rubidium, ammonium, quaternary alkyl ammonium compounds, and the like. Unsaturated alcohol salts can be generated by the reaction of the alcohol with a base, such as sodium hydride, sodium hydroxide, or the like. The salt displaces the halide of the haloalkyl groups at between about 25 and about 100° C. Examples of solvents suitable for the reaction include polar aprotic solvents such as N,N-dimethylacetamide, dimethylsulfoxide, N-methylpyrrolidinone, dimethylformamide, tetrahydrofuran, and the like. Typically, the reactants are present in relative amounts with respect to each other of from about 1 to about 50 molar equivalents of unsaturated alcohol salt per haloalkyl group to be substituted, although the relative amounts can be outside this range. Typically, the reactants are present in solution in amounts of from about 5 to about 50 percent by weight solids, and preferably about 10 percent by weight solids, although the relative amounts can be outside this range.

Typical reaction temperatures are from about 25 to about 100° C., and preferably from about 25 to about 50° C., although the temperature can be outside these ranges. Typical reaction times are from about 4 to about 24 hours, and preferably about 16 hours, although the time can be outside this range.

The general reaction scheme, illustrated below with a chloromethylated polymer and an allyl alcoholate salt, is as follows:

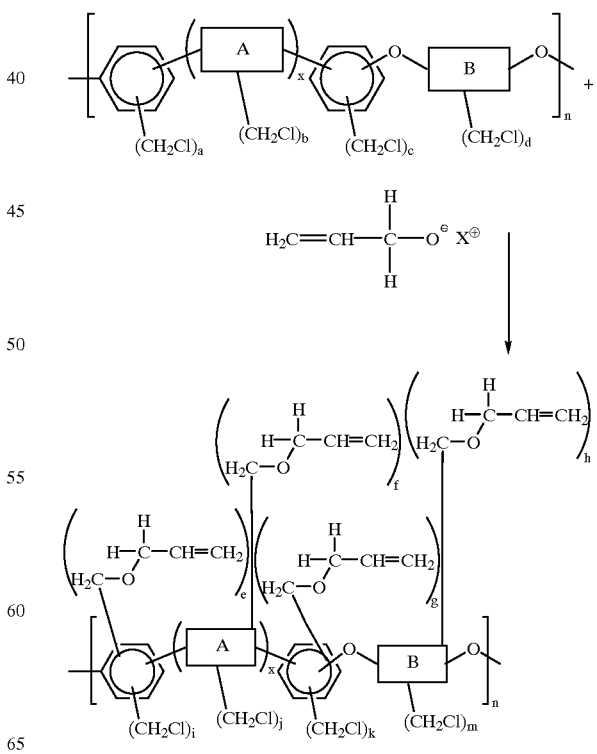

wherein X is any suitable cation, such as sodium, potassium, or the like, a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units, and n is an integer representing the number of repeating monomer units. In the corresponding reaction with the 2-allylphenolate salt, the reaction proceeds as shown above except that the

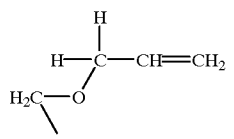

groups shown above are replaced with

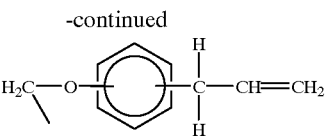

groups.

The allyl ether substituted polymer is suitable for photo-induced curing reactions. Alternatively, the allyl ether substituted polymer (or the unsaturated ether substituted polymer) can be used as an intermediate in the synthesis of the epoxidized polymer. This allyl ether or unsaturated ether substituted intermediate product is thereafter reacted with a peroxide, such as hydrogen peroxide, m-chloroperoxybenzoic acid, acetyl peroxide, and the like, as well as mixtures thereof, to yield the epoxidized polymer. Typically, the reactants are present in relative amounts with respect to each other of from approximately equivalent molar amounts of peroxide and the number of unsaturated groups desired to be converted to epoxide groups to an excess of between 10 and 100 mole percent of peroxide. The reaction preferably takes place in a dilute solution of about 1 percent by weight solids or less to prevent crosslinking.

The general reaction scheme, illustrated below with the allyl alcoholate substituents, is as follows:

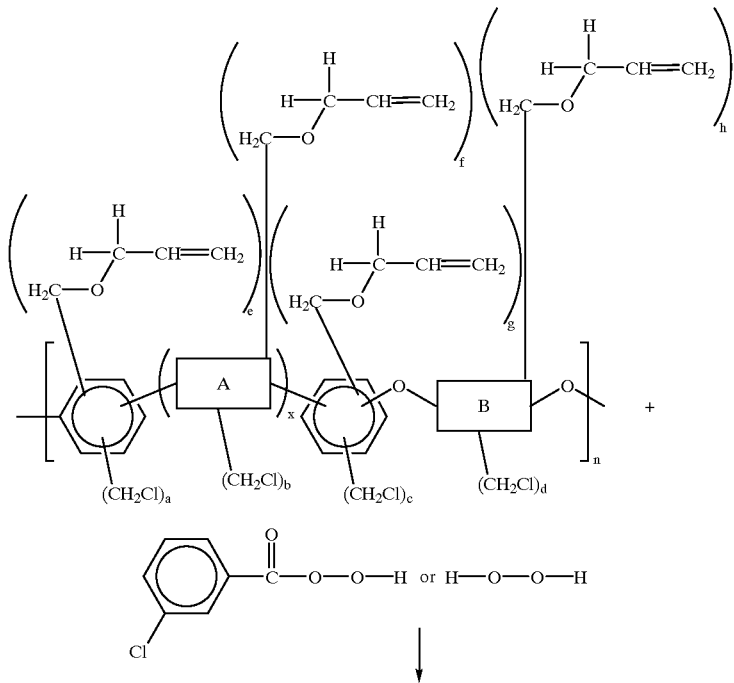

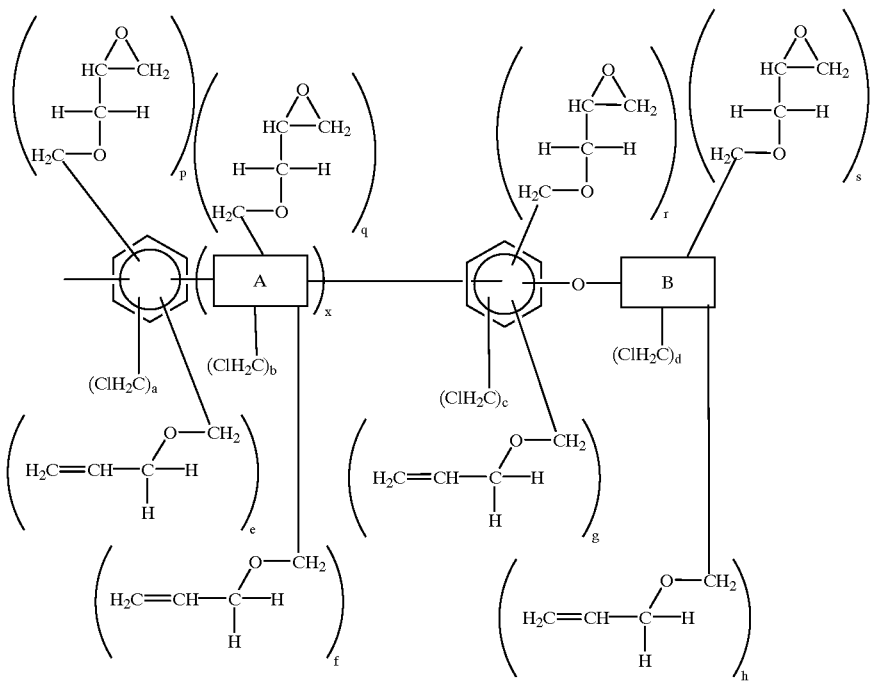

wherein a, b, c, d, e, f, g, h, p, q, r, and s are each integers of 0, 1, 2, 3, or 4, provided that the sum of a+e+p is no greater than 4, the sum of b+f+q is no greater than 4, the sum of c+g+r is no greater than 4, and the sum of d+h+s is no greater than 4, provided that at least one of p, q, r, and s is equal to or greater than 1 in at least some of the monomer repeat units of the polymer, and n is an integer representing the number of repeating monomer units.

Some or all of the haloalkyl groups can be replaced with allyl ether or epoxy substituents. Longer reaction times generally lead to greater degrees of substitution of haloalkyl groups with allyl ether or epoxy substituents. In one preferred embodiment, some of the haloalkyl groups remain on the polymer (i.e., at least one of a, b, c, or d is equal to at least 1 in at least some of the monomer repeat units of the polymer). In this embodiment, the polymer can, if desired, be further reacted to convert the haloalkyl groups to, for example, unsaturated ester groups.

Typical reaction temperatures for the conversion of the unsaturated ether groups to the epoxy groups are from about 0 to about 50° C., and preferably from about 0 to about 25° C., although the temperature can be outside these ranges. Typical reaction times are from about 1 to about 24 hours, and preferably from about 4 to about 16 hours, although the time can be outside these ranges. Typical solvents for this reaction include methylene chloride, chloroform, carbon tetrachloride, and the like.

The epoxidized polymer can also be prepared by reaction of the haloalkylated polymer with an epoxy-group-containing alcohol salt, such as a glycidolate salt, or a unsaturated alcohol salt, such as those set forth hereinabove, in the presence of a molar excess of base (with respect to the unsaturated alcohol salt or epoxy-group-containing alcohol salt), such as sodium hydride, sodium hydroxide, potassium carbonate, quaternary alkyl ammonium salts, or the like, under phase transfer conditions. Examples of suitable glycidolate salts include sodium glycidolate and the like. Typically, the reactants are present in relative amounts with respect to each other of from approximately equivalent molar amounts of alcohol and the number of unsaturated groups desired to be converted to epoxide groups. Typically, the reactants are present in solution in amounts of from about 1 to about 10 percent by weight solids, although other concentrations can be employed. The reaction with bases such as sodium hydroxide and potassium carbonate typically takes place at from about 25 to about 100° C. The reaction with sodium hydride with glycidol or the unsaturated alcohol generally occurs at ice bath temperatures. Typical reaction times are about 16 hours, although other times may be employed. Examples of suitable solvents include dimethyl acetamide, tetrahydrofuran, mixtures thereof, and the like.

The general reaction scheme is as follows:

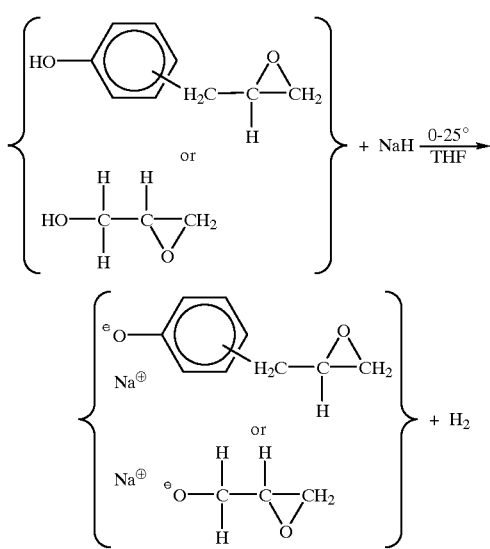

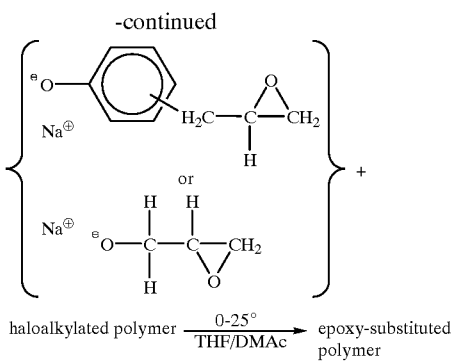

Unsaturated ether or allyl ether groups can also be placed on the haloalkylated polymer by other methods, such as by a Grignard reaction, a Wittig reaction, or the like.

The haloalkylated polymer can be substituted with a photosensitivity-imparting, water-solubility-enhancing (or water-dispersability-enhancing) group by reacting the haloalkylated polymer with an unsaturated amine, phosphine, or alcohol, typically being of the general formula

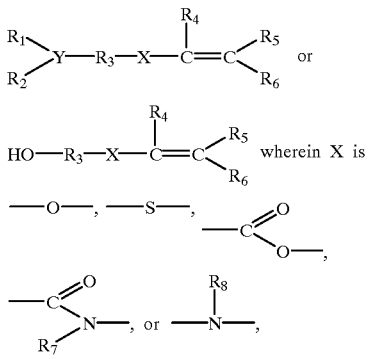

Y is a nitrogen atom or a phosphorus atom, $R_1$ and $R_2$ each, independently of the other, can be (but are not limited to) hydrogen atoms, alkyl groups, including saturated, unsaturated, and cyclic alkyl groups, preferably with from 1 to about 30 carbon atoms, more preferably with from 1 to about 8 carbon atoms, and most preferably with 1 or 2 carbon atoms, substituted alkyl groups, preferably with from 1 to about 30 carbon atoms, more preferably with from 1 to about 8 carbon atoms, and most preferably with 1 or 2 carbon atoms, aryl groups, preferably with from 6 to about 30 carbon atoms, more preferably with from 6 to about 18 carbon atoms, and most preferably with 6 carbon atoms, substituted aryl groups, preferably with from 6 to about 30 carbon atoms, more preferably with from 6 to about 18 carbon atoms, and most preferably with 6 carbon atoms, arylalkyl groups, preferably with from 7 to about 30 carbon atoms, more preferably with from 7 to about 19 carbon atoms, and most preferably with from 7 to about 14 carbon atoms, or substituted arylalkyl groups, preferably with from 7 to about 30 carbon atoms, more preferably with from 7 to about 19 carbon atoms, and most preferably with from 7 to about 14 carbon atoms, wherein $R_1$ and $R_2$ can be joined to form a ring, $R_3$ can be (but is not limited to) an alkyl group, including saturated, unsaturated, and cyclic alkyl groups, preferably with from 1 to about 30 carbon atoms, more preferably with from 1 to about 8 carbon atoms, and most preferably with 1 or 2 carbon atoms, a substituted alkyl group, preferably with from 1 to about 30 carbon atoms, more preferably with from 1 to about 8 carbon atoms, and most preferably with 1 or 2 carbon atoms, an aryl group, preferably with from 6 to about 30 carbon atoms, more preferably with from 6 to about 18 carbon atoms, and most preferably with 6 carbon atoms, a substituted aryl group, preferably with from 6 to about 30 carbon atoms, more preferably with from 6 to about 18 carbon atoms, and most preferably with 6 carbon atoms, an arylalkyl group, preferably with from 7 to about 30 carbon atoms, more preferably with from 7 to about 19 carbon atoms, and most preferably with from 7 to about 14 carbon atoms, or a substituted arylalkyl group, preferably with from 7 to about 30 carbon atoms, more preferably with from 7 to about 19 carbon atoms, and most preferably with from 7 to about 14 carbon atoms, $R_4$, $R_5$, and $R_6$ each, independently of the others, are hydrogen atoms, alkyl groups, including saturated, unsaturated, and cyclic alkyl groups, preferably with from 1 to about 30 carbon atoms, more preferably with from 1 to about 8 carbon atoms, and most preferably with 1 or 2 carbon atoms, substituted alkyl groups, preferably with from 1 to about 30 carbon atoms, more preferably with from 1 to about 8 carbon atoms, and most preferably with 1 or 2 carbon atoms, aryl groups, preferably with from 6 to about 30 carbon atoms, more preferably with from 6 to about 18 carbon atoms, and most preferably with 6 carbon atoms, substituted aryl groups, preferably with from 6 to about 30 carbon atoms, more preferably with from 6 to about 18 carbon atoms, and most preferably with 6 carbon atoms, arylalkyl groups, preferably with from 7 to about 30 carbon atoms, more preferably with from 7 to about 19 carbon atoms, and most preferably with from 7 to about 14 carbon atoms, or substituted arylalkyl groups, preferably with from 7 to about 30 carbon atoms, more preferably with from 7 to about 19 carbon atoms, and most preferably with from 7 to about 14 carbon atoms, and most preferably are hydrogen atoms, wherein two or more of $R_4$, $R_5$, and $R_6$ can be joined together to form a ring, and $R_7$ and $R_8$ each, independently of the other, can be (but are not limited to) hydrogen atoms, alkyl groups, including saturated, unsaturated, and cyclic alkyl groups, preferably with from 1 to about 30 carbon atoms, more preferably with from 1 to about 8 carbon atoms, and most preferably with 1 or 2 carbon atoms, substituted alkyl groups, preferably with from 1 to about 30 carbon atoms, more preferably with from 1 to about 8 carbon atoms, and most preferably with 1 or 2 carbon atoms, aryl groups, preferably with from 6 to about 30 carbon atoms, more preferably with from 6 to about 18 carbon atoms, and most preferably with 6 carbon atoms, substituted aryl groups, preferably with from 6 to about 30 carbon atoms, more preferably with from 6 to about 18 carbon atoms, and most preferably with 6 carbon atoms, arylalkyl groups, preferably with from 7 to about 30 carbon atoms, more preferably with from 7 to about 19 carbon atoms, and most preferably with from 7 to about 14 carbon atoms, or substituted arylalkyl groups, preferably with from 7 to about 30 carbon atoms, more preferably with from 7 to about 19 carbon atoms, and most preferably with from 7 to about 14 carbon atoms. Examples of suitable substituents on substituted alkyl groups, substituted aryl groups, and substituted arylalkyl groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. Alternatively, the combination of $R_3$ and X can be a group of the formula $$-[(CRR')_xO]_y$$

wherein x is an integer of from 1 to about 6, and preferably from 1 to about 3, y is an integer of from 1 to about 50, and preferably from 1 to about 20, and R and R' each, independently of the other, can be (but are not limited to) hydrogen atoms, alkyl groups, preferably with from 1 to 2 carbon atoms, and the like. Examples of suitable reactants of these formulae include N,N-dimethyl ethyl methacrylate, N,N-dimethyl ethyl acrylate,

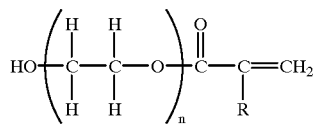

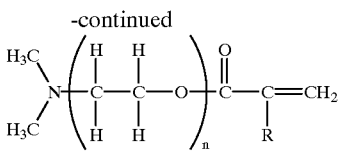

wherein R is H or $CH_3$ and n is an integer of from 1 to about 50, and the like. Examples of solvents suitable for the reaction include polar aprotic solvents such as N,N-dimethylacetamide, dimethylsulfoxide, N-methylpyrrolidinone, dimethylformamide, and the like. Typically, the reactants are present in relative amounts with respect to each other of about 10 parts by weight haloalkylated polymer, about 23 parts by weight solvent, and about 0.1 to about 5.5 parts by weight unsaturated amine, phosphine, or alcohol.

The general reaction scheme to place unsaturated ammonium or phosphonium groups on the polymer, illustrated below for the reaction with N,N-dimethylethyl methacrylate, is as follows:

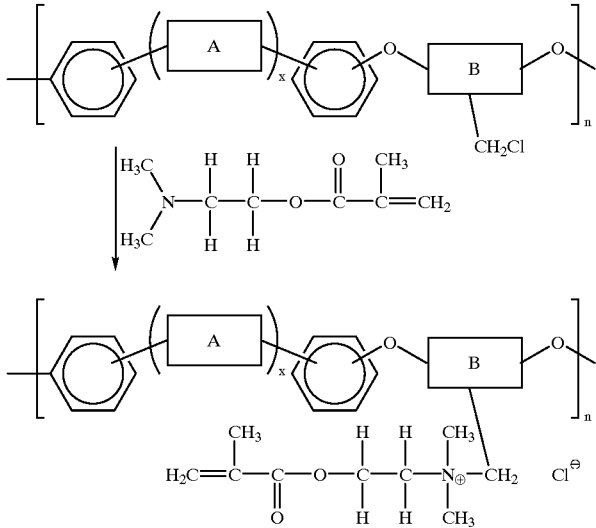

Or, more generally,

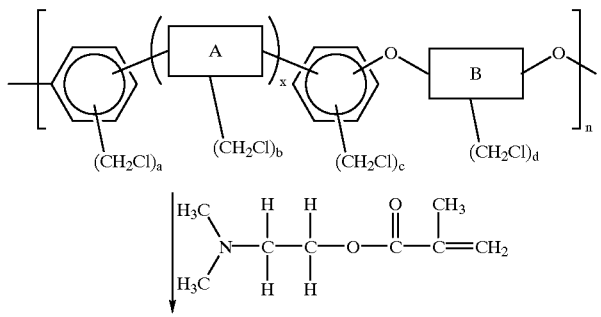

-continued

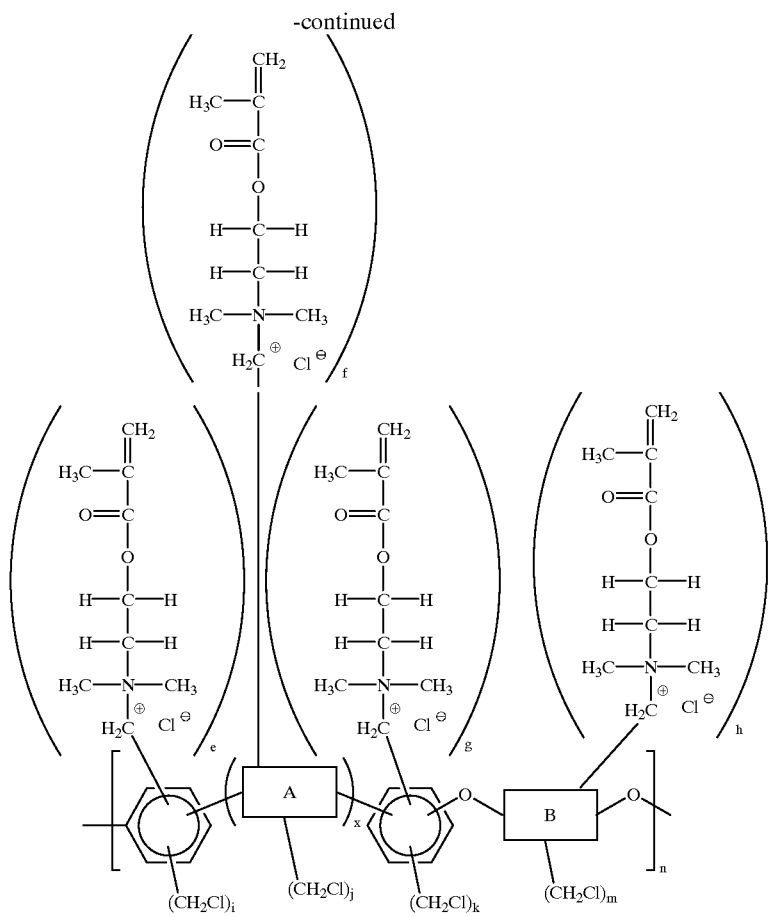

wherein a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units.

Some or all of the haloalkyl groups can be replaced with photosensitivity-imparting, water-solubility-enhancing (or water-dispersability-enhancing) substituents. Longer reaction times generally lead to greater degrees of substitution of haloalkyl groups with photosensitivity-imparting, water-solubility-enhancing (or water-dispersability-enhancing) substituents.

Typical reaction temperatures are from about 0 to about 40° C., and preferably from about 10 to about 25° C., although the temperature can be outside these ranges. Typical reaction times are from about 1 to about 16 hours, and preferably from about 1 to about 4 hours, although the time can be outside these ranges.

In another embodiment, the polymer of the above formula is substituted with two different functional groups, one of which imparts photosensitivity to the polymer and one of which imparts water solubility or water dispersability to the polymer. Either substituent may be placed on the polymer first, followed by the reaction to place the other substituent. In some instances, placement of the photosensitivity-imparting group, such as an unsaturated ester group, first, may be preferred because subsequent measurement of the degree of substitution by the photosensitivity-imparting group may be easier without other substituents, such as water-solubility-imparting groups or water-dispersability-imparting groups, being present. Examples of reactants which can be reacted with the polymer to substitute the polymer with suitable water solubility enhancing groups or water dispersability enhancing groups include tertiary amines of the general formula

which add to the polymer quaternary ammonium groups of the general formula

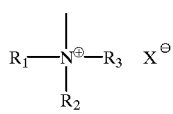

wherein $R_1$, $R_2$, and $R_3$ each, independently of the others, can be (but are not limited to) alkyl groups, typically with from 1 to about 30 carbon atoms, substituted alkyl groups, aryl groups, typically with from 6 to about 18 carbon atoms, substituted aryl groups, arylalkyl groups, typically with from 7 to about 19 carbon atoms, and substituted arylalkyl groups, and X represents a halogen atom, such as fluorine, chlorine, bromine, or iodine; tertiary phosphines of the general formula

which add to the polymer quaternary phosphonium groups of the general formula

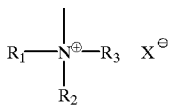

wherein $R_1$, $R_2$, and $R_3$ each, independently of the others, can be (but are not limited to) alkyl groups, typically with from 1 to about 30 carbon atoms, substituted alkyl groups, aryl groups, typically with from 6 to about 18 carbon atoms, substituted aryl groups, arylalkyl groups, typically with from 7 to about 19 carbon atoms, and substituted arylalkyl groups, and X represents a halogen atom, such as fluorine, chlorine, bromine, or iodine; alkyl thio ethers of the general formula

which add to the polymer sulfonium groups of the general formula

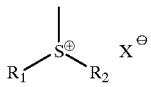

wherein $R_1$ and $R_2$ each, independently of the other, can be (but are not limited to) alkyl groups, typically with from 1 to about 6 carbon atoms and preferably with 1 carbon atom, and substituted alkyl groups, and X represents a halogen atom, such as fluorine, chlorine, bromine, or iodine; wherein the substituents on the substituted alkyl, aryl, and arylalkyl groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring.

These water solubility imparting substituents or water dispersability imparting substituents can be placed on the polymer by any suitable or desired process. For example, two equivalents of the nucleophilic reagent (amine, phosphine, or thio ether) can be allowed to react with one equivalent of the haloalkylated polymer at 25° C. in a polar aprotic solvent such as dimethylacetamide, dimethyl sulfoxide, N-methyl pyrrolidinone, dimethyl formamide, or the like, with the reactants present in the solvent in a concentration of about 30 percent by weight solids. Reaction times typically are from about 1 to about 24 hours, with 2 hours being typical.

Alternatively, the water solubility imparting group or water dispersability imparting group can be nonionic, such as a group of the formula

wherein x is an integer of from 1 to about 6, and preferably from 1 to about 3, y is an integer of from 1 to about 50, and preferably from 1 to about 20, and R, R', and R" each, independently of the others, can be (but are not limited to) hydrogen atoms, alkyl groups, preferably with from 1 to 2 carbon atoms, substituted alkyl groups, aryl groups, preferably with from 6 to about 12 carbon atoms, substituted aryl groups, arylalkyl groups, preferably with from 7 to about 13 carbon atoms, substituted arylalkyl groups, and the like, wherein the substituents on the substituted alkyl, aryl, and arylalkyl groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. Substituents of this formula can be placed on the polymer by, for example, reacting from about 2 to about 10 milliequivalents of a salt of the —[(CRR')$_x$O]$_y$R" group (such as an alkali metal salt or the like) with 1 equivalent of the haloalkylated polymer in a polar aprotic solvent such as tetrahydrofuran, dimethylacetamide, dimethyl sulfoxide, N-methyl pyrrolidinone, dimethyl formamide, or the like, in the presence of a base, such as at least about 2 equivalents of sodium hydroxide, at least about 1 equivalent of sodium hydride, or the like, at about 80° C. for about 16 hours. Longer polyether chains tend to impart more hydrophilic character to the polymer. The substitution of poly (vinyl benzyl chloride) polymers with polyether chains is disclosed in further detail in, for example, Japanese Patent Kokai 78-79,833 (1978) and in Chem. Abstr., 89, 180603 (1978), the disclosures of each of which are totally incorporated herein by reference.

Higher degrees of haloalkylation generally enable higher degrees of substitution with water solubility imparting groups or water dispersability imparting groups. Different degrees of substitution may be desirable for different applications. The degree of substitution (i.e., the average number of water solubility imparting groups or water dispersability imparting groups per monomer repeat unit) typically is from about 0.25 to about 4.0, and preferably from about 0.5 to about 2, although the degree of substitution can be outside these ranges. Optimum amounts of substitution are from about 0.8 to about 2 milliequivalents of water solubility imparting group or water dispersability imparting group per gram of resin, and preferably from about 1 to about 1.5 milliequivalents of water solubility imparting group or water dispersability imparting group per gram of resin.

The hydroxymethylation of a polymer of the above formula can be accomplished by reacting the polymer in solution with formaldehyde or paraformaldehyde and a base, such as sodium hydroxide, potassium hydroxide, calcium hydroxide, ammonium hydroxide, tetramethylammonium hydroxide, or the like. The polymer is dissolved in a suitable solvent, such as 1,1,2,2-tetrachloroethane or the like, and is allowed to react with the formaldehyde or paraformaldehyde. Examples of solvents suitable for the reaction include 1,1,2,2-tetrachloroethane, as well as methylene chloride, provided a suitable pressure reactor is used. Typically, the reactants are present in relative amounts by weight of about 44.5 parts paraformaldehyde or 37 parts formaldehyde, about 1 part base, about 200 parts 1,1,2,2-tetrachloroethane, and about 100 parts polymer.

The general reaction scheme is as follows:

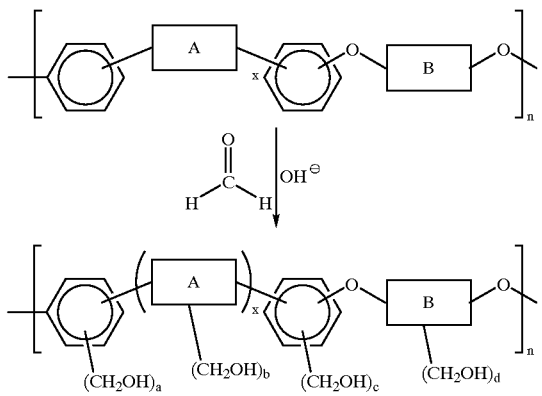

wherein a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. Substitution is generally random, although the substituent often indicates a preference for the B group, and a particular preference for the sites ortho to oxygen on the B group, and any given monomer repeat unit may have no hydroxymethyl substituents, one hydroxymethyl substituent, or two or more hydroxymethyl substituents. Most commonly, each aromatic ring will have either no hydroxymethyl groups or one hydroxymethyl group.

Typical reaction temperatures are from about 50 to about 125° C., and preferably from about 85 to about 110° C., although the temperature can be outside these ranges. Typical reaction times are from about 4 to about 24 hours, and preferably from about 4 to about 6 hours, although the time can be outside these ranges. Longer reaction times generally result in higher degrees of hydroxymethylation. Different degrees of hydroxymethylation may be desirable for different applications. Too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of hydroxymethyl groups per monomer repeat unit) preferably is from about 0.25 to about 2.0, and more preferably from about 0.5 to about 0.8, although the degree of substitution can be outside these ranges for ink jet printhead applications. This amount of substitution corresponds to from about 0.8 to about 1.3 milliequivalents of hydroxymethyl per gram of resin.

Polymers of the above formula can also be hydroxyalkylated by first preparing the haloalkylated derivative and then replacing at least some of the haloalkyl groups with hydroxyalkyl groups. For example, the haloalkylated polymer can be hydroxyalkylated by alkaline hydrolysis of the haloalkylated polymer. The hydroxy groups replace the halide atoms in the haloalkyl groups on the polymer; accordingly, the number of carbon atoms in the haloalkyl group generally corresponds to the number of carbon atoms in the hydroxyalkyl group. Examples of suitable reactants include sodium hydroxide, potassium hydroxide, calcium hydroxide, ammonium hydroxide, tetraalkyl ammonium hydroxides, such as tetrabutyl ammonium hydroxide, and the like. Examples of solvents suitable for the reaction include 1,1,2,2-tetrachloroethane, methylene chloride, and water. Typically, the reactants are present in relative amounts with respect to each other by weight of about 13.8 parts haloalkylated polymer, about 50 parts solvent, and about 30.6 parts base (containing 23 parts tetrabutylammonium hydroxide in water). After a clear solution is obtained, 30 milliliters of sodium hydroxide (50 percent aqueous solution) is added. After 16 hours at about 25° C., the organic layer is washed with water, dried over magnesium sulfate, and poured into methanol (1 gallon) to precipitate the polymer.

The general reaction scheme, illustrated below for the chloromethylated polymer, is as follows:

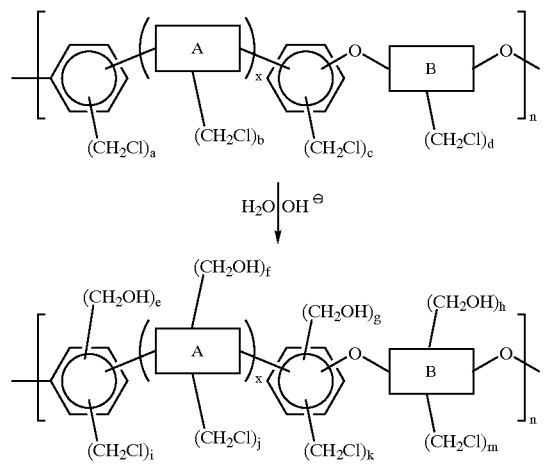

wherein a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units.

Higher degrees of haloalkylation generally enable higher degrees of substitution with hydroxyalkyl groups, and thereby enable greater photosensitivity of the polymer. Different degrees of substitution may be desirable for different applications. Too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of hydroxyalkyl groups per monomer repeat unit) preferably is from about 0.25 to about 2.0, and more preferably from about 0.5 to about 0.8, although the degree of substitution can be outside these ranges for ink jet printhead applications. Optimum amounts of substitution are from about 0.8 to about 1.3 milliequivalents of hydroxyalkyl group per gram of resin.

Some or all of the haloalkyl groups can be replaced with hydroxyalkyl substituents. Longer reaction times generally lead to greater degrees of substitution of haloalkyl groups with hydroxyalkyl substituents.

Typical reaction temperatures are from about 25 to about 120° C., and preferably from about 25 to about 50° C., although the temperature can be outside this range. Typical reaction times are from about 1 to about 24 hours, and preferably from about 10 to about 16 hours, although the time can be outside these ranges.

Intermediate derivatives can also be prepared by any suitable or desired process. For example, suitable processes for haloalkylating polymers include reaction of the polymers with formaldehyde and hydrochloric acid, bischloromethyl ether, chloromethyl methyl ether, octylchloromethyl ether, or the like, generally in the presence of a Lewis acid catalyst. Bromination of a methyl group on the polymer can also be accomplished with elemental bromine via a free radical process initiated by, for example, a peroxide initiator or light. Halogen atoms can be substituted for other halogens already on a halomethyl group by, for example, reaction with the appropriate hydrohalic acid or halide salt. Methods for the haloalkylation of polymers are also disclosed in, for example, "Chloromethylation of Condensation Polymers Containing an Oxy-1,4-Phenylene Backbone," W. H. Daly et al., *Polymer Preprints*, Vol. 20, No. 1, 835 (1979), the disclosure of which is totally incorporated herein by reference.

One specific process suitable for haloalkylating the polymer entails reacting the polymer with an acetyl halide, such as acetyl chloride, and dimethoxymethane in the presence of a halogen-containing Lewis acid catalyst, such as those of the general formula $$M^{n\oplus}X_n$$

wherein n is an integer of 1, 2, 3, 4, or 5, M represents a boron atom or a metal atom, such as tin, aluminum, zinc, antimony, iron (III), gallium, indium, arsenic, mercury, copper, platinum, palladium, or the like, and X represents a halogen atom, such as fluorine, chlorine, bromine, or iodine, with specific examples including $SnCl_4$, $AlCl_3$, $ZnCl_2$, $AlBr_3$, $BF_3$, $SbF_5$, $FeI_3$, $GaBr_3$, $InCl_3$, $AsI_5$, $HgBr_2$, $CuCl$, $PdCl_2$, $PtBr_2$, or the like. Care must be taken to avoid cross-linking of the haloalkylated polymer. Typically, the reactants are present in relative amounts by weight of about 35.3 parts acetyl halide, about 37 parts dimethoxymethane, about 1.2 parts methanol, about 0.3 parts Lewis acid catalyst, about 446 parts 1,1,2,2-tetrachloroethane, and about 10 to 20 parts polymer. 1,1,2,2-Tetrachlorethane is a suitable reaction solvent. Dichloromethane is low boiling, and consequently the reaction is slow in this solvent unless suitable pressure equipment is used.

The general reaction scheme is as follows:

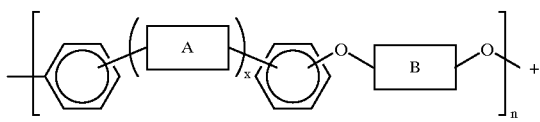

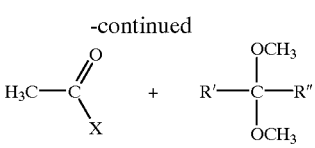

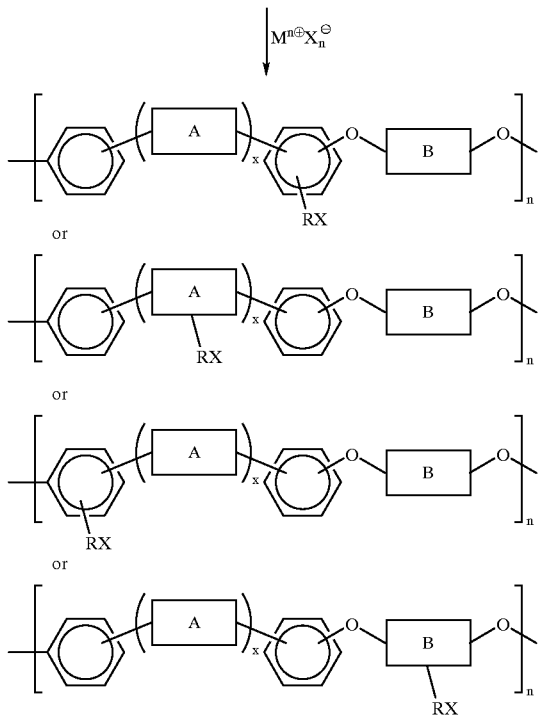

wherein R' and R" each, independently of the other, can be (but are not limited to) hydrogen atoms, alkyl groups, including saturated, unsaturated, and cyclic alkyl groups, preferably with from 1 to about 11 carbon atoms, substituted alkyl groups, preferably with from 1 to about 11 carbon atoms, aryl groups, preferably with from 6 to about 11 carbon atoms, substituted aryl groups, preferably with from 6 to about 11 carbon atoms, arylalkyl groups, preferably with from 7 to about 11 carbon atoms, substituted arylalkyl groups, preferably with from 7 to about 11 carbon atoms, and the like. The resulting material is of the general formula

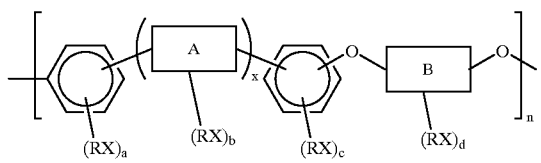

wherein n is an integer of 1, 2, 3, 4, or 5, R is an alkyl group, including both saturated, unsaturated, linear, branched, and cyclic alkyl groups, preferably with from 1 to about 11 carbon atoms, more preferably with from 1 to about 5 carbon atoms, even more preferably with from 1 to about 3 carbon atoms, and most preferably with 1 carbon atom, a substituted alkyl group, an arylalkyl group, preferably with from 7 to about 29 carbon atoms, more preferably with from 7 to about 17 carbon atoms, even more preferably with from 7 to about 13 carbon atoms, and most preferably with from 7 to about 9 carbon atoms, or a substituted arylalkyl group, and X is a halogen atom, such as fluorine, chlorine, bromine, or iodine, a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. Examples of suitable substituents on the substituted alkyl, aryl, and arylalkyl groups include (but are not limited to) alkyl groups, including saturated, unsaturated, linear, branched, and cyclic alkyl groups, preferably with from 1 to about 6 carbon atoms, substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein any two or more substituents can be joined together to form a ring. Substitution is generally random, although the substituent often indicates a preference for the B group, and any given monomer repeat unit may have no haloalkyl substituents, one haloalkyl substituent, or two or more haloalkyl substituents, wherein a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. Substitution is generally random, although the substituent often indicates a preference for the B group, and any given monomer repeat unit may have no haloalkyl substituents, one haloalkyl substituent, or two or more haloalkyl substituents.

Typical reaction temperatures are from about 60 to about 120° C., and preferably from about 80 to about 110° C., although the temperature can be outside these ranges. Typical reaction times are from about 1 to about 10 hours, and preferably from about 2 to about 4 hours, although the time can be outside these ranges. Longer reaction times generally result in higher degrees of haloalkylation. When the haloalkylated polymer is used as an intermediate material in the synthesis of polymers substituted with photoactive groups such as unsaturated ester groups, higher degrees of haloalkylation generally enable higher degrees of substitution with photoactive groups and thereby enable greater photosensitivity of the polymer. Different degrees of haloalkylation may be desirable for different applications. When the material is used as an intermediate in the synthesis of the polymer substituted with unsaturated ester groups, too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of substitution (i.e., the average number of unsaturated ester groups per monomer repeat unit) preferably is from about 0.5 to about 1.2, and more preferably from about 0.7 to about 0.8, although the degree of substitution can be outside these ranges for ink jet printhead applications. The halomethylated polymer can also be used as a photoresist in its own right when energy sources such as electron beams, deep ultraviolet light, or the like are used.

Other procedures for placing functional groups on aromatic polymers are disclosed in, for example, W. H. Daly, S. Chotiwana, and R. Nielsen, *Polymer Preprints,* 20(1), 835 (1979); "Functional Polymers and Sequential Copolymers by Phase Transfer Catalysis, 3. Synthesis And Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.,* 185, 2319 (1984); F. Wang and J. Roovers, *Journal of Polymer Science: Part A: Polymer Chemistry,* 32, 2413 (1994); "Details Concerning the Chloromethylation of Soluble High Molecular Weight Polystyrene Using Dimethoxymethane, Thionyl Chloride, And a Lewis Acid: A Full Analysis," M. E. Wright, E. G. Toplikar, and S. A. Svejda, *Macromolecules,* 24, 5879 (1991); "Functional Polymers and Sequential Copolymers by Phase Transfer Catalysts," V. Percec and P. L. Rinaldi, *Polymer Bulletin,* 10, 223 (1983); "Preparation of Polymer Resin and Inorganic Oxide Supported Peroxy-Acids and Their Use in the Oxidation of Tetrahydrothiophene," J. A. Greig, R. D. Hancock, and D. C. Sherrington, *Euopean Polymer J.,* 16, 293 (1980); "Preparation of Poly(vinylbenzyltriphenylphosphonium Perbromide) and its Application in the Bromination of Organic Compounds," A. Akelah, M. Hassanein, and F. Abdel-Galil, *European Polymer J.,* 20 (3) 221 (1984); J. M. J. Frechet and K. K. Haque, *Macromelcules,* 8, 130 (1975); U.S. Pat. Nos. 3,914,194; 4,110,279; 3,367,914; "Synthesis of Intermediates for Production of Heat Resistant Polymers (Chloromethylation of Diphenyl oxide)," E. P. Tepenitsyna, M. I. Farberov, and A. P. Ivanovski, *Zhurnal Prikladnoi Khimii,* Vol. 40, No. 11, 2540 (1967); U.S. Pat. No. 3,000, 839; Chem Abst. 56, 590f (1962); U.S. Pat. No. 3,128,258; Chem Abstr. 61, 4560a (1964); J. D. Doedens and H. P. Cordts, *Ind. Eng. Ch.,* 83, 59 (1961); British Patent 863,702; and Chem Abstr 55, 18667b (1961); the disclosures of each of which are totally incorporated herein by reference.

While not required, it may be advantageous with respect to the ultimate properties of the photopatterned polymer if the polymer is functionalized with a second thermally polymerizable group, typically (although not necessarily) one which reacts at a temperature in excess of the glass transition temperature of the crosslinked or chain extended photopatternable polymer. The second polymerizable group can be either appended to the polymer chain or present as a terminal end group.

Examples of suitable thermal sensitivity imparting groups include ethynyl groups, such as those of the formula

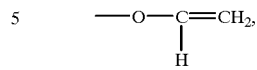 wherein R is

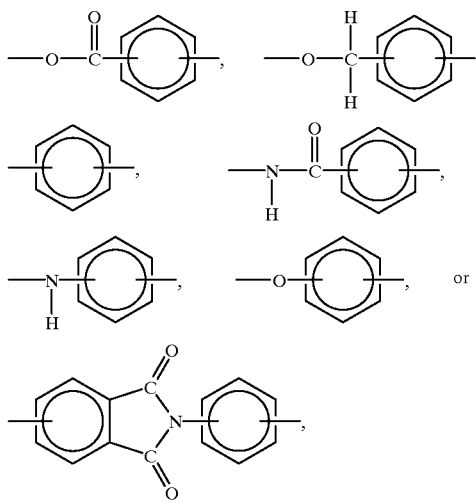

a is an integer of 0 or 1, and R' is a hydrogen atom or a phenyl group, ethylenic linkage-containing groups, such as allyl groups, including those of the formula

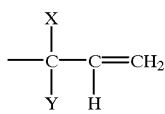

wherein X and Y each, independently of the other, are hydrogen atoms or halogen atoms, such as fluorine, chlorine, bromine, or iodine, vinyl groups, including those of the formula

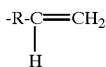

wherein R is an alkyl group, including both saturated, unsaturated, linear, branched, and cyclic alkyl groups, preferably with from 1 to about 30 carbon atoms, more preferably with from 1 to about 11 carbon atoms, even more preferably with from 1 to about 5 carbon atoms, a substituted alkyl group, an aryl group, preferably with from 6 to about 24 carbon atoms, more preferably with from 6 to about 18 carbon atoms, a substituted aryl group, an arylalkyl group, preferably with from 7 to about 30 carbon atoms, more preferably with from 7 to about 19 carbon atoms, or a substituted arylalkyl group, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein any two or more substituents can be joined together to form a ring, vinyl ether groups, such as those of the formula

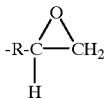

epoxy groups, including those of the formula

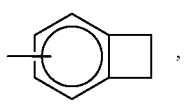

R is an alkyl group, including both saturated, unsaturated, linear, branched, and cyclic alkyl groups, preferably with from 1 to about 30 carbon atoms, more preferably with from 1 to about 11 carbon atoms, even more preferably with from 1 to about 5 carbon atoms, a substituted alkyl group, an aryl group, preferably with from 6 to about 24 carbon atoms, more preferably with from 6 to about 18 carbon atoms, a substituted aryl group, an arylalkyl group, preferably with from 7 to about 30 carbon atoms, more preferably with from 7 to about 19 carbon atoms, or a substituted arylalkyl group, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein any two or more substituents can be joined together to form a ring, halomethyl groups, such as fluoromethyl groups, chloromethyl groups, bromomethyl groups, and iodomethyl groups, hydroxymethyl groups, benzocyclobutene groups, including those of the formula

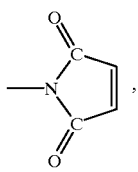

phenolic groups (-φ-OH), provided that the phenolic groups are present in combination with either halomethyl groups or hydroxymethyl groups; the halomethyl groups or hydroxymethyl groups can be present on the same polymer bearing the phenolic groups or on a different polymer, or on a monomeric species present with the phenolic group substituted polymer; maleimide groups, such as those of the formula biphenylene groups, such as those of the formula

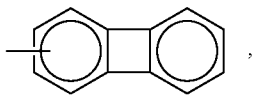

5-norbornene-2,3-dicarboximido (nadimido) groups, such as those of the formula

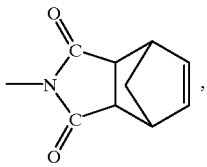

alkylcarboxylate groups, such as those of the formula

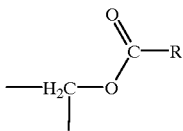

wherein R is an alkyl group (including saturated, unsaturated, and cyclic alkyl groups), preferably with from 1 to about 30 carbon atoms, more preferably with from 1 to about 6 carbon atoms, a substituted alkyl group, an aryl group, preferably with from 6 to about 30 carbon atoms, more preferably with from 1 to about 2 carbon atoms, a substituted aryl group, an arylalkyl group, preferably with from 7 to about 35 carbon atoms, more preferably with from 7 to about 15 carbon atoms, or a substituted arylalkyl group, wherein the substituents on the substituted alkyl, aryl, and arylalkyl groups can be (but are not limited to) alkoxy groups, preferably with from 1 to about 6 carbon atoms, aryloxy groups, preferably with from 6 to about 24 carbon atoms, arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein two or more substituents can be joined together to form a ring, and the like.

The thermal sensitivity imparting groups can be present either as terminal end groups on the polymer or as groups which are pendant from one or more monomer repeat units within the polymer chain. When the thermal sensitivity imparting groups are present as terminal end groups, one or both polymer ends can be terminated with the thermal sensitivity imparting group (or more, if the polymer is crosslinked and has more than two termini). When the thermal sensitivity imparting groups are substituents on one or more monomer repeat units of the polymer, any desired or suitable degree of substitution can be employed. Preferably, the degree of substitution is from about 1 to about 4 thermal sensitivity imparting groups per repeat monomer unit, although the degree of substitution can be outside this range. Preferably, the degree of substitution is from about 0.5 to about 5 milliequivalents of thermal sensitivity imparting group per gram of polymer, and more preferably from about 0.75 to about 1.5 milliequivalents per gram, although the degree of substitution can be outside this range.

The thermal sensitivity imparting groups can be placed on the polymer by any suitable or desired synthetic method. Processes for putting the above mentioned thermal sensitivity imparting groups on polymers are disclosed in, for example, "Polyimides," C. E. Sroog, *Prog. Polym. Sci.,* Vol. 16, 561–694 (1991); F. E. Arnold and L. S. Tan, *Symposium on Recent Advances in Polyimides and Other High Performance Polymers,* Reno, Nev. (July 1987); L. S. Tan and F. E. Arnold, *J. Polym. Sci. Part A,* 26, 1819 (1988); U.S. Pat. No. 4,973,636; and U.S. Pat. No. 4,927,907; the disclosures of each of which are totally incorporated herein by reference.

Other procedures for placing thermally curable end groups on aromatic polymers are disclosed in, for example, P. M. Hergenrother, *J. Macromol. Sci. Rev. Macromol. Chem.,* C19 (1), 1–34 (1980); V. Percec and B. C. Auman, *Makromol. Chem.,* 185, 2319 (1984); S. J. Havens, and P. M. Hergenrother, *J. of Polymer Science: Polymer Chemistry Edition,* 22, 3011 (1984); P. M. Hergenrother, *J. of Polymer Science: Polymer Chemistry Edition,* 20, 3131 (1982); V. Percec, P. L. Rinaldi, and B. C. Auman, *Polymer Bulletin,* 10, 215 (1983); "Functional Polymers and Sequential Copolymers by Phase Transfer Catalysis, 2. Synthesis and Characterization of Aromatic Poly(ether sulfones Containing Vinylbenzyl and Ethynylbenzyl Chain Ends," V. Percec and B. C. Auman, *Makromol. Chem.* 185, 1867 (1984); "Functional Polymers and Sequential Copolymers by Phase Transfer Catalysis, 6. On the Phase Transfer Catalyzed Williamson Polyetherification as a New Method for the Preparation of Alternating Block copolymers," V. Percec, B. Auman, and P. L. Rinaldi, *Polymer Bulletin,* 10, 391 (1983); "Functional Polymers and Sequential Copolymers by Phase Transfer Catalysis, 3 Synthesis and Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.,* 185, 2319 (1984); and "Phase Transfer Catalysis, Functional Polymers and Sequential Copolymers by PTC,5. Synthesis and Characterization of Polyformals of Polyether Sulfones," *Polymer Bulletin,* 10, 385 (1983); the disclosures of each of which are totally incorporated herein by reference.

In some instances a functional group can behave as either a photosensitivity-imparting group or a thermal sensitivity imparting group. For example, the acryloylmethyl group can function as a thermal sensitive functional group by loss of the acryloyl group and crosslinking or chain extension through methylene bridges. For the polymers of the present invention having optional thermal sensitivity imparting groups thereon, at least two different groups are present on the polymer, one of which functions as a photosensitivity-imparting group and one of which functions as a thermal sensitivity imparting group. Either the two groups are selected so that the thermal sensitivity imparting group does not react or crosslink or chain extend when exposed to actinic radiation at a level to which the photosensitivity-imparting group is sensitive, or photocuring is halted while at least some thermal sensitivity imparting groups remain intact and unreacted or uncrosslinked on the polymer. Typically (although not necessarily) the thermal sensitivity imparting group is one which reacts at a temperature in excess of the glass transition temperature of the polymer subsequent to crosslinking or chain extension via photoexposure.

When thermal sensitivity imparting groups are present, the polymers of the present invention are cured in a two-stage process which entails (a) exposing the polymer to actinic radiation, thereby causing the polymer to become crosslinked or chain extended through the photosensitivity-imparting groups; and (b) subsequent to step (a), heating the polymer to a temperature of at least 140° C., thereby causing further crosslinking or chain extension of the polymer through the thermal sensitivity imparting groups.

The temperature selected for the second, thermal cure step generally depends on the thermal sensitivity imparting group which is present on the polymer. For example, ethynyl groups preferably are cured at temperatures of from about 150 to about 300° C. Halomethyl groups preferably are cured at temperatures of from about 150 to about 260° C. Hydroxymethyl groups preferably are cured at temperatures of from about 150 to about 250° C. Phenylethynyl phenyl groups preferably are cured at temperatures of about 350° C. Vinyl groups preferably are cured at temperatures of from about 150 to about 250° C. Allyl groups preferably are cured at temperatures of over about 260° C. Epoxy groups preferably are cured at temperatures of about 150° C. Maleimide groups preferably are cured at temperatures of from about 300 to about 350° C. Benzocyclobutene groups preferably are cured at temperatures of over about 300° C. 5-Norbornene-2,3-dicarboximido groups preferably are cured at temperatures of from about 250 to about 350° C. Vinyl ether groups preferably are cured at temperatures of about 150° C. Phenolic groups in the presence of hydroxymethyl or halomethyl groups preferably are cured at temperatures of from about 150 to about 180° C. Alkylcarboxylate groups preferably are cured at temperatures of from about 150 to about 250° C. Curing temperatures usually do not exceed 350 or 400° C., although higher temperatures can be employed provided that decomposition of the polymer does not occur. Higher temperature cures preferably take place in an oxygen-excluded environment.

Reaction of the phenylethynyl end groups serves to chain-extend the network. Hydroxymethyl and halo groups are also preferred when the photopatternable polymer has a glass transition temperature of less than about 150° C. Hydroxymethyl and halomethyl groups on phenolic ends are particularly reactive and serve to chain-extend the network. The fact that this chain extension occurs at temperatures significantly in excess of the glass transition temperature of the polymer facilitates the chain extension reaction, relaxes stresses in the crosslinked film, and allows for the extrusion of thermally labile alkyl fragments introduced in the photoactivation of the backbone. Phenolic end groups can be obtained by adjusting the stoichiometry of the coupling reaction in the formation of polyarylene ether ketones; for example, excess bisphenol A is used when bisphenol A is the B group. Halomethyl groups are particularly preferred. Halomethyl groups react at a temperature in excess of 150° C. and extensively crosslink the polymer by the elimination of hydrochloric acid and the formation of methylene bridges. When the photoexposed crosslinked polymer has a glass transition temperature of less than about 150° C., halomethyl groups are particularly preferred. The fact that this chain extension and crosslinking occurs at temperatures significantly in excess of the glass transition temperature of the polymer facilitates the chain extension reaction, relaxes stresses in the cross-linked film, and allows for the extrusion of thermally labile alkyl fragments introduced in the photoactivation of the backbone. The thermal reaction is believed to eliminate hydrohalic acid and to link polymer chains with methylene bridges. Crosslinking of the halomethyl groups begins near 150° C. and proceeds rapidly in the temperature range of from about 180 to about 210° C.

Further information regarding photoresist compositions is disclosed in, for example, J. J. Zupancic, D. C. Blazej, T. C. Baker, and E. A. Dinkel, *Polymer Preprints*, 32, (2), 178 (1991); "High Performance Electron Negative Resist, Chloromethylated Polystyrene. A Study on Molecular Parameters," S. Imamura, T. Tamamura, and K. Harada, *J. of Applied Polymer Science*, 27, 937 (1982); "Chloromethylated Polystyrene as a Dry Etching-Resistant Negative Resist for Submicron Technology", S. Imamura, *J. Electrochem. Soc.: Solid-state Science and Technology*, 126(9), 1628 (1979); "UV curing of composites based on modified unsaturated polyesters," W. Shi and B. Ranby, J. of Applied Polymer Science, Vol. 51, 1129 (1994); "Cinnamates VI. Light-Sensitive Polymers with Pendant o-,m- and p-hydroxycinnamate Moieties," F. Scigalski, M. Toczek, and J. Paczkowski, *Polymer*, 35, 692 (1994); and "Radiation-cured Polyurethane Methacrylate Pressure-sensitive Adhesives," G. Ansell and C. Butler, *Polymer*, 35 (9). 2001 (1994), the disclosures of each of which are totally incorporated herein by reference.

In some instances, the terminal groups on the polymer can be selected by the stoichiometry of the polymer synthesis. For example, when a polymer is prepared by the reaction of 4,4'-dichlorobenzophenone and bis-phenol A in the presence of potassium carbonate in N,N-dimethylacetamide, if the bis-phenol A is present in about 7.5 to 8 mole percent excess, the resulting polymer generally is bis-phenol A-terminated (wherein the bis-phenol A moiety may or may not have one or more hydroxy groups thereon), and the resulting polymer typically has a polydispersity (Mw/Mn) of from about 2 to about 3.5. When the bis-phenol A-terminated polymer is subjected to further reactions to place functional groups thereon, such as haloalkyl groups, and/or to convert one kind of functional group, such as a haloalkyl group, to another kind of functional group, such as an unsaturated ester group, the polydispersity of the polymer can rise to the range of from about 4 to about 6. In contrast, if the 4,4'-dichlorobenzophenone is present in about 7.5 to 8 mole percent excess, the reaction time is approximately half that required for the bis-phenol A excess reaction, the resulting polymer generally is benzophenone-terminated (wherein the benzophenone moiety may or may not have one or more chlorine atoms thereon), and the resulting polymer typically has a polydispersity of from about 2 to about 3.5. When the benzophenone-terminated polymer is subjected to further reactions to place functional groups thereon, such as haloalkyl groups, and/or to convert one kind of functional group, such as a haloalkyl group, to another kind of functional group, such as an unsaturated ester group, the polydispersity of the polymer typically remains in the range of from about 2 to about 3.5. Similarly, when a polymer is prepared by the reaction of 4,4'-difluorobenzophenone with either 9,9'-bis(4-hydroxyphenyl)fluorene or bis-phenol A in the presence of potassium carbonate in N,N-dimethylacetamide, if the 4,4'-difluorobenzophenone reactant is present in excess, the resulting polymer generally has benzophenone terminal groups (which may or may not have one or more fluorine atoms thereon). The well-known Carothers equation can be employed to calculate the stoichiometric offset required to obtain the desired molecular weight. (See, for example, William H. Carothers, "An Introduction to the General Theory of Condensation Polymers," *Chem. Rev.*, 8, 353 (1931) and *J. Amer. Chem. Soc.*, 51, 2548 (1929); see also P. J. Flory, *Principles of Polymer Chemistry*, Cornell University Press, Ithaca, N.Y. (1953); the disclosures of each of which are totally incorporated herein by reference.) More generally speaking, during the preparation of polymers of the formula

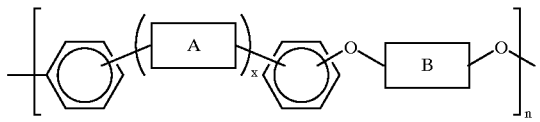

the stoichiometry of the polymer synthesis reaction can be adjusted so that the end groups of the polymer are derived from the "A" groups or derived from the "B" groups. Specific functional groups can also be present on these terminal "A" groups or "B" groups, such as ethynyl groups or other thermally sensitive groups, hydroxy groups which are attached to the aromatic ring on an "A" or "B" group to form a phenolic moiety, halogen atoms which are attached to the "A" or "B" group, or the like.

Polymers with end groups derived from the "A" group, such as benzophenone groups or halogenated benzophenone groups, may be preferred for some applications because both the syntheses and some of the reactions of these materials to place substituents thereon may be easier to control and may yield better results with respect to, for example, cost, molecular weight, molecular weight range, and polydispersity ($M_w/M_n$) compared to polymers with end groups derived from the "B" group, such as bis-phenol A groups (having one or more hydroxy groups on the aromatic rings thereof) or other phenolic groups. While not being limited to any particular theory, it is believed that the haloalkylation reaction in particular proceeds most rapidly on the phenolic tails when the polymer is bis-phenol A terminated. Moreover, it is believed that halomethylated groups on phenolic-terminated polymers may be particularly reactive to subsequent crosslinking or chain extension. In contrast, it is generally believed that halomethylation does not take place on the terminal aromatic groups with electron withdrawing substituents, such as benzophenone, halogenated benzophenone, or the like. The "A" group terminated materials may also function as an adhesive, and in applications such as thermal ink jet printheads, the use of the crosslinked "A" group terminated polymer may reduce or eliminate the need for an epoxy adhesive to bond the heater plate to the channel plate.

The precise degree of photosensitivity-imparting group substitution of the polymer may be difficult to control, and different batches of photosensitivity-imparting group substituted polymers may have somewhat different degrees of substitution even though the batches were prepared under similar conditions. Photoresist compositions containing polymers for which the degree of photosensitivity-imparting group substitution varies will exhibit variation in characteristics such as photospeed, imaging energy requirements, photosensitivity, shelf life, film forming characteristics, development characteristics, and the like. Accordingly, the photoresist composition containing the photosensitivity-imparting group substituted polymer is prepared according to the present invention.

The first photosensitivity-imparting group substituted polymer can be prepared as described hereinabove. In one embodiment of the present invention, the second component is a polymer which either is substituted with photosensitivity-imparting groups but to a lesser degree than the first polymer, or which does not contain photosensitivity-imparting group substituents. The second polymer may be selected from a wide variety of polymers. For example, in one embodiment of the present invention, two different photosensitivity-imparting group substituted polymers are blended together, wherein one has a higher degree of substitution than the other. In another embodiment of the present invention, the second polymer is a polymer of the above general formula but having no photosensitivity-imparting group substituents, such as the polymer starting materials (and, if deep ultraviolet, x-ray, or electron beam radiation are not being used for photoexposure, the haloalkylated polymers prepared as described hereinabove). In yet another embodiment of the present invention, the second polymer is not necessarily a polymer of the above general formula, but is selected from any of a wide variety of other high performance polymers suitable for obtaining a desirable photoresist mixture with the desired characteristics, such as epoxies, polycarbonates, diallyl phthalates, chloromethylated bis-fluorenones, polyphenylenes, phenoxy resins, polyarylene ethers, poly (ether imides), polyarylene ether ketones, polyphenylene sulfides, polysulfones, poly (ether sulfones), polyphenyl triazines, polyimides, polyphenyl quinoxalines, other polyheterocyclic systems, and the like, as well as mixtures thereof. High performance polymers typically are moldable at temperatures above those at which their use is intended, and are useful for high temperature structural applications. While most high performance polymers are thermoplastic, some, such as phenolics, tend to be thermosetting. Any combination of photosensitivity-imparting group substituted polymers of the above formula, polymers having no photosensitivity-imparting group substituents but falling within the above general formula, and/or other polymers outside the scope of the above general formula can be used as the second polymer for the present invention. For example, in one embodiment of the present invention, a photoresist is prepared from: (a) 60 parts by weight of a polyarylene ether ketone within the above general formula having 1 chloromethyl group per repeating monomer unit, 1 acrylate group per repeating monomer unit, and a number average molecular weight of 60,000; (b) 40 parts by weight of a polyarylene ether ketone resin within the above general formula but having no substituents thereon, with a number average molecular weight of 2,800 and a polydispersity ($M_w/M_n$) of about 2.5; and (c) 10 parts by weight of EPON 1001 adhesive resin (Shell Chemical Company, Houston, Tex.). This mixture has a degree of acryloylation of about 1.1 milliequivalents of acrylate per gram of resin solids and a weight average molecular weight of 34,000. Typically, when a photoresist is prepared from a mixture of an unsaturated ester substituted polymer of the above general formula and a second polymer having no unsaturated ester groups, a photoresist solution containing about 40 percent by weight polymer solids will contain from 10 to about 25 parts by weight of a polymer having unsaturated ester substituents and from about 10 to about 25 parts by weight of a polymer having no unsaturated ester substituents.

In still another embodiment of the present invention, the second component is a reactive diluent. In some embodiments, the reactive diluent is a liquid, and can replace a solvent when the photopatternable polymer is too high in viscosity to be cured without solvents. In other embodiments, the reactive diluent is a solid. The reactive diluent has functional groups which are capable of polymerizing when the reactive diluent is exposed to actinic radiation at an energy or wavelength level which is capable of inducing crosslinking or chain extension in the photopatternable polymer. Reactive diluents preferably are monomeric or oligomeric, and include (but are not limited to)

mono-, di-, tri-, and multi-functional unsaturated ester monomers and the like. Examples of suitable reactive diluents include monoacrylates, such as cyclohexyl acrylate, 2-ethoxy ethyl acrylate, 2-methoxy ethyl acrylate, 2(2-ethoxyethoxy) ethyl acrylate, stearyl acrylate, tetrahydrofurfuryl acrylate, octyl acrylate, lauryl acrylate, behenyl acrylate, 2-phenoxy ethyl acrylate, tertiary butyl acrylate, glycidyl acrylate, isodecyl acrylate, benzyl acrylate, hexyl acrylate, isooctyl acrylate, isobornyl acrylate, butanediol monoacrylate, ethoxylated phenol monoacrylate, oxyethylated phenol acrylate, monomethoxy hexanediol acrylate, β-carboxy ethyl acrylate, dicyclopentyl acrylate, carbonyl acrylate, octyl decyl acrylate, ethoxylated nonylphenol acrylate, hydroxyethyl acrylate, hydroxyethyl methacrylate, and the like, diacrylates, such as 1,3-butylene glycol diacrylate, 1,4-butanediol diacrylate, diethylene glycol diacrylate, 1,6-hexanediol diacrylate, tetraethylene glycol diacrylate, triethylene glycol diacrylate, tripropylene glycol diacrylate, polybutanediol diacrylate, polyethylene glycol diacrylate, propoxylated neopentyl glycol diacrylate, ethoxylated neopentyl glycol diacrylate, polybutadiene diacrylate, and the like, polyacrylates, such as trimethylol propane triacrylate, pentaerythritol tetraacrylate, pentaerythritol triacrylate, dipentaerythritol pentaacrylate, glycerol propoxy triacrylate, tris(2-hydroxyethyl) isocyanurate triacrylate, pentaacrylate ester, and the like, epoxy acrylates, polyester acrylates, polyether polyol acrylates, urethane acrylates, amine acrylates, acrylic acrylates, and the like. Mixtures of two or more materials can also be employed as the reactive diluent. Suitable reactive diluents are commercially available from, for example, Sartomer Co., inc., Henkel Corp., Radcure Specialties, and the like. When the second component is a reactive diluent, typically, the first and second components are present in relative amounts of from about 5 to about 50 percent by weight reactive diluent (second component) and from about 50 to about 95 percent by weight polymer (first component), and preferably in relative amounts of from about 10 to about 20 percent by weight reactive diluent (second component) and from about 80 to about 90 percent by weight polymer (first component), although the relative amounts can be outside these ranges.

The blend containing the first and second components typically has a weight average molecular weight of from about 10,000 to about 50,000, preferably from about 10,000 to about 35,000, and more preferably from about 10,000 to about 25,000, although the weight average molecular weight of the blend can be outside these ranges. The blend containing the first and second components typically has a degree of photosensitivity-imparting-group substitution of from about 0.25 to about 2 milliequivalents of photosensitivity-imparting group per gram of mixture, preferably from about 0.8 to about 1.4 milliequivalents per gram of mixture, although the degree of substitution can be outside these ranges.

If desired, to reduce the amount of residual halogen in a photoresist or other composition containing the polymers of the present invention, thereby also reducing or eliminating the generation of hydrohalic acid during a subsequent thermal curing step, any residual halogen atoms or haloalkyl groups on the photopatternable polymer can be converted to methoxy groups, hydroxide groups, acetoxy groups, amine groups, or the like by any desired process, including those processes disclosed hereinabove, those disclosed in, for example, British Patent 863,702, Chem Abstr. 55, 18667b (1961), and other publications previously incorporated herein by reference, and the like.

The photopatternable polymer can be cured by uniform exposure to actinic radiation at wavelengths and/or energy levels capable of causing crosslinking or chain extension of the polymer through the photosensitivity-imparting groups. Alternatively, the photopatternable polymer is developed by imagewise exposure of the material to radiation at a wavelength and/or at an energy level to which the photosensitivity-imparting groups are sensitive. Typically, a photoresist composition will contain the photopatternable polymer, an optional solvent for the photopatternable polymer, an optional sensitizer, and an optional photoinitiator. Solvents may be particularly desirable when the uncrosslinked photopatternable polymer has a high $T_g$. The solvent and photopattemable polymer typically are present in relative amounts of from 0 to about 99 percent by weight solvent and from about 1 to 100 percent polymer, preferably are present in relative amounts of from about 20 to about 60 percent by weight solvent and from about 40 to about 80 percent by weight polymer, and more preferably are present in relative amounts of from about 30 to about 60 percent by weight solvent and from about 40 to about 70 percent by weight polymer, although the relative amounts can be outside these ranges.

Sensitizers absorb light energy and facilitate the transfer of energy to unsaturated bonds which can then react to crosslink or chain extend the resin. Sensitizers frequently expand the useful energy wavelength range for photoexposure, and typically are aromatic light absorbing chromophores. Sensitizers can also lead to the formation of photoinitiators, which can be free radical or ionic. When present, the optional sensitizer and the photopatternable polymer typically are present in relative amounts of from about 0.1 to about 20 percent by weight sensitizer and from about 80 to about 99.9 percent by weight photopatternable polymer, and preferably are present in relative amounts of from about 1 to about 10 percent by weight sensitizer and from about 90 to about 99 percent by weight photopatternable polymer, although the relative amounts can be outside these ranges.

Photoinitiators generally generate ions or free radicals which initiate polymerization upon exposure to actinic radiation. When present, the optional photoinitiator and the photopatternable polymer typically are present in relative amounts of from about 0.1 to about 20 percent by weight photoinitiator and from about 80 to about 99.9 percent by weight photopatternable polymer, and preferably are present in relative amounts of from about 1 to about 10 percent by weight photoinitiator and from about 90 to about 99 percent by weight photopatternable polymer, although the relative amounts can be outside these ranges.

A single material can also function as both a sensitizer and a photoinitiator.

Examples of specific sensitizers and photoinitiators include Michler's ketone (Aldrich Chemical Co.), Darocure 1173, Darocure 4265, Irgacure 184, Irgacure 261, and Irgacure 907 (available from Ciba-Geigy, Ardsley, N.Y.), and mixtures thereof. Further background material on initiators is disclosed in, for example, Ober et al., *J. M. S.—Pure Appl. Chem.*, A30 (12), 877–897 (1993); G. E. Green, B. P. Stark, and S. A. Zahir, "Photocrosslinkable Resin Systems," *J. Macro. Sci.—Revs. Macro. Chem.*, C21(2), 187 (1981); H. F. Gruber, "Photoinitiators for Free Radical Polymerization," *Prog. Polym. Sci.*, Vol. 17, 953 (1992); Johann G. Kloosterboer, "Network Formation by Chain Crosslinking Photopolymerization and Its Applications in Electronics," Advances in Polymer Science, 89, Springer-Verlag Berlin Heidelberg (1988); and "Diaryliodonium Salts as Thermal Initiators of Cationic Polymerization," J. V. Crivello, T. P. Lockhart, and J. L. Lee, *J. of Polymer Science:*

Polymer Chemistry Edition, 21, 97 (1983), the disclosures of each of which are totally incorporated herein by reference. Sensitizers are available from, for example, Aldrich Chemical Co., Milwaukee, Wis., and Pfaltz and Bauer, Waterberry, Conn. Benzophenone and its derivatives can function as photosensitizers. Triphenylsulfonium and diphenyl iodonium salts are examples of typical cationic photoinitiators.

Inhibitors may also optionally be present in the photoresist containing the photopatternable polymer. Examples of suitable inhibitors include MEHQ, a methyl ether of hydroquinone, of the formula

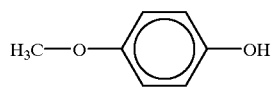

t-butylcatechol, of the formula

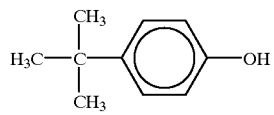

hydroquinone, of the formula

and the like, the inhibitor typically present in an amount of from about 500 to about 1,500 parts per million by weight of a photoresist solution containing about 40 percent by weight polymer solids, although the amount can be outside this range.

While not being limited to any particular theory, it is believed that exposure to, for example, ultraviolet radiation generally leads to crosslinking or chain extension at the "long" bond sites as shown below for the unsaturated ester-substituted polymer having, for example, acryloyl functional groups, wherein the ethylenic linkage in the acryloyl group is opened to form the link:

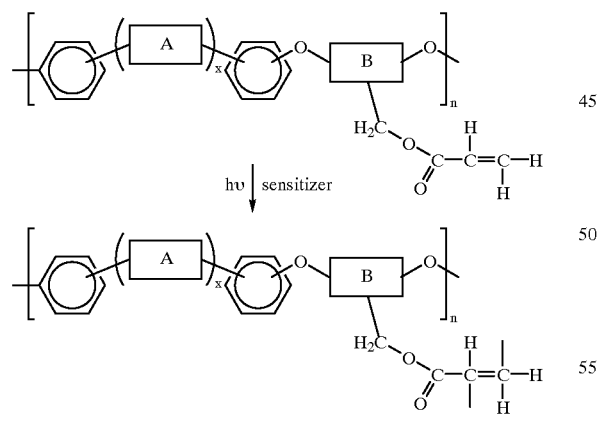

An analogous opening of the ethylenic linkage occurs for other unsaturated groups. The alkylcarboxymethylene and ether substituted polymers are curable by exposure to ultraviolet light, preferably in the presence of heat and one or more cationic initiators, such as triarylsulfonium salts, diaryliodonium salts, and other initiators as disclosed in, for example, Ober et al., *J.M.S.—Pure Appl. Chem.*, A30 (12), 877–897 (1993); G. E. Green, B. P. Stark, and S. A. Zahir, "Photocrosslinkable Resin Systems," *J. Macro. Sci.—Revs.*

*Macro. Chem.,* C21(2), 187 (1981); H. F. Gruber, "Photoinitiators for Free Radical Polymerization," *Prog. Polym. Sci.,* Vol. 17, 953 (1992); Johann G. Kloosterboer, "Network Formation by Chain Crosslinking Photopolymerization and Its Applications in Electronics," *Advances in Polymer Science,* 89, Springer-Verlag Berlin Heidelberg (1988); and "Diaryliodonium Salts as Thermal Initiators of Cationic Polymerization," J. V. Crivello, T. P. Lockhart, and J. L. Lee, *J. of Polymer Science: Polymer Chemistry Edition,* 21, 97 (1983), the disclosures of each of which are totally incorporated herein by reference. While not being limited to any particular theory, it is believed that the cationic mechanism is as shown below for the methylcarboxymethylene substituted polymer, wherein acetic acid is liberated and the "long" bond indicates the crosslinking or chain extension site:

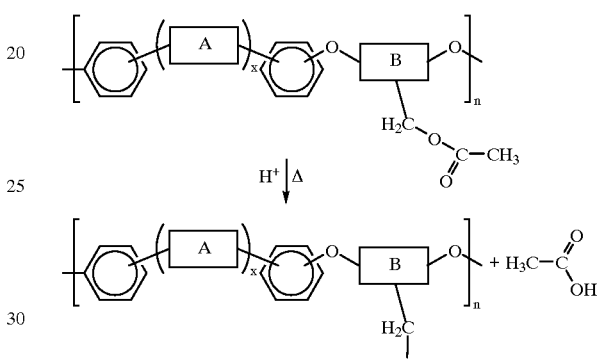

The reaction is similar for the ether substituted polymer, except that the corresponding alkanol is liberated.

For the allyl ether substituted polymer, while not being limited to any particular theory, it is believed that exposure to, for example, ultraviolet radiation generally opens the ethylenic linkage in the allyl ether groups and leads to crosslinking or chain extension at the "long" bond sites as shown below:

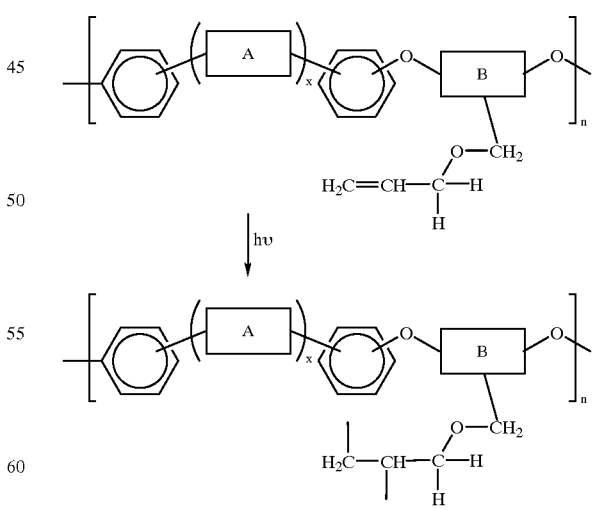

For the epoxy-substituted polymer, while not being limited to any particular theory, it is believed that exposure to, for example, ultraviolet radiation generally causes generation of acidic species by the initiator, followed by reaction of the acidic species with the epoxy groups to cause ring opening and crosslinking or chain extension at the "long" bond sites as shown below:

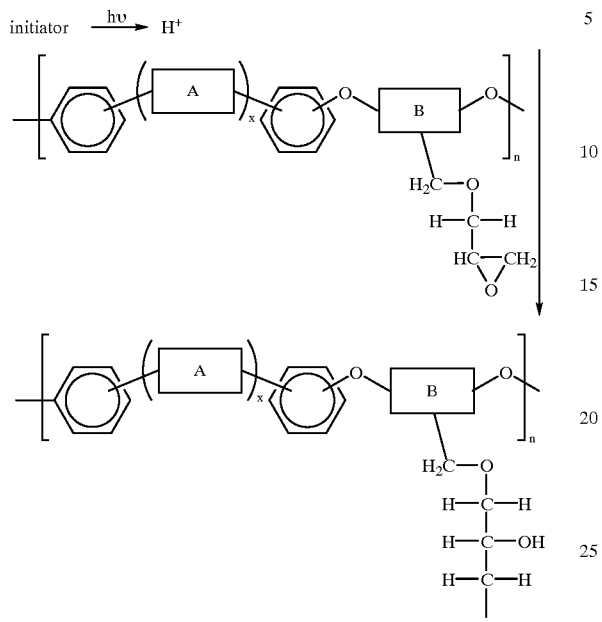

Amine curing of the epoxidized polymer is also possible, with curing occurring upon the application of heat. While not being limited to any particular theory, it is believed that the curing scheme in one example is as follows:

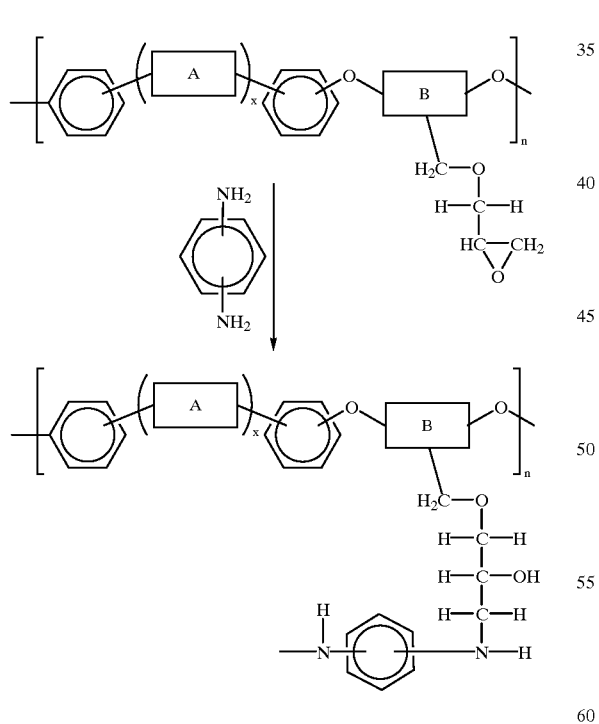

For the halomethylated polymer, while not being limited to any particular theory, it is believed that exposure to, for example, e-beam, deep ultraviolet, or x-ray radiation generally results in free radical cleavage of the halogen atom from the methyl group to form a benzyl radical. Crosslinking or chain extension then occurs at the "long" bond sites as illustrated below:

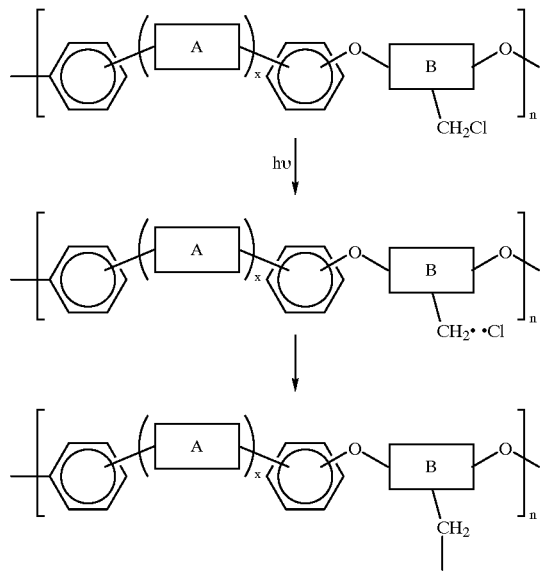

For the unsaturated ammonium, phosphonium, or ether substituted polymers of the present invention, while not being limited to any particular theory, it is believed that exposure to, for example, ultraviolet radiation generally opens the ethylenic linkage in the photosensitivity-imparting groups and leads to crosslinking or chain extension at the "long" bond sites as shown below:

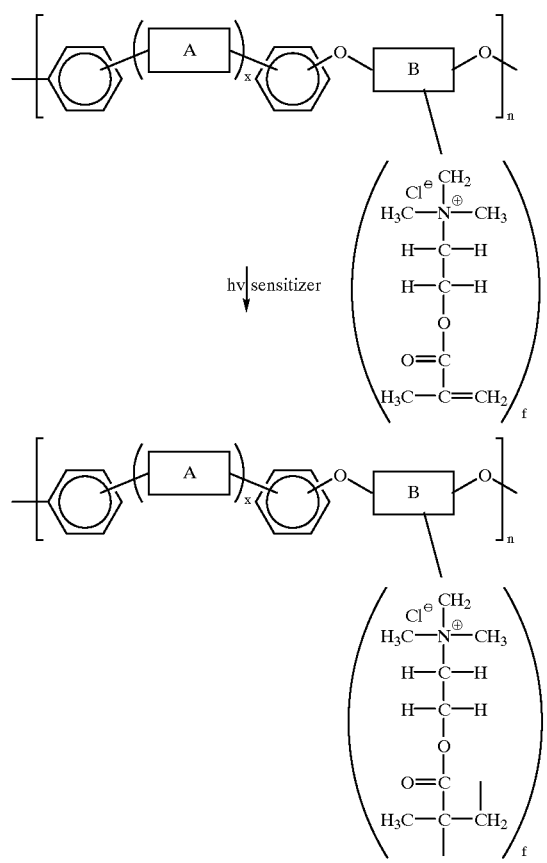

For the hydroxyalkylated, haloalkylated, and allyl-substituted polymers of the present invention, one specific example of a class of suitable sensitizers or initiators is that of bis(azides), of the general formula

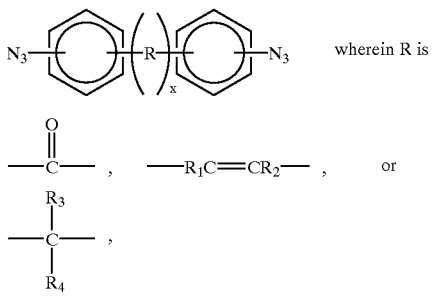 wherein R is wherein $R_1$, $R_2$, $R_3$, and $R_4$ each, independently of the others, is a hydrogen atom, an alkyl group, including saturated, unsaturated, and cyclic alkyl groups, preferably with from 1 to about 30 carbon atoms, and more preferably with from 1 to about 6 carbon atoms, a substituted alkyl group, an aryl group, preferably with from 6 to about 18 carbon atoms, and more preferably with about 6 carbon atoms, a substituted aryl group, an arylalkyl group, preferably with from 7 to about 48 carbon atoms, and more preferably with from about 7 to about 8 carbon atoms, or a substituted arylalkyl group, and x is 0 or 1, wherein the substituents on the substituted alkyl, aryl, and aryl groups can be (but are not limited to) alkyl groups, including saturated, unsaturated, linear, branched, and cyclic alkyl groups, preferably with from 1 to about 6 carbon atoms, substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, acyl groups, mixtures thereof, and azide groups, mixtures thereof, and the like, wherein any two or more substituents can be joined together to form a ring. Examples of suitable bis(azides) include 4,4'-diazidostilbene, of the formula

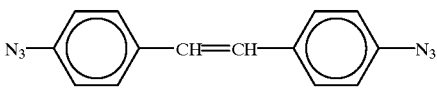

4,4'-diazidobenzophenone, of the formula

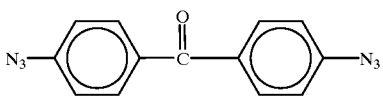

2,6-di-(4'-azidobenzal)-4-methylcyclohexanone, of the formula

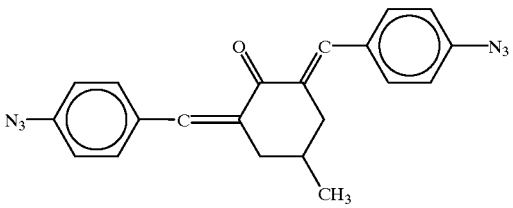

4,4'-diazidobenzalacetone, of the formula

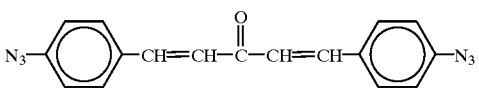

and the like. While not being limited to any particular theory, it is believed that exposure to for example, ultraviolet radiation enables curing, as illustrated below for the hydroxymethylated polymer:

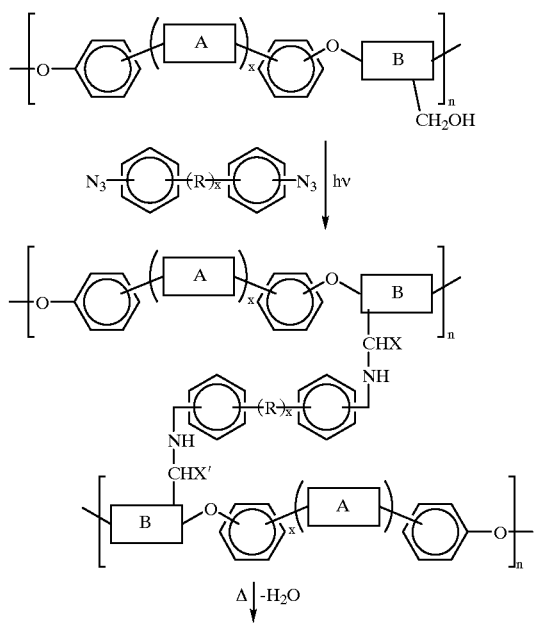

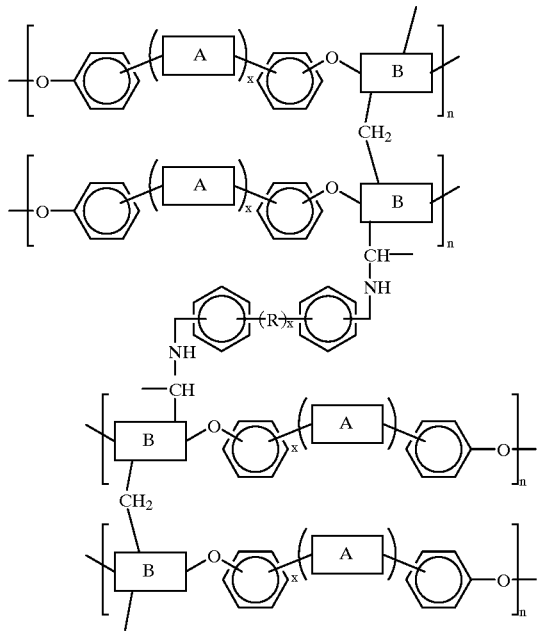

wherein X and X' each, independently of the other, is —H or —OH (or —H or a halogen atom in the case of the haloalkylated polymer). Similarly, for the allyl-substituted polymer, it is believed that the curing reaction scheme is as follows:

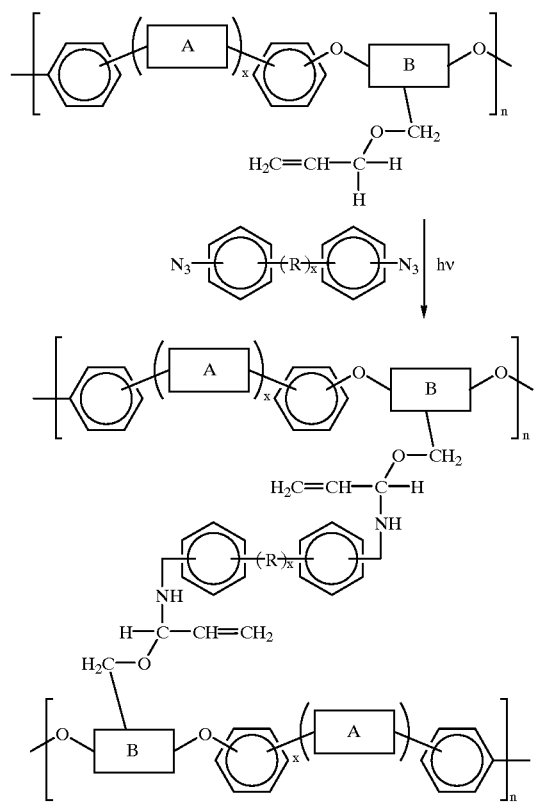

Alternatively, a hydroxyalkylated polymer can be further reacted to render it more photosensitive. For example, a hydroxymethylated polymer of the formula

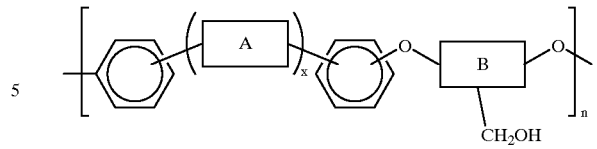

can react with isocyanato-ethyl methacrylate, of the formula

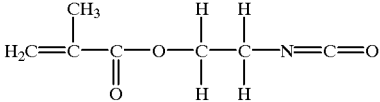

(available from Polysciences, Warrington, Pa.) to form a photoactive polymer of the formula

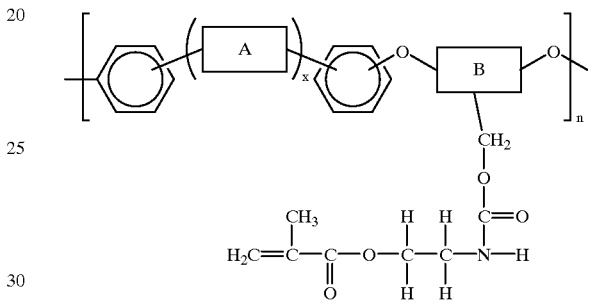

This reaction can be carried out in methylene chloride at 25° C. with 1 part by weight polymer, 1 part by weight isocyanato-ethyl methacrylate, and 50 parts by weight methylene chloride. Typical reaction temperatures are from about 0 to about 50° C., with 10 to 25° C. preferred. Typical reaction times are between about 1 and about 24 hours, with about 16 hours preferred. During exposure to, for example, ultraviolet radiation, the ethylenic bond opens and crosslinking or chain extension occurs at that site.

While not being limited to any particular theory, it is believed that thermal cure can also lead to extraction of the hydroxy group and to crosslinking or chain extension at the "long" bond sites as shown below:

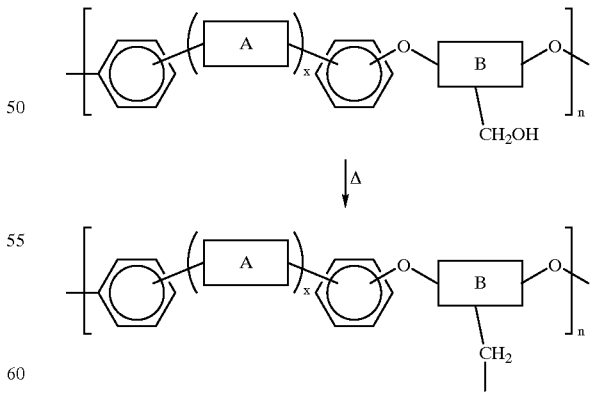

If desired, the hydroxyalkylated polymer can be further reacted with an unsaturated acid chloride to substitute some or all of the hydroxyalkyl groups with photosensitive groups such as acryloyl or methacryloyl groups or other unsaturated ester groups. The reaction can take place in the presence of triethylamine, which acts as a hydrochloric acid scavenger to form NEt₃H⁺Cl⁻. Examples of suitable reactants include acryloyl chloride, methacryloyl chloride, cinnamoyl chloride, crotonoyl chloride, ethacryloyl chloride, oleyl chloride, linoleyl chloride, maleoyl chloride, fumaroyl chloride, itaconoyl chloride, citraconoyl chloride, acid chlorides of phenylmaleic acid, 3-hexene-1,6-dicarboxylic acid, and the like. Examples of suitable solvents include 1,1,2,2-tetrachloroethane, methylene chloride, and the like. Typically, the reactants are present in relative amounts with respect to each other by weight of about 1 part hydroxyalkylated polymer, about 1 part triethylamine, about 30 parts solvent, and about 1 part acid chloride.

Some or all of the hydroxyalkyl groups can be replaced with unsaturated ester substituents. Longer reaction times generally lead to greater degrees of substitution of hydroxyalkyl groups with unsaturated ester substituents.

Typical reaction temperatures are from about 0 to about 50° C., and preferably from about 10 to about 25° C., although the temperature can be outside this range. Typical reaction times are from about 1 to about 24 hours, and preferably from about 5 to about 16 hours, although the time can be outside these ranges.

The general reaction scheme, illustrated below for the hydroxymethylated polymer, is as follows:

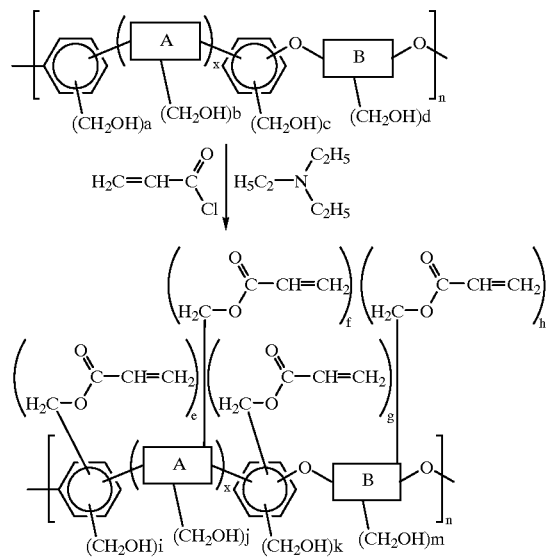

wherein a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units. In the corresponding reaction with methacryloyl chloride, the

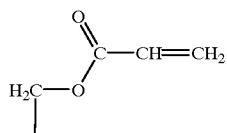

groups are replaced with

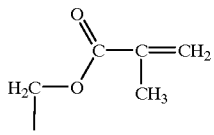

groups.

Higher degrees of hydroxyalkylation generally lead to higher degrees of substitution with unsaturated ester groups and thereby to greater photosensitivity of the polymer. Different degrees of substitution may be desirable for different applications. Too high a degree of substitution may lead to excessive sensitivity, resulting in crosslinking or chain extension of both exposed and unexposed polymer material when the material is exposed imagewise to activating radiation, whereas too low a degree of substitution may be undesirable because of resulting unnecessarily long exposure times or unnecessarily high exposure energies. For applications wherein the photopatternable polymer is to be used as a layer in a thermal ink jet printhead, the degree of acryloylation (i.e., the average number of unsaturated ester groups per monomer repeat unit) preferably is from about 0.5 to about 1.2, and more preferably from about 0.65 to about 0.8, although the degree of substitution can be outside these ranges for ink jet printhead applications. Optimum amounts of unsaturated ester substitution are from about 0.8 to about 1.3 milliequivalents of unsaturated ester group per gram of resin.

Some or all of the hydroxyalkyl groups can be replaced with unsaturated ester substituents. Longer reaction times generally lead to greater degrees of substitution of hydroxyalkyl groups with unsaturated ester substituents.

Many of the photosensitivity-imparting groups which are indicated above as being capable of enabling crosslinking or chain extension of the polymer upon exposure to actinic radiation can also enable crosslinking or chain extension of the polymer upon exposure to elevated temperatures; thus the polymers of the present invention con also, if desired, be used in applications wherein thermal curing is employed.

In all of the above reactions and substitutions illustrated above for the polymer of the formula

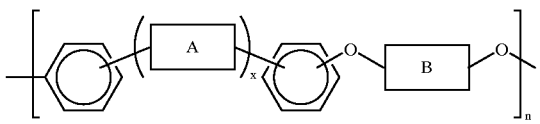

it is to be understood that analogous reactions and substitutions will occur for the polymer of the formula

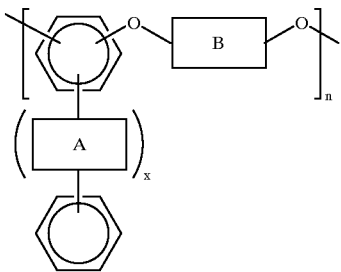

In another preferred embodiment of the present invention, a photoresist is prepared which comprises a mixture of the polymer substituted with photoactive groups, such as unsaturated ester groups, and the halomethylated polymer. The halomethylated polymer, which can be used as an intermediate in the synthesis of the photosensitivity-imparting group substituted polymer, also functions as an accelerator which generates free radicals upon exposure to ultraviolet light, and thus can be used instead of or in addition to other accelerators or sensitizers, such as Michler's ketone or the like. In addition, the substitution of the halomethylated precursor with the photosensitivity-imparting groups can be controlled so as to yield a mixture containing a known proportion of the holomethyl residue. Accordingly, a photoresist can be prepared of the photosensitivity-imparting group substituted polymer without the need to add an additional initiator to the precursor material. Typically, the halomethylated polymer (which typically is substituted to a degree of from about 0.25 to about 2.0 halomethyl groups per monomer repeat unit, preferably from about 1 to about 2 halomethyl groups per monomer repeat unit, and more preferably from about 1.5 to about 2 halomethyl groups per monomer repeat unit) and the photosensitivity-imparting group substituted polymer (which typically is substituted to a degree of from about 0.25 to about 2.0 photosensitivity-imparting groups per monomer repeat unit, preferably from about 0.5 to about 1 photosensitivity-imparting group per monomer repeat unit, and more preferably from about 0.7 to about 0.8 photosensitivity-imparting group per monomer repeat unit) are present in relative amounts such that the degree of substitution when measured for the blended composition is from about 0.25 to about 1.5, preferably from about 0.5 to about 0.8, and more preferably about 0.75 photosensitivity-imparting groups per monomer repeat unit, and from about 0.25 to about 2.25, preferably from about 0.75 to about 2, and more preferably from about 0.75 to about 1 halomethyl group per monomer repeat unit, although the relative amounts can be outside these ranges. Similarly, a polymer substituted with both halomethyl and photosensitivity-imparting groups can function as an accelerator. In this instance, the accelerating polymer typically exhibits a degree of substitution of from about 0.25 to about 1.5, preferably from about 0.5 to about 0.8, and more preferably about 0.75 photosensitivity-imparting groups per monomer repeat unit, and from about 0.25 to about 2.25, preferably from about 0.75 to about 2, and more preferably from about 0.75 to about 1 halomethyl group per monomer repeat unit, although the relative amounts can be outside these ranges.

Particularly preferred as reaction accelerators are polymers of the formula

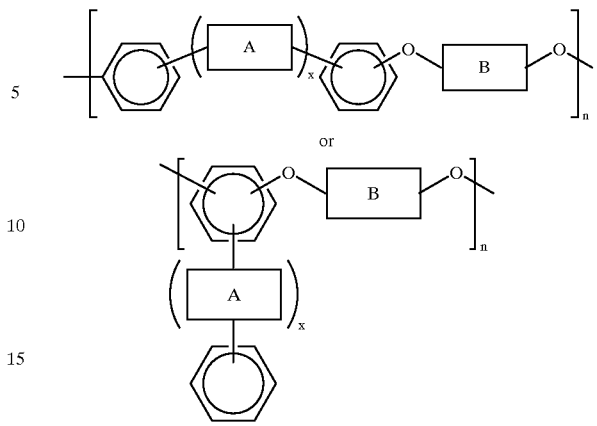

wherein A is selected so that the monomeric unit contains a benzophenone moiety and x and B are as defined hereinabove, said polymer having at least one halomethyl substituent per monomer repeat unit in at least some of the monomer repeat units of the polymer, said polymer having at least one photosensitivity-imparting group per monomer repeat unit in at least some of the monomer repeat units of the polymer. Examples of suitable A groups for this embodiment include

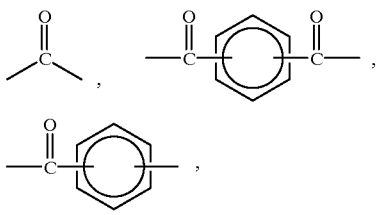

and the like. While not being limited to any particular theory, it is believed that in this embodiment, the presence of the benzophenone moiety acts as a photoabsorbing element in the polymer backbone and contributes to the photoinitiating characteristics of the polymer. In this embodiment, advantages include high sensitivity, high developability, and high aspect ratios in thick films.

When the holomethylated polymer is present in relatively high concentrations in a photoresist with respect to the amount of photosensitivity-imparting group substituted polymer, the halomethylated material can also act as an ultraviolet polymerization inhibitor.

If desired, to reduce the amount of residual halogen in a photoresist or other composition containing the polymers of the present invention, thereby also reducing or eliminating the generation of hydrohalic acid during a subsequent thermal curing step, any residual haloalkyl groups on the photopatternable polymer can be converted to methoxy groups, hydroxide groups, acetoxy groups, amine groups, or the like by any desired process, including those processes disclosed hereinabove, those disclosed in, for example, British Patent 863,702, Chem Abstr. 55, 18667b (1961), and other publications previously incorporated herein by reference, and the like.

Photopatternable polymers prepared by the process of the present invention can be used as components in ink jet printheads. The printheads of the present invention can be of any suitable configuration. An example of a suitable configuration, suitable in this instance for thermal ink jet printing, is illustrated schematically in FIG. 1, which depicts an enlarged, schematic isometric view of the front face 29 of a printhead 10 showing the array of droplet emitting nozzles 27. Referring also to FIG. 2, discussed later, the lower electrically insulating substrate or heating element plate 28 has the heating elements 34 and addressing electrodes 33 patterned on surface 30 thereof, while the upper substrate or channel plate 31 has parallel grooves 20 which extend in one direction and penetrate through the upper substrate front face edge 29. The other end of grooves 20 terminate at slanted wall 21, the floor 41 of the internal recess 24 which is used as the ink supply manifold for the capillary filled ink channels 20, has an opening 25 therethrough for use as an ink fill hole. The surface of the channel plate with the grooves are aligned and bonded to the heater plate 28, so that a respective one of the plurality of heating elements 34 is positioned in each channel, formed by the grooves and the lower substrate or heater plate. Ink enters the manifold formed by the recess 24 and the lower substrate 28 through the fill hole 25 and by capillary action, fills the channels 20 by flowing through an elongated recess 38 formed in the thick film insulative layer 18. The ink at each nozzle forms a meniscus, the surface tension of which prevents the ink from weeping therefrom. The addressing electrodes 33 on the lower substrate or channel plate 28 terminate at terminals 32. The upper substrate or channel plate 31 is smaller than that of the lower substrate in order that the electrode terminals 32 are exposed and available for wire bonding to the electrodes on the daughter board 19, on which the printhead 10 is permanently mounted. Layer 18 is a thick film passivation layer, discussed later, sandwiched between the upper and lower substrates. This layer is etched to expose the heating elements, thus placing them in a pit, and is etched to form the elongated recess to enable ink flow between the manifold 24 and the ink channels 20. In addition, the thick film insulative layer is etched to expose the electrode terminals.

Figure 2:
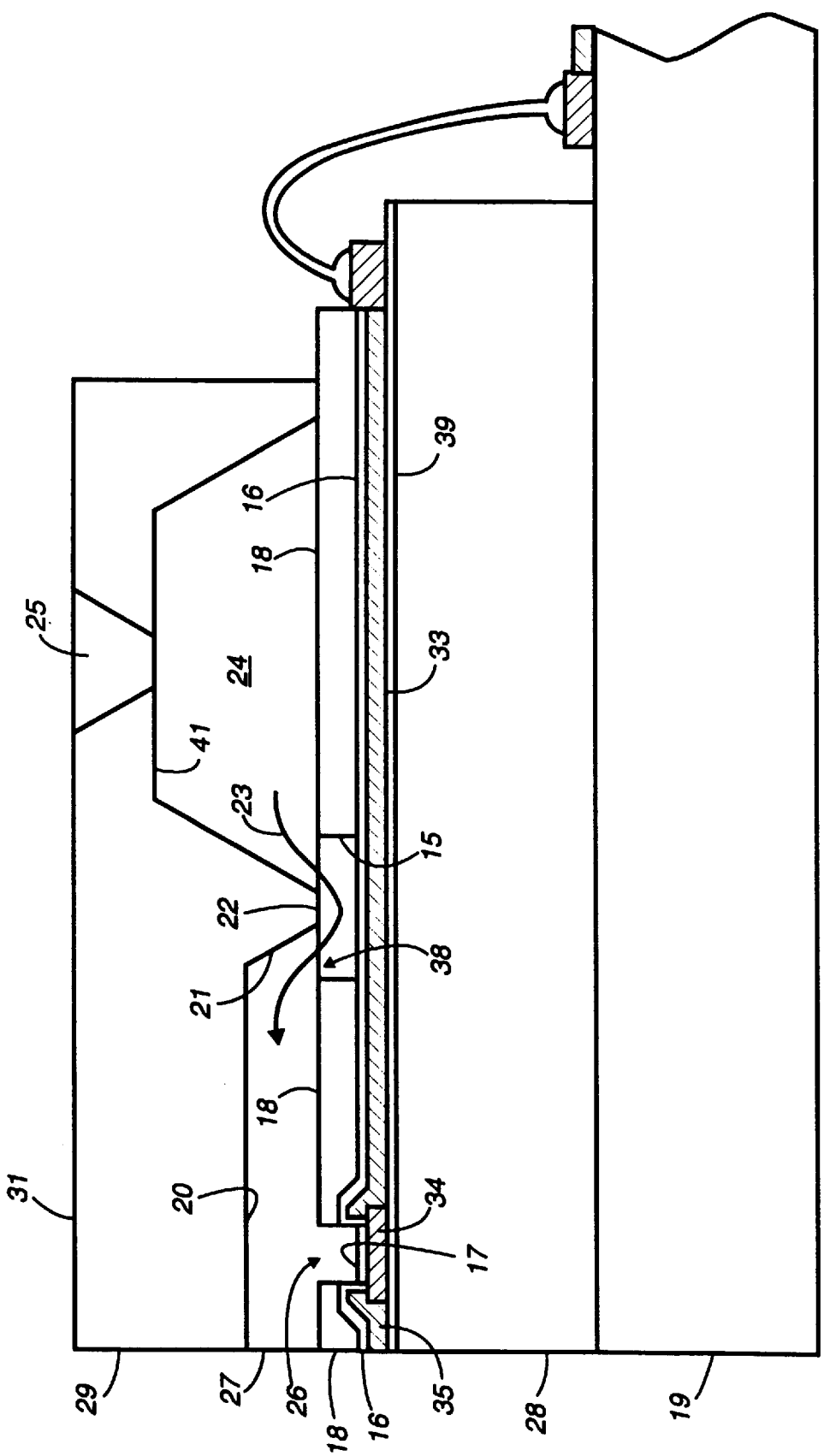
FIG. 2 is an enlarged cross-sectional view of FIG. 1 as viewed along the line 2—2 thereof and showing the electrode passivation and ink flow path between the manifold and the ink channels.

A cross sectional view of FIG. 1 is taken along view line 2—2 through one channel and shown as FIG. 2 to show how the ink flows from the manifold 24 and around the end 21 of the groove 20 as depicted by arrow 23. As is disclosed in U.S. Pat. Nos. 4,638,337, 4,601,777, and U.S. Pat. No. Re. 32,572, the disclosures of each of which are totally incorporated herein by reference, a plurality of sets of bubble generating heating elements 34 and their addressing electrodes 33 can be patterned on the polished surface of a single side polished (100) silicon wafer. Prior to patterning, the multiple sets of printhead electrodes 33, the resistive material that serves as the heating elements 34, and the common return 35, the polished surface of the wafer is coated with an underglaze layer 39 such as silicon dioxide, having a typical thickness of from about 5,000 Angstroms to about 2 microns, although the thickness can be outside this range. The resistive material can be a doped polycrystalline silicon, which can be deposited by chemical vapor deposition (CVD) or any other well known resistive material such as zirconium boride ($ZrB_2$). The common return and the addressing electrodes are typically aluminum leads deposited on the underglaze and over the edges of the heating elements. The common return ends or terminals 37 and addressing electrode terminals 32 are positioned at predetermined locations to allow clearance for wire bonding to the electrodes (not shown) of the daughter board 19, after the channel plate 31 is attached to make a printhead. The common return 35 and the addressing electrodes 33 are deposited to a thickness typically of from about 0.5 to about 3 microns, although the thickness can be outside this range, with the preferred thickness being 1.5 microns.

If polysilicon heating elements are used, they may be subsequently oxidized in steam or oxygen at a relatively high temperature, typically about 1,100° C. although the temperature can be above or below this value, for a period of time typically of from about 50 to about 80 minutes, although the time period can be outside this range, prior to the deposition of the aluminum leads, in order to convert a small portion of the polysilicon to $SiO_2$. In such cases, the heating elements are thermally oxidized to achieve an overglaze (not shown) of $SiO_2$ with a thickness typically of from about 500 Angstroms to about 1 micron, although the thickness can be outside this range, which has good integrity with substantially no pinholes.

In one embodiment, polysilicon heating elements are used and an optional silicon dioxide thermal oxide layer 17 is grown from the polysilicon in high temperature steam. The thermal oxide layer is typically grown to a thickness of from about 0.5 to about 1 micron, although the thickness can be outside this range, to protect and insulate the heating elements from the conductive ink. The thermal oxide is removed at the edges of the polysilicon heating elements for attachment of the addressing electrodes and common return, which are then patterned and deposited. If a resistive material such as zirconium boride is used for the heating elements, then other suitable well known insulative materials can be used for the protective layer thereover. Before electrode passivation, a tantalum (Ta) layer (not shown) can be optionally deposited, typically to a thickness of about 1 micron, although the thickness can be above or below this value, on the heating element protective layer 17 for added protection thereof against the cavitational forces generated by the collapsing ink vapor bubbles during printhead operation. The tantalum layer is etched off all but the protective layer 17 directly over the heating elements using, for example, $CF_4/O_2$ plasma etching. For polysilicon heating elements, the aluminum common return and addressing electrodes typically are deposited on the underglaze layer and over the opposing edges of the polysilicon heating elements which have been cleared of oxide for the attachment of the common return and electrodes.

For electrode passivation, a film 16 is deposited over the entire wafer surface, including the plurality of sets of heating elements and addressing electrodes. The passivation film 16 provides an ion barrier which will protect the exposed electrodes from the ink. Examples of suitable ion barrier materials for passivation film 16 include polyimide, plasma nitride, phosphorous doped silicon dioxide, materials disclosed herein as being suitable for insulative layer 18, and the like, as well as any combinations thereof. An effective ion barrier layer is generally achieved when its thickness is from about 1000 Angstroms to about 10 microns, although the thickness can be outside this range. In 300 dpi printheads, passivation layer 16 preferably has a thickness of about 3 microns, although the thickness can be above or below this value. In 600 dpi printheads, the thickness of passivation layer 16 preferably is such that the combined thickness of layer 16 and layer 18 is about 25 microns, although the thickness can be above or below this value. The passivation film or layer 16 is etched off of the terminal ends of the common return and addressing electrodes for wire bonding later with the daughter board electrodes. This etching of the silicon dioxide film can be by either the wet or dry etching method. Alternatively, the electrode passivation can be by plasma deposited silicon nitride ($Si_3 N_4$).

Next, a thick film type insulative layer 18, of a polymeric material discussed in further detail herein, is formed on the passivation layer 16, typically having a thickness of from about 10 to about 100 microns and preferably in the range of from about 25 to about 50 microns, although the thickness can be outside these ranges. Even more preferably, in 300 dpi printheads, layer 18 preferably has a thickness of about 30 microns, and in 600 dpi printheads, layer 18 is preferably has a thickness of from about 20 to about 22 microns, although other thicknesses can be employed. The insulative layer 18 is photolithographically processed to enable etching and removal of those portions of the layer 18 over each heating element (forming recesses 26 ), the elongated recess 38 for providing ink passage from the manifold 24 to the ink channels 20, and over each electrode terminal 32, 37. The elongated recess 38 is formed by the removal of this portion of the thick film layer 18. Thus, the passivation layer 16 alone protects the electrodes 33 from exposure to the ink in this elongated recess 38. Optionally, if desired, insulative layer 18 can be applied as a series of thin layers of either similar or different composition. Typically, a thin layer is deposited, photoexposed, partially cured, followed by deposition of the next thin layer, photoexposure, partial curing, and the like. The thin layers constituting thick film insulative layer 18 contain a polymer of the formula indicated hereinabove. In one embodiment of the present invention, a first thin layer is applied to contact layer 16, said first thin layer containing a mixture of a polymer of the formula indicated hereinabove and an epoxy polymer, followed by photoexposure, partial curing, and subsequent application of one or more successive thin layers containing a polymer of the formula indicated hereinabove.

Figure 3:
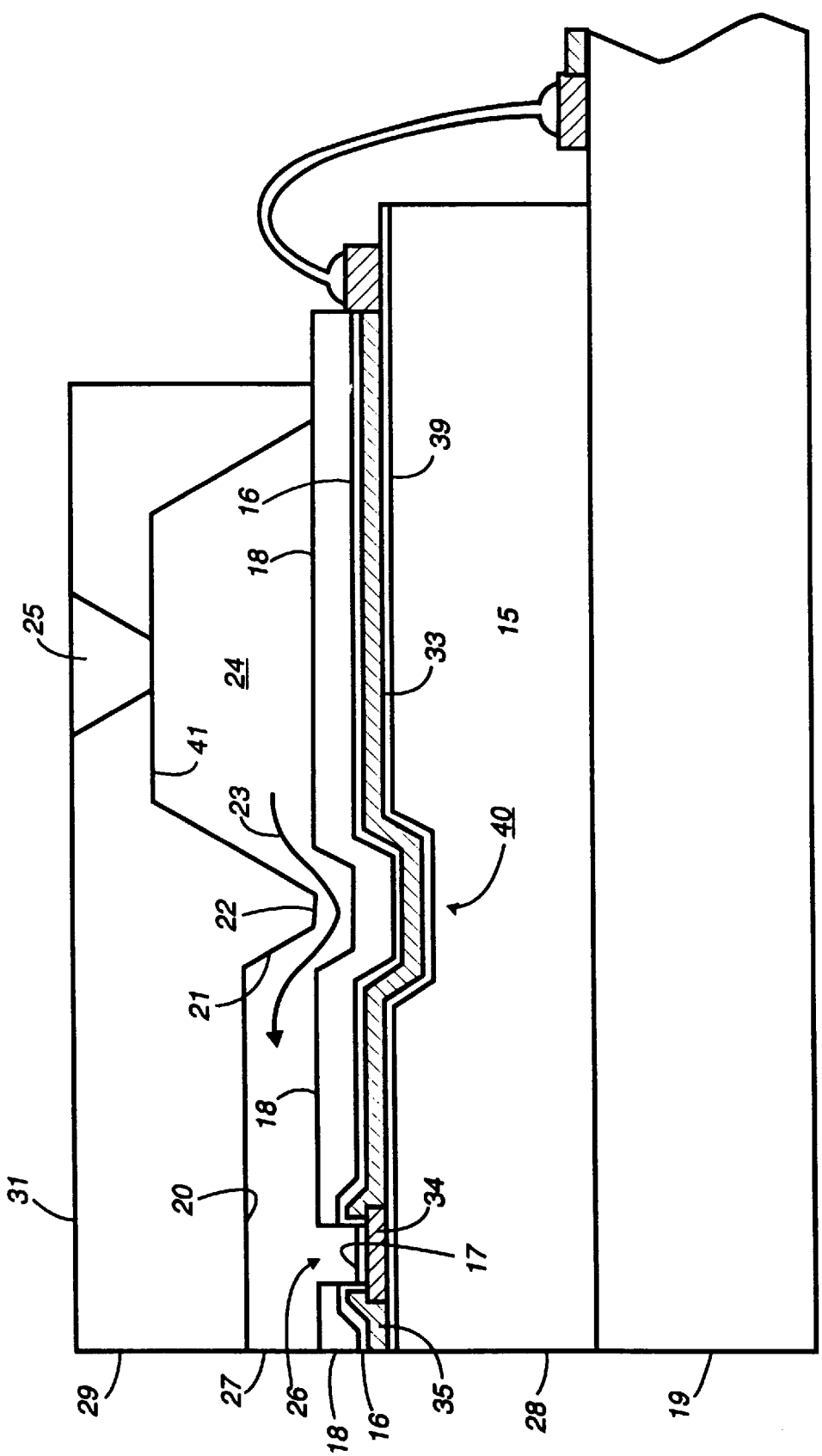
FIG. 3 is an enlarged cross-sectional view of an alternate embodiment of the printhead in FIG. 1 as viewed along the line 2—2 thereof.

FIG. 3 is a similar view to that of FIG. 2 with a shallow anisotropically etched groove 40 in the heater plate, which is silicon, prior to formation of the underglaze 39 and patterning of the heating elements 34, electrodes 33 and common return 35. This recess 40 permits the use of only the thick film insulative layer 18 and eliminates the need for the usual electrode passivating layer 16. Since the thick film layer 18 is impervious to water and relatively thick (typically from about 20 to about 40 microns, although the thickness can be outside this range), contamination introduced into the circuitry will be much less than with only the relatively thin passivation layer 16 well known in the art. The heater plate is a fairly hostile environment for integrated circuits. Commercial ink generally entails a low attention to purity. As a result, the active part of the heater plate will be at elevated temperature adjacent to a contaminated aqueous ink solution which undoubtedly abounds with mobile ions. In addition, it is generally desirable to run the heater plate at a voltage of from about 30 to about 50 volts, so that there will be a substantial field present. Thus, the thick film insulative layer 18 provides improved protection for the active devices and provides improved protection, resulting in longer operating lifetime for the heater plate.

When a plurality of lower substrates 28 are produced from a single silicon wafer, at a convenient point after the underglaze is deposited, at least two alignment markings (not shown) preferably are photolithographically produced at predetermined locations on the lower substrates 28 which make up the silicon wafer. These alignment markings are used for alignment of the plurality of upper substrates 31 containing the ink channels. The surface of the single sided wafer containing the plurality of sets of heating elements is bonded to the surface of the wafer containing the plurality of ink channel containing upper substrates subsequent to alignment.

As disclosed in U.S. Pat. No. 4,601,777 and 4,638,337, the disclosures of each of which are totally incorporated herein by reference, the channel plate is formed from a two side polished, (100) silicon wafer to produce a plurality of upper substrates 31 for the printhead. After the wafer is chemically cleaned, a pyrolytic CVD silicon nitride layer (not shown) is deposited on both sides. Using conventional photolithography, a via for fill hole 25 for each of the plurality of channel plates 31 and at least two vias for alignment openings (not shown) at predetermined locations are printed on ore wafer side. The silicon nitride is plasma etched off of the patterned vias representing the fill holes and alignment openings. A potassium hydroxide (KOH) anisotropic etch can be used to etch the fill holes and alignment openings. In this case, the [111 ] planes of the (100) wafer typically make an angle of about 54.7 degrees with the surface of the wafer. The fill holes are small square surface patterns, generally of about 20 mils (500 microns) per side, although the dimensions can be above or below this value, and the alignment openings are from about 60 to about 80 mils (1.5 to 3 millimeters) square, although the dimensions can be outside this range. Thus, the alignment openings are etched entirely through the 20 mil ( 0.5 millimeter) thick wafer, while the fill holes are etched to a terminating apex at about halfway through to three-quarters through the wafer. The relatively small square fill hole is invariant to further size increase with continued etching so that the etching of the alignment openings and fill holes are not significantly time constrained.

Next, the opposite side of the wafer is photolithographically patterned, using the previously etched alignment holes as a reference to form the relatively large rectangular recesses 24 and sets of elongated, parallel channel recesses that will eventually become the ink manifolds and channels of the printheads. The surface 22 of the wafer containing the manifold and channel recesses are portions of the original wafer surface (covered by a silicon nitride layer) on which an adhesive, such as a thermosetting epoxy, will be applied later for bonding it to the substrate containing the plurality of sets of heating elements. The adhesive is applied in a manner such that it does not run or spread into the grooves or other recesses. The alignment markings can be used with, for example, a vacuum chuck mask aligner to align the channel wafer on the heating element and addressing electrode wafer. The two wafers are accurately mated and can be tacked together by partial curing of the adhesive. Alternatively, the heating element and channel wafers can be given precisely diced edges and then manually or automatically aligned in a precision jig. Alignment can also be performed with an infrared aligner-bonder, with an infrared microscope using infrared opaque markings on each wafer to be aligned, or the like. The two wafers can then be cured in an oven or laminator to bond them together permanently. The channel wafer can then be milled to produce individual upper substrates. A final dicing cut, which produces end face 29, opens one end of the elongated groove 20 producing nozzles 27. The other ends of the channel groove 20 remain closed by end 21. However, the alignment and bonding of the channel plate to the heater plate places the ends 21 of channels 20 directly over elongated recess 38 in the thick film insulative layer 18 as shown in FIG. 2 or directly above the recess 40 as shown in FIG. 3 enabling the flow of ink into the channels from the manifold as depicted by arrows 23. The plurality of individual printheads produced by the final dicing are bonded to the daughter board and the printhead electrode terminals are wire bonded to the daughter board electrodes.

In one embodiment, a heater wafer with a phosphosilicate glass layer is spin coated with a solution of Z6020 adhesion promoter (0.01 weight percent in 95 parts methanol and 5 parts water, Dow Corning) at 3000 revolutions per minute for 10 seconds and dried at 100° C, for between 2 and 10 minutes. The wafer is then allowed to cool at 25° C. for 5 minutes before spin coating the photoresist onto the wafer at between 1,000 and 3,000 revolutions per minute for between 30 and 60 seconds. The photoresist solution is made by dissolving polyarylene ether ketone with 0.75 acryloyl groups and 0.75 chloromethyl groups per repeat unit and a weight average molecular weight of 25,000 in N-methylpyrrolidinone at 40 weight percent solids with Michler's ketone (1.2 parts ketone per every 10 parts of 40 weight percent solids polymer solution). The film is heated (soft baked) in an oven for between 10 and 15 minutes at 70° C. After cooling to 25° C. over 5 minutes, the film is covered with a mask and exposed to 365 nanometer ultraviolet light, amounting to between 150 and 1,500 millijoules per cm². The exposed wafer is then heated at 70° C. for 2 minutes post exposure bake, followed by cooling to 25° C. over 5 minutes. The film is developed with 60:40 chloroform/cyclohexanone developer, washed with 90:10 hexanes/cyclohexanone, and then dried at 70° C. for 2 minutes. A second developer/wash cycle is carried out if necessary to obtain a wafer with clean features. The processed wafer is transferred to an oven at 25° C., and the oven temperature is raised from 25 to 90° C. at 2° C. per minute. The temperature is maintained at 90 ° C. for 2 hours, and then increased to 260° C. at 2° C. per minute. The oven temperature is maintained at 260° C. for 2 hours and then the oven is turned off and the temperature is allowed to cool gradually to 25° C. When thermal cure of the photoresist films is carried out under inert atmosphere, such as nitrogen or one of the noble gases, such as argon, neon, krypton, xenon, or the like, there is markedly reduced oxidation of the developed film and improved thermal and hydrolytic stability of the resultant devices. Moreover, adhesion of developed photoresist film is improved to the underlying substrate. If a second layer is spin coated over the first layer, the heat cure of the first developed layer can be stopped between 80 and 260° C. before the second layer is spin coated onto the first layer. A second thicker layer is deposited by repeating the above procedure a second time. This process is intended to be a guide in that procedures can be outside the specified conditions depending on film thickness and photoresist molecular weight. Films at 30 microns have been developed with clean features at 600 dots per inch.

For best results with respect to well-resolved features and high aspect ratios, photoresist compositions of the present invention are free of particulates prior to coating onto substrates. In one preferred embodiment, the photoresist composition containing the photopatternable polymer is subjected to filtration through a 2 micron nylon filter cloth (available from Tetko). The photoresist solution is; filtered through the cloth under yellow light or in the dark as a solution containing from about 30 to about 60 percent by weight solids using compressed air (up to about 60 psi) and a pressure filtration funnel. No dilution of the photoresist solution is required, and concentrations of an inhibitor (such as, for example, MEHQ) can be as low as, for example, 500 parts per million or less by weight without affecting shelf life. No build in molecular weight of the photopatternable polymer is observed during this filtration process. While not being limited to any particular theory it is believed that in some instances, such as those when unsaturated ester groups are present on the photopolymerizable polymer, compressed air yields results superior to those obtainable with inert atmosphere because oxygen in the compressed air acts as an effective inhibitor for the free radical polymerization of unsaturated ster groups such as acrylates and methacrylates.

In a particularly preferred embodiment, the photopatternable polymer is admixed with an epoxy resin in relative amounts of from about 75 parts by weight photopatternable polymer and about 55 parts by weight epoxy resin to about 90 parts by weight photopatternable polymer and about 10 parts by weight epoxy resin. Examples of suitable epoxy resins include EPON 1001F, available from Shell Chemical Company, Houston, Tex., believed to be of the formula

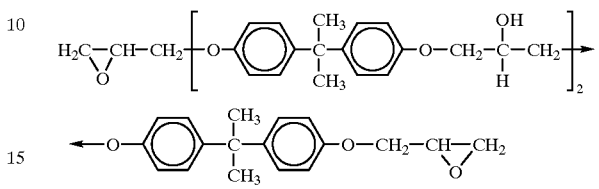

and the like, as well as mixtures thereof. Curing a gents such as the "Y" curative (meta-phenylenedimin e) and the like, as well as mixtures thereof, can be used to cure the epoxy resin at typical relative amounts of about 10 weight percent curative per gram of epoxy resin solids. Process conditions for the epoxy resin blended with the photopatternable polymer are generally similar to those used to process the photoresist without epoxy resin. Preferably, the epoxy or epoxy blend is selected so that its curing conditions are different from the conditions employed to apply, image, develop, and cure the photopatternable polymer. Selective stepwise curing allows development of the photoresist film before curing the epoxy resin to prevent unwanted epoxy residues on the device. Incorporation of the epoxy resin into the photopatternable polymer material improves the adhesion of the photopatternable layer to the heater plate. Subsequent to imaging and during cure of the photopatternable polymer, the epoxy reacts with the heater layer to form strong chemical bonds with that layer, improving adhesive strength and solvent resistance of the interface. The presence of the epoxy may also improve the hydrophilicity of the photopatternable polymer and thus may improve the wetting properties of the layer, thereby improving the refill characteristics of the printhead.

The printhead illustrated in FIGS. 1 through 3 constitutes a specific embodiment of the present invention. Any other suitable printhead configuration comprising ink-bearing channels terminating in nozzles on the printhead surface can also be employed with the materials disclosed herein to form a printhead of the present invention.

The present invention also encompasses printing processes with printheads according to the present invention. One embodiment of the present invention is directed to an ink jet printing process which comprises (1) preparing an ink jet printhead comprising a plurality of channels, wherein the channels are capable of being filled with ink from an ink supply and wherein the channels terminate in nozzles on one surface of the printhead, said preparation being according to the process of the present invention; (2) filling the channels with an ink; and (3) causing droplets of ink to be expelled from the nozzles onto a receiver sheet in an image pattern. A specific embodiment of this process is directed to a thermal ink jet printing process, wherein the droplets of ink are caused to be expelled from the nozzles by heating selected channels in an image pattern. The droplets can be expelled onto any suitable receiver sheet, such as fabric, plain paper such as Xerox® 4024 or 4010, coated papers, transparency materials, or the like.

Specific embodiments of the invention will now be described in detail. These examples are intended to be illustrative, and the invention is not limited to the materials, conditions, or process parameters set forth in these embodiments. All parts and percentage are by weight unless otherwise indicated.

EXAMPLE I

A first acryloylated polyarylene ether ketone resin having 1 acrylate group per repeating monomer unit and one chloromethyl group per repeating monomer unit and having a weight average molecular weight of about 60,000 was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 50 grams), bis-phenol A (Aldrich 23,965-8, 48.96 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 48 hours of heating at 175° C. with continuous stirring, the reaction mixture was filtered to remove potassium carbonate and precipitated into methanol (2 gallons). The polymer (poly(4-CPK-BPA)) was isolated after filtration and drying in vacuo. Gel permeation chromatography (gpc) (elution solvent was tetrahydrofuran) analysis was as follows: $M_n$ 3,360, $M_{peak}$ 9,139, $M_w$ 5,875, $M_z$ 19,328, and $M_{z+1}$ 29,739. Solution cast films from methylene chloride were clear, tough, and flexible. As a result of the stoichiometries used in the reaction, it is believed that this polymer had end groups derived from bis-phenol A. The polymer thus prepared was chloromethylated as follows. A solution of chloromethyl ether in methyl acetate was made by adding 282.68 grams (256 milliliters) of acetyl chloride to a mixture of dimethoxy methane (313.6 grams, 366.8 milliliters) and methanol (10 milliliters) in a 5 liter 3-neck round-bottom flask equipped with a mechanical stirrer, argon inlet, reflux condenser, and addition funnel. The solution was diluted with 1,066.8 milliliters of 1,1,2,2-tetrachloroethane and then tin tetrachloride (2.4 milliliters) was added via a gas-tight syringe along with 1,1,2,2-tetrachloroethane (133.2 milliliters) using an addition funnel. The reaction solution was heated to 500° C. Thereafter, a solution of the poly(4-CPK-BPA) (160.8 grams) in 1,000 milliliters of tetrachloroethane was added rapidly. The reaction mixture was then heated to reflux with an oil bath set at 110° C. After 4 hours reflux with continuous stirring, heating was discontinued and the mixture was allowed to cool to 25° C. The reaction mixture was transferred in stages to a 2 liter round bottom flask and concentrated using a rotary evaporator with gentle heating up to 50° C. while reduced pressure was maintained with a vacuum pump trapped with liquid nitrogen. The concentrate was added to methanol (4 gallons) to precipitate the polymer using a Waring blender. The polymer was isolated by filtration and vacuum dried to yield poly(4-CPK-BPA) with 2 chloromethyl groups per repeat unit as identified using $^1$H NMR spectroscopy. Solvent free polymer was obtained by reprecipitation of the polymer (75 grams) in methylene chloride (500 grams) into methanol (3 gallons) followed by filtration and vacuum drying to yield solvent free polymer. Gel permeation chromatography (gpc) (elution solvent was tetrahydrofuran) analysis was as follows: $M_n$ 4,527, $M_{peak}$ 12,964, $M_w$ 12,179, $M_z$ 21,824, and $M_{z+1}$ 30,612. The chloromethylated polymer was then acryloylated as follows. A solution was prepared containing 90 grams of the chloromethylated polymer with 2 chloromethyl groups per repeat unit in 639 milliliters (558.5 grams) of N,N-dimethylacetamide and the solution was magnetically stirred at 25°0 C. with sodium acrylate (51.39 grams) for 1 week. The reaction mixture was then centrifuged, and the supernate was added to methanol (4.8 gallons) using a Waring blender in relative amounts of 25 milliliters of polymer solution per 0.75 liter of methanol. The white powder that precipitated was filtered, and the wet filter cake was washed with water (3 gallons) and then methanol (3 gallons). The polymer was then isolated by filtration and vacuum dried to yield a white powder. The polymer had 1 acrylate group for every repeating monomer unit and 1 chloromethyl groups for every repeating monomer unit. Gel permeation chromatography (gpc) (elution solvent was tetrahydrofuran) analysis was as follows: $M_n$ 10,922, $M_{peak}$ 24,895, $M_w$ 62,933, $M_z$ 210,546, and $M_{z+1}$ 411,394.

A second acryloylated polyarylene ether ketone resin with a weight average molecular weight of about 8,000 and having 1 acrylate group per every eight repeating monomer units and 1 chloromethyl group per every eight repeating monomer units was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 50 grams), bis-phenol A (Aldrich 23,965-8, 48.96 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, an aliquot of the reaction product that had been precipitated into methanol was analyzed by gel permeation chromatography (gpc) (elution solvent was tetrahydrofuran) with the following results: $M_n$ 4464, $M_{peak}$ 7583, $M_w$ 7927, $M_z$ 12,331, and $M_{z+1}$ 16,980. As a result of the stoichiometries used in the reaction, it is believed that this polymer had end groups derived from bis-phenol A. This polymer contained 7 mol % N,N-dimethylacetamide as residual solvent. When the residual N,N-dimethylacetamide exceeds 5 mol % of the polymer, the chloromethylation reaction of the next step proceeds only to a maximum value of 1 chloromethyl group per every 4 monomer repeat units. A solution of chloromethyl ether in methyl acetate was made by adding 35.3 grams of acetyl chloride to a mixture of dimethoxy methane (45 milliliters) and methanol (1.25 milliliters) in a 500 milliliter 3-neck round-bottom flask equipped with a mechanical stirrer, argon inlet, reflux condenser, and addition funnel. The solution was diluted with 150 milliliters of 1,1,2,2-tetrachloroethane and then tin tetrachloride (0.3 milliliters) was added via syringe. The solution was heated to reflux with an oil bath set at 110° C. Thereafter, a solution of the poly(4-CPK-BPA) containing residual solvent (10 grams of polymer) in 125 milliliters of 1,1,2,2-tetrachloroethane was added over 8 minutes. After two hours reflux with continuous stirring, heating was discontinued and the mixture was allowed to cool to 25° C. The reaction mixture was transferred to a rotary evaporator with gentle heating at between 50 and 55° C. After 1 hour, when most of the volatiles had been removed, the reaction mixture was added to methanol (each 25 milliliters of solution was added to 0.75 liter of methanol) to precipitate the polymer using a Waring blender. The precipitated polymer was collected by filtration, washed with methanol, and air-dried to yield 13 grams of off-white powder. The polymer had about 1.0 $CH_2Cl$ groups per every 4 repeat units. A solution was then prepared containing 11 grams of the chloromethylated polymer in 100 milliliters (87.4 grams) of N,N-dimethylacetamide and the solution was magnetically stirred at 25° C. with sodium acrylate (30 grams) for 1 week. The reaction mixture was then filtered and added to methanol using a Waring blender in relative amounts of 25 milliliters of polymer solution per 0.75 liter of methanol. The white powder that precipitated was reprecipitated into methanol from a 20 weight percent solids solution in methylene chloride and was them air dried to yield 7.73 grams of a white powder. The polymer had 1 acrylate group for every 8 repeat units, and 1 chloromethyl group for every 8 repeat units.

50 parts by weight of the first polymer were admixed with 50 parts by weight of the second polymer to result in a mixture containing equal parts by weight of both polymers. A solution was prepared containing 40 percent by weight solids of the polymer mixture in N-methylpyrrolidone. Thereafter, a sensitizer (Michler's ketone) was added to the solution in an amount of about 0.75 percent by weight of the solution and more solvent was added, bringing the solution to a solids content of 37 percent by weight. The resulting blend had a weight average molecular weight of about 34,000 and a degree of acryloylation of about 0.78 milliequivalents of acryloyl groups per gram of resin.

The solution thus formed was coated onto spinning silane-treated silicon wafers and the coated wafers were heated at 70° C. for 5 minutes. The wafers were then allowed to cool to 25° C., followed by covering the wafers with masks and exposure to ultraviolet light at a wavelength of 365 nanometers, amounting to 2,500 milliJoules/cm². The exposed films were then heated to 70° C. for 5 minutes post exposure bake, followed by cooling to 25° C. The films were developed with 60:40 chloroform/cyclohexanone developer, washed with 90:10 hexanes/cyclohexanone, and then dried at 70° C. The processed wafers were transferred to an oven at 25° C., and the oven temperature was raised at 2° C. per minute to 260° C. to effect post-cure. During post-cure, heat stable, solvent resistant sites formed. The post-cured, crosslinked polymers were heat stable, chemically inert to thermal ink jet inks (including a black ink available from Canon K.K. with a pH of 9.6 after exposure to the ink for 5 weeks at 65° C.), electrically insulating, and mechanically robust, and exhibited low shrinkage during post-cure. Clean features were developed at resolutions of 300 and 600 dots per inch.

EXAMPLE II

An acryloylated poly(4-CPK-BPA) with a weight average molecular weight of about 60,000 and having 1 acryloyl group per repeat unit and 1 chloromethyl group per repeat unit (7 grams), prepared as described in Example I, of the structure

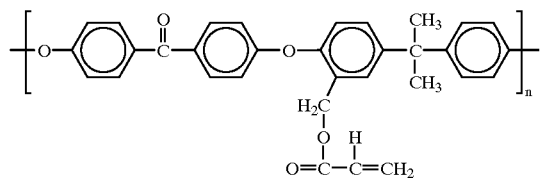

and a poly(4-CPK-BPA) with a weight average molecular weight of 5,600 (3 grams), prepared in a manner similar to that described for the preparation of poly(4-CPK-BPA) of $M_w$ 5,875 in Example I except that heating at 175° C. was for 30 hours instead of 48 hours, of the structure

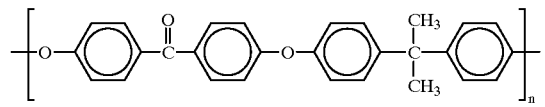

were combined and diluted to 37 weight percent solids with N-methylpyrrolidinone (15 grams). Michler's ketone of the formula

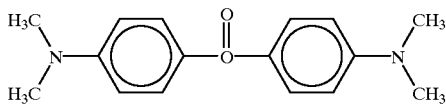

was added in an amount of from about 0.3 to about 0.5 percent by weight of the resin solids before exposure to develop 30 micron thick films. The resulting blend had a weight average molecular weight of about 44,000 and a degree of acryloylation of about 1.31 milliequivalents of acryloyl groups per gram of resin. A heater wafer with a phosphosilicate glass layer was spin coated with a solution of Z6020 adhesion promoter (0.01 weight percent in methanol {95 parts} and water {5 parts}, available from Dow Corning) at 3000 revolutions per minute for 10 seconds and dried at 100° C. for between 2 and 10 minutes. The wafer was then allowed to cool at 25° C. over 5 minutes before spin coating the polyarylene ether ketone blended photoresist solution onto the wafer at between 1000 and 3000 revolutions per minute for between 30 and 60 seconds. The film was heated (soft baked) in an oven for between 10 and 15 minutes at 70° C. After cooling to 25° C. over 5 minutes, the film was covered with a mask and exposed to 365 nanometer ultraviolet light, amounting to between 150 and 1500 milliJoules per cm². The exposed wafer was then heated at 70° C. for 2 minutes post exposure bake, followed by cooling to 25° C. over 5 minutes. The film was developed with 6:4 chloroform/cyclohexanone developer, washed with 9:1 hexanes/cyclohexanone and then dried at 70° C. for 2 minutes. A second developer/wash cycle was carried out if necessary to obtain a wafer with clean features. The processed wafer was transferred to an oven at 25° C., and the oven temperature was raised from 25 to 90° C. at 2° C. per minute. The temperature was maintained at 90° C. for 2 hours, and then increased to 260° C. at 2° C. per minute. The oven temperature was maintained at 260° C. for 2 hours and then the oven was turned off and the temperature was allowed to gradually cool to 25° C. When thermal cure of the photoresist films was carried out under inert atmosphere such as argon or nitrogen, there was markedly reduced oxidation of the developed film and improved thermal and hydrolytic stability of the resultant devices. Moreover, adhesion was improved to the underlying substrate. If desired, the heat cure of the first developed layer can be stopped between 80 and 260° C. before the second layer is spin coated on top. A second thicker layer was deposited by repeating the above procedure a second time. This process is intended to be a guide in that procedures can be outside the specified conditions depending on film thickness and photoresist molecular weight. Films at 30 microns were developed with clean features at 600 dots per inch. The photopatternable polymer blend solution was further admixed with epoxy resin in relative amounts of about 90 parts by weight polymer and about 10 parts by weight epoxy resin, EPON 1001F, available from Shell Chemical Company, Houston, Tex., believed to be of the formula

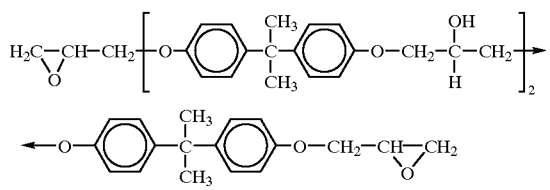

"Y" curative (meta-phenylene diamine) was used to cure the epoxy resin at 10 weight percent addition of curative per gram of epoxy resin solids. The same spin conditions, soft bake, photoexposure, and development conditions were used in the case of the epoxy blend as in that without the epoxy resin material. Incorporation of the epoxy resin into the photopatternable polymer material improved the adhesion of the photopatternable layer to the heater plate. Subsequent to imaging and during cure of the photopatternable polymer, the epoxy reacted with the heater layer to form strong chemical bonds with that layer, improving adhesive strength and solvent resistance of the interface. The presence of the epoxy may also improve the hydrophilicity of the photopatternable polymer and thus may improve the wetting properties of the layer, thereby improving the refill characteristics of the printhead. Thermal ink jet printhead devices were made with the above composition which resisted sulfolane based ink jet compositions and alkaline inks of pH 8 which contained N-cyclohexylpyrrolidinone and imidazole.

EXAMPLE III

An acryloylated poly(4-CPK-BPA) with a weight average molecular weight of about 25,000 and having 0.75 acryloyl group and 0.75 chloromethyl group per repeat unit of the structure

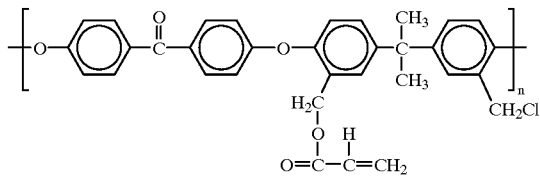

was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 53.90 grams), bis-phenol A (Aldrich 23,965-8, 45.42 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, the reaction mixture was filtered to remove potassium carbonate and precipitated into methanol (2 gallons). The polymer (poly(4-CPK-BPA)) was isolated in 86% yield after filtration and drying in vacuo. As a result of the stoichiometries used in the reaction, it is believed that this polymer had end groups derived from 4,4-dichlorobenzophenone. Gel permeation chromatography (gpc) (elution solvent was tetrahydrofuran) analysis was as follows: $M_n$ 4,334, $M_{peak}$ 10,214, $M_w$ 11,068, $M_z$ 10,214, and $M_{z+1}$ 28,915. Solution cast films from methylene chloride were clear, tough, and flexible. The polymer thus prepared was chloromethylated as follows. A solution of chloromethyl ether in methyl acetate was made by adding 282.68 grams (256 milliliters) of acetyl chloride to a mixture of dimethoxy methane (313.6 grams, 366.8 milliliters) and methanol (10 milliliters) in a 5 liter 3-neck round-bottom flask equipped with a mechanical stirrer, argon inlet, reflux condenser, and addition funnel. The solution was diluted with 1,066.8 milliliters of 1,1,2,2-tetrachloroethane and then tin tetrachloride (2.4 milliliters) was added via a gas-tight syringe along with 1,1,2,2-tetrachloroethane (133.2 milliliters) using an addition funnel. The reaction solution was heated to 500° C. Thereafter, a solution of the poly(4-CPK-BPA) (160.8 grams) in 1,000 milliliters of tetrachloroethane was added rapidly. The reaction mixture was then heated to reflux with an oil bath set at 110° C. After 4 hours reflux with continuous stirring, heating was discontinued and the mixture was allowed to cool to 25° C. The reaction mixture was transferred in stages to a 2 liter round bottom flask and concentrated using a rotary evaporator with gentle heating up to 50° C. while reduced pressure was maintained with a vacuum pump trapped with liquid nitrogen. The concentrate was added to methanol (4 gallons) to precipitate the polymer using a Waring blender. The polymer was isolated by filtration and vacuum dried to yield 200 grams of poly(4-CPK-BPA) with 1.5 chloromethyl groups per repeat unit as identified using $^1$H NMR spectroscopy. Solvent free polymer was obtained by reprecipitation of the polymer (75 grams) in methylene chloride (500 grams) into methanol (3 gallons) followed by filtration and vacuum drying. Gel permeation chromatography (gpc) (elution solvent was tetrahydrofuran) analysis was as follows: $M_n$ 5,580, $M_{peak}$ 15,242, $M_w$ 17,169, $M_z$ 36,837, and $M_{z+1}$ 57,851. The chloromethylated polymer was then acryloylated as follows. A solution was prepared containing 90 grams of the chloromethylated polymer with 2 chloromethyl groups per repeat unit in 639 milliliters (558.5 grams) of N,N-dimethylacetamide and the solution was magnetically stirred at 25° C. with sodium acrylate (51.39 grams) for 1 week. The reaction mixture was then centrifuged, and the supernate was added to methanol (4.8 gallons) using a Waring blender in relative amounts of 25 milliliters of polymer solution per 0.75 liter of methanol. The white powder that precipitated was filtered, and the wet filter cake was washed with water (3 gallons) and then methanol (3 gallons). The polymer was then isolated by filtration and, vacuum dried to yield a white powder. The polymer had 0.75 acrylate group for every repeating monomer unit and 0.75 chloromethyl group for every repeating monomer unit. Gel permeation chromatography (gpc) (elution solvent was tetrahydrofuran) analysis was as follows: $M_n$ 7,000, $M_{peak}$ 17,376, $M_w$ 22,295, $M_z$ 50,303, and $M_{z+1}$ 80,995.

A poly(4-CPK-BPA) with a weight average molecular weight of 11,000 and having 2 chloromethyl groups per repeat unit, of the structure

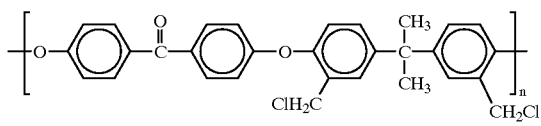

was prepared as described in Example I. Thereafter, 7 grams of the acryloylated and chloromethylated polymer with weight average molecular weight of about 25,000 and 3 grams of the chloromethylated polymer with weight average molecular weight of about 11,000 were combined and diluted to 37 weight percent solids with N-methylpyrrolidinone (15 grams). Michier's ketone of the formula

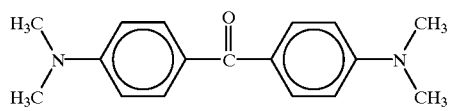

was added in an amount of from about 0.3 to about 0.5 percent by weight of the resin solids before exposure to develop 30 micron thick films. The blend had a weight average molecular weight of about 20,800 and a degree of acryloylation of about 1.05 milliequivalents per gram. A heater wafer with a phosphosilicate glass layer was spin coated wit h a solution of Z6020 adhesion promoter (0.01 weight percent in methanol {95 parts} and water {5 parts}, available from Dow Corning) at 3000 revolutions per minute for 10 seconds and dried at 100° C. for between 2 and 10 minutes. The wafer was then allowed to cool at 25° C. over 5 minutes before spin coating the polyarylene ether ketone blended photoresist solution onto the wafer at between 1000 and 3000 revolutions per minute for between 30 and 60 seconds. The film was heated (soft baked) in an oven for between 10 and 15 minutes at 70° C. After cooling to 25° C. over 5 minutes, the film was covered with a mask and exposed to 365 nanometer ultraviolet light, amounting to between 150 and 1500 milliJoules per cm$^2$. The exposed wafer was then heated at 70° C. for 2 minutes post exposure bake, followed by cooling to 25° C. over 5 minutes. The film was developed with 6:4 chloroform/cyclohexanone developer, washed with 9:1 hexanes/cyclohexanone and then dried at 70° C. for 2 minutes. A second developer/wash cycle was carried out if necessary to obtain a wafer with clean features. The processed wafer was transferred to an oven at 25° C., and the oven temperature was raised from 25 to 90° C. at 2° C. per minute. The temperature was maintained at 90° C. for 2 hours, and then increased to 260° C. at 2° C. per minute. The oven temperature was maintained at 260° C. for 2 hours and then the oven was turned off and the temperature was allowed to gradually cool to 25° C. When thermal cure of the photoresist films was carried out under inert atmosphere such as argon or nitrogen, there was markedly reduced oxidation of the developed film and improved thermal and hydrolytic stability of the resultant devices. Moreover, adhesion was improved to the underlying substrate. If desired, the heat cure of the first developed layer can be stopped between 80 and 260° C. before the second layer is spin coated on top. A second thicker layer was deposited by repeating the above procedure a second time. This process is intended to be a guide in that procedures can be outside the specified conditions depending on film thickness and photoresist molecular weight. Films at 30 microns were developed with clean features at 600 dots per inch. The photopatternable polymer blend solution was further admixed with epoxy resin in relative amounts of about 90 parts by weight polymer and about 10 parts by weight epoxy resin, EPON 1001F, available from Shell Chemical Company, Houston, Tex., believed to be of the formula

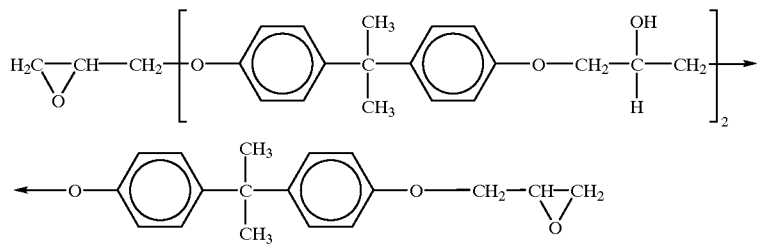

"Y" curative (meta-phenylene diamine) was used to cure the epoxy resin at 10 weight percent addition of curative per gram of epoxy resin solids. The same spin conditions, soft bake, photoexposure, and development conditions were used in the case of the epoxy blend as in that without the epoxy resin material. Incorporation of the epoxy resin into the photopatternable polymer material improved the adhesion of the photopatternable layer to the heater plate. Subsequent to imaging and during cure of the photopatternable polymer, the epoxy reacted with the heater layer to form strong chemical bonds with that layer, improving adhesive strength and solvent resistance of the interface. The presence of the epoxy may also improve the hydrophilicity of the photopatternable polymer and thus may improve the wetting properties of the layer, thereby improving the refill characteristics of the printhead. Thermal ink jet printhead devices were made with the above composition which resisted sulfolane based ink jet compositions and alkaline inks of pH 8 which contained N-cyclohexylpyrrolidinone and imidazole.

EXAMPLE IV

Acryloylated poly(4-CPK-BPA) with a weight average molecular weight of 60,000 and having 0.75 acryloyl group and 0.75 chloromethyl group per repeat unit, of the general structure

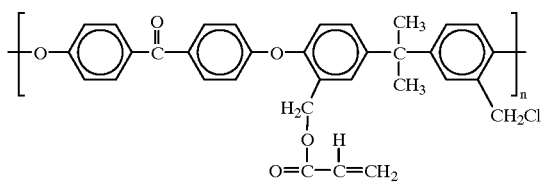

is prepared as follows. A 1 liter, 3-neck round-bottom flask equipped with a Dean-Stark (Barrett) trap, condenser, mechanical stirrer, argon inlet, and stopper is situated in a silicone oil bath. 4,4'-Dichlorobenzophenone (Aldrich 11,370, Aldrich Chemical Co., Milwaukee, Wis., 50 grams), bis-phenol A (Aldrich 23,965-8, 48.96 grams), potassium carbonate (65.56 grams), anhydrous N,N-dimethylacetamide (300 milliliters), and toluene (55 milliliters) are added to the flask and heated to 175° C. (oil bath temperature) while the volatile toluene component is collected and removed. After 24 hours of heating at 175° C. with continuous stirring, it is believed that the reaction product precipitated into methanol, if analyzed by gel permeation chromatography (gpc) (elution solvent is tetrahydrofuran), will have approximately the following results: $M_n$ 3100, $M_w$ 6250. As a result of the stoichiometries used in the reaction, it is believed that this polymer will have end groups derived from bis-phenol A. This polymer contains 7 mol % N,N-dimethylacetamide as residual solvent. When the residual N,N-dimethylacetamide exceeds 5 mol % of the polymer, the chloromethylation reaction of the next step proceeds only to a maximum value of 1 chloromethyl group per every 4 monomer repeat units. A solution of chloromethyl ether in methyl acetate is made by adding 35.3 grams of acetyl chloride to a mixture of dimethoxy methane (45 milliliters) and methanol (1.25 milliliters) in a 500 milliliter 3-neck round-bottom flask equipped with a mechanical stirrer, argon inlet, reflux condenser, and addition funnel. The solution is diluted with 150 milliliters of 1,1,2,2-tetrachloroethane and then tin tetrachloride (0.3 milliliters) is added via syringe. The solution is heated to reflux with an oil bath set at 110° C. Thereafter, a solution of the poly(4-CPK-BPA) containing residual solvent (10 grams of polymer) in 125 milliliters of 1,1,2,2-tetrachloroethane is added over 8 minutes. After two hours reflux with continuous stirring, heating is discontinued and the mixture is allowed to cool to 25° C. The reaction mixture is transferred to a rotary evaporator with gentle heating at between 50 and 55° C. After 1 hour, when most of the volatiles have been removed, the reaction mixture is added to methanol (each 25 milliliters of solution is added to 0.75 liter of methanol) to precipitate the polymer using a Waring blender. The precipitated polymer is collected by filtration, washed with methanol, and air-dried to yield off-white powder. It is believed that the polymer will have about 1 $CH_2Cl$ group per every 4 repeat units. A solution is then prepared containing 11 grams of the chloromethylated polymer in 100 milliliters (87.4 grams) of N,N-dimethylacetamide and the solution is magnetically stirred at 25° C. with sodium acrylate (30 grams) for 1 week. The reaction mixture is then filtered and added to methanol using a Waring blender in relative amounts of 25 milliliters of polymer solution per 0.75 liter of methanol. The white powder that precipitates is reprecipitated into methanol from a 20 weight percent solids solution in methylene chloride and is then air dried to yield a white powder. It is believed that the polymer will have 1 acrylate group for every 8 repeat units, and 1 chloromethyl group for every 8 repeat units.

Bisphenol A bispropylene glycol dimethacrylate, molecular weight 512, is prepared as disclosed in, for example, "Bis-Methacryloxy Bisphenol-A Epoxy Networks: Synthesis, Characterization, Thermal and Mechanical Properties," A. Banthia et al., Polymer Preprints, 22(1), 209 (1981), the disclosure of which is totally incorporated herein by reference, of the structure

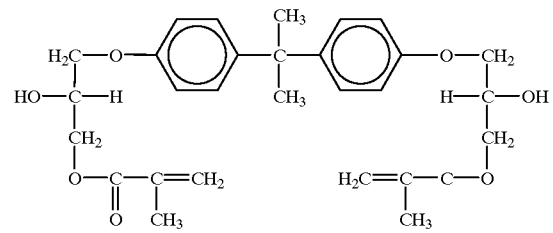

The acryloylated and chloromethylated polymer (8 grams) and the bisphenol A bispropylene glycol dimethacrylate are combined and diluted to 37 weight percent solids with N-methylpyrrolidinone (15 grams). The resulting blend has a weight average molecular weight of about 20,000 and a degree of acryloylation of about 1.27 milliequivalents of acryloyl groups per gram of blend. Michier's ketone is added in an amount of from about 0.3 to about 0.5 percent by weight of the resin solids before exposure to develop 30 micron thick films. A heater wafer with a phosphosilicate glass layer is spin coated with a solution of Z6020 adhesion promoter (0.01 weight percent in methanol {95 parts} and water {5 parts}, available from Dow Corning) at 3000 revolutions per minute for 10 seconds and dried at 100° C. for between 2 and 10 minutes. The wafer is then allowed to cool at 25° C. over 5 minutes before spin coating the polyarylene ether ketone blended photoresist solution onto the wafer at between 1000 and 3000 revolutions per minute for between 30 and 60 seconds. The film is heated (soft baked) in an oven for between 10 and 15 minutes at 70° C. After cooling to 25° C. over 5 minutes, the film is covered with a mask and exposed to 365 nanometer ultraviolet light, amounting to between 150 and 1500 milliJoules per $cm^2$. The exposed wafer is then heated at 70° C. for 2 minutes post exposure bake, followed by cooling to 25° C. over 5 minutes. The film is developed with 6:4 chloroform/cyclohexanone developer, washed with 9:1 hexanes/cyclohexanone and then dried at 70° C. for 2 minutes. A second developer/wash cycle is carried out if necessary to obtain a wafer with clean features. The processed wafer is transferred to an oven at 25° C., and the oven temperature is raised from 25 to 90° C. at 2° C. per minute. The temperature is maintained at 90° C. for 2 hours, and then increased to 260° C. at 2° C. per minute. The oven temperature is maintained at 260° C. for 2 hours and then the oven is turned off and the temperature is allowed to cool gradually to 25° C. When thermal cure of the photoresist films is carried out under inert atmosphere such as argon or nitrogen, there is markedly reduced oxidation of the developed film and improved thermal and hydrolytic stability of the resultant devices. Moreover, adhesion is improved to the underlying substrate. If desired, the heat cure of the first developed layer can be stopped between 80 and 260° C. before the second layer is spin coated on top. A second thicker layer is deposited by repeating the above procedure a second time. This process is intended to be a guide in that procedures can be outside the specified conditions depending on film thickness and photoresist molecular weight. Films at 30 microns can be developed with clean features at 600 dots per inch.

EXAMPLE V

Acryloylated poly(4-CPK-BPA) with a weight average molecular weight of 25,000 and having 0.75 acryloyl group and 0.75 chloromethyl group per repeat unit (80 parts by weight), of the structure

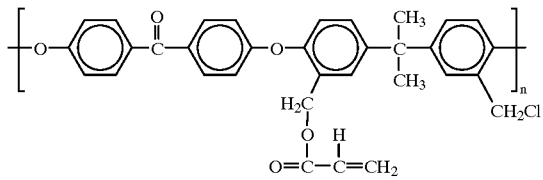

prepared as described in Example III, and polymethyl methacrylate having a weight average molecular weight of 15,000 (obtained from Sigma Chemical Co., St. Louis, Mo.) (20 parts by weight) are combined and diluted to 37 weight percent solids with N-methylpyrrolidinone (150 grams). The resulting blend had a weight average molecular weight of about 23,000 and a degree of acrylolylation of about 1.20 milliequivalents per gram. Michler's ketone is added in an amount of about 1.5 percent by weight of the resin solids before exposure to develop 30 micron thick films. A heater wafer with a phosphosilicale glass layer is spin coated with a solution of Z6020 adhesion promoter (0.01 weight percent in methanol {95 parts} and water {5 parts}, available from Dow Corning) at 3000 revolutions per minute for 10 seconds and dried at 100° C. for between 2 and 10 minutes. The wafer is then allowed to cool at 25° C. over 5 minutes before spin coating the polyarylene ether ketone blended photoresist solution onto the wafer at between 1000 and 3000 revolutions per minute for between 30 and 60 seconds. The film is heated (soft baked) in an oven for between 10 and 15 minutes at 70° C. After cooling to 25° C. over 5 minutes, the film is covered with a mask and exposed to 365 nanometer ultraviolet light, amounting to between 150 and 1500 milliJoules per cm$^2$. The exposed wafer is then heated at 70° C. for 2 minutes post exposure bake, followed by cooling to 25° C. over 5 minutes. The film is developed with 6:4 chloroform/cyclohexanone developer, washed with 9:1 hexanes/cyclohexanone and then dried at 70° C. for 2 minutes. A second developer/wash cycle is carried out if necessary to obtain a wafer with clean features. The processed wafer is transferred to an oven at 25° C., and the oven temperature is raised from 25 to 90° C. at 2° C. per minute. The temperature is maintained at 90° C. for 2 hours, and then increased to 260° C. at 2° C. per minute. The oven temperature is maintained at 260° C. for 2 hours and then the oven is turned off and the temperature is allowed to cool gradually to 25° C. When thermal cure of the photoresist films is carried out under inert atmosphere such as argon or nitrogen, it is believed that there will be markedly reduced oxidation of the developed film and improved thermal and hydrolytic stability of the resultant devices. Moreover, it is believed that adhesion will be improved to the underlying substrate. If desired, the heat cure of the first developed layer can be stopped between 80 and 260° C. before the second layer is spin coated on top. A second thicker layer is deposited by repeating the above procedure a second time. This process is intended to be a guide in that procedures can be outside the specified conditions depending on film thickness and photoresist molecular weight. It is believed that films at 30 microns can be developed with clean features at 600 dots per inch.

EXAMPLE VI

A polyarylene ether ketone of the formula

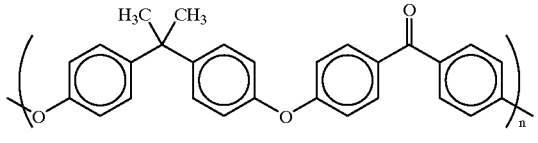

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 53.90 grams), bis-phenol A (Aldrich 23,965-8, 45.42 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, the reaction mixture was filtered to remove potassium carbonate and precipitated into methanol (2 gallons). The polymer (poly(4-CPK-BPA)) was isolated in 86% yield after filtration and drying in vacuo. GPC analysis was as follows: $M_n$ 4,239, $M_{peak}$ 9,164, $M_w$ 10,238, $M_z$ 18,195, and $M_{z+1}$ 25,916. Solution cast films from methylene chloride were clear, tough, and flexible. As a result of the stoichiometries used in the reaction, it is believed that this polymer had end groups derived from 4,4-dichlorobenzophenone.

EXAMPLE VII

A polyarylene ether ketone of the formula

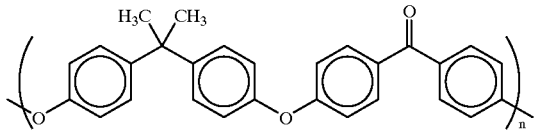

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 50 grams), bis-phenol A (Aldrich 23,965-8, 48.96 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, an aliquot of the reaction product that had been precipitated into methanol was analyzed by gel permeation chromatography (gpc) (elution solvent was tetrahydrofuran) with the following results: $M_n$ 4464, $M_{peak}$ 7583, $M_w$ 7927, $M_z$ 12,331, and $M_{z+1}$ 16,980. After 48 hours at 175° C. with continuous stirring, the reaction mixture was filtered to remove potassium carbonate and precipitated into methanol (2 gallons). The polymer (poly(4-CPK-BPA)) was isolated in 86% yield after filtration and drying in vacuo. GPC analysis was as follows: $M_n$ 5347, $M_{peak}$ 16,126, $M_w$ 15,596, $M_z$ 29,209, and $M_{z+1}$ 42,710. The glass transition temperature of the polymer was about 120±1020 C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from bis-phenol A.

EXAMPLE VIII

A polyarylene ether ketone of the formula

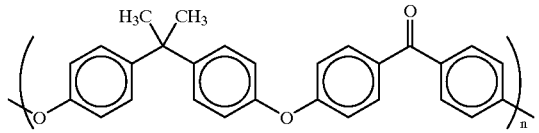

wherein n is between about 2 and about 30 (hereinafter referred to as poly(4-CPK-BPA)) was prepared as follows. A 5 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 250 grams), bis-phenol A (Aldrich 23,965-8, 244.8 grams), potassium carbonate (327.8 grams), anhydrous N,N-dimethylacetamide (1,500 milliliters), and toluene (275 milliliters) were added to the flask and heated to 175° C. (oil bath temperature) while the volatile toluene component was collected and removed. After 48 hours of heating at 175° C. with continuous stirring, the reaction mixture was filtered to remove insoluble salts, and the resultant solution was added to methanol (5 gallons) to precipitate the polymer. The polymer was isolated by filtration, and the wet filter cake was washed with water (3 gallons) and then with methanol (3 gallons). The yield was 360 grams of vacuum dried product. The molecular weight of the polymer was determined by gel permeation chromatography (gpc) (elution solvent was tetrahydrofuran) with the following results: $M_n$ 3,601, $M_{peak}$ 5,377, $M_w$ 4,311, $M_z$ 8,702, and $M_{z+1}$ 12,951. The glass transition temperature of the polymer was between 125 and 155° C. as determined using differential scanning calorimetry at a heating rate of 20° C. per minute dependent on molecular weight. Solution cast films from methylene chloride were clear, tough, and flexible. As a result of the stoichiometries used in the reaction, it is believed that this polymer had end groups derived from bis-phenol A.

EXAMPLE IX

Poly(4-CPK-BPA) prepared as described in Example VII (10 grams) in 1,1,2,2-tetrachloroethane (100 milliliters, 161.9 grams), paraformaldehyde (5 grams), p-toluene-sulfonic acid monohydrate (1 gram), acrylic acid (15.8 grams), and crushed 4-methoxy-phenol (MEHQ, 0.2 gram) were charged in a 6.5 fluid ounce beverage bottle equipped with a magnetic stirrer. The bottle was stoppered with a rubber septum and was then heated to 105° C. in a silicone oil bath under argon using a needle inlet. The argon needle inlet was removed when the oil bath achieved 90° C. Heating at 105° C. was continued with constant magnetic stirring for 1.5 hours. More MEHQ (0.2 grams) in 1 milliliter of 1,1,2,2-tetrachloroethane was then added by syringe, and heating at 105° C. with stirring was continued for 1.5 hours longer. The reaction mixture was initially a cloudy suspension which became clear on heating. The reaction vessel was immersed as much as possible in the hot oil bath to prevent condensation of paraformaldehyde onto cooler surfaces of the reaction vessel. The reaction mixture was allowed to return to 25° C. and was then filtered through a 25 to 50 micron sintered glass Buchner funnel. The reaction solution was added to methanol (1 gallon) to precipitate the polymer designated poly(acryloylmethyl-4-CPK-BPA), of the formula

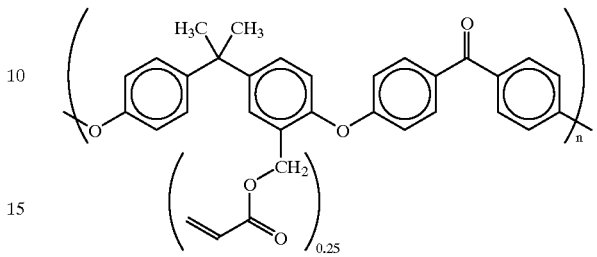

wherein n is between about 6 and about 50. $^1$H NMR spectrometry was used to identify approximately 1 acryloyl-methyl group for every four monomer (4-CPK-BPA) repeat units (i.e., a degree of acryloylation of 0.25). The poly (acryloylmethyl-4-CPK-BPA) was then dissolved in methylene chloride and reprecipitated into methanol (1 gallon) to yield 10 grams of fluffy white solid.

EXAMPLE X

A solution of chloromethyl ether in methyl acetate was made by adding 282.68 grams (256 milliliters) of acetyl chloride to a mixture of dimethoxy methane (313.6 grams, 366.8 milliliters) and methanol (10 milliliters) in a 5 liter 3-neck round-bottom flask equipped with a mechanical stirrer, argon inlet, reflux condenser, and addition funnel. The solution was diluted with 1,066.8 milliliters of 1,1,2,2-tetrachloroethane and then tin tetrachloride (2.4 milliliters) was added via a gas-tight syringe along with 1,1,2,2-tetrachloroethane (133.2 milliliters) using an addition funnel. The reaction solution was heated to 500° C. Thereafter, a solution of poly(4-CPK-BPA) prepared as described in Example VIII (160.8 grams) in 1,000 milliliters of tetrachloroethane was added rapidly. The reaction mixture was then heated to reflux with an oil bath set at 110° C. After four hours reflux with continuous stirring, heating was discontinued and the mixture was allowed to cool to 25° C. The reaction mixture was transferred in stages to a 2 liter round bottom flask and concentrated using a rotary evaporator with gentle heating up to 50° C. while reduced pressure was maintained with a vacuum pump trapped with liquid nitrogen. The concentrate was added to methanol (4 gallons) to precipitate the polymer using a Waring blender. The polymer was isolated by filtration and vacuum dried to yield 200 grams of poly(4-CPK-BPA) with 1.5 chloromethyl groups per repeat unit as identified using $^1$H NMR spectroscopy. When the same reaction was carried out for 1, 2, 3, and 4 hours, the amount of chloromethyl groups per repeat unit was 0.76, 1.09, 1.294, and 1.496, respectively.

Solvent free polymer was obtained by reprecipitation of the polymer (75 grams) in methylene chloride (500 grams) into methanol (3 gallons) followed by filtration and vacuum drying to yield 70.5 grams (99.6% theoretical yield) of solvent free polymer.

When the reaction was carried out under similar conditions except that 80.4 grams of poly(4-CPK-BPA) was used instead of 160.8 grams and the amounts of the other reagents were the same as indicated above, the polymer is formed with 1.31, 1.50, 1.75, and 2 chloromethyl groups per repeat unit in 1, 2, 3, and 4 hours, respectively, at 110° C. (oil bath temperature).

When 241.2 grams of poly(4-CPK-BPA) was used instead of 160.8 grams with the other reagents fixed, poly(CPK-BPA) was formed with 0.79, 0.90, 0.98, 1.06, 1.22, and 1.38 chloromethyl groups per repeat unit in 1, 2, 3, 4, 5, and 6 hours, respectively, at 110° C. (oil bath temperature).

When 321.6 grams of poly(4-CPK-BPA) was used instead of 160.8 grams with the other reagents fixed, poly(CPK-BPA) was formed with 0.53, 0.59, 0.64, 0.67, 0.77, 0.86, 0.90, and 0.97 chloromethyl groups per repeat unit in 1, 2, 3, 4, 5, 6, 7, and 8 hours, respectively, at 110° C. (oil bath temperature).

EXAMPLE XI

A polyarylene ether ketone of the formula

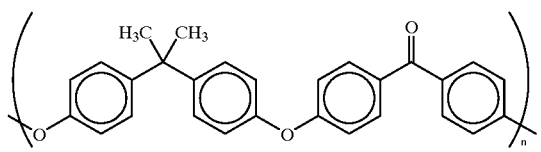

was prepared as described in Example VII. A solution of chloromethyl ether in methyl acetate was mode by adding 35.3 grams of acetyl chloride to a mixture of dimethoxy methane (45 milliliters) and methanol (1.25 milliliters) in a 500 milliliter 3-neck round-bottom flask equipped with a mechanical stirrer, argon inlet, reflux condenser, and addition funnel. The solution was diluted with 150 milliliters of 1,1,2,2-tetrachloroethane and then tin tetrachloride (0.3 milliliters) was added via syringe. The solution was heated to reflux with an oil bath set at 110° C. Thereafter, a solution of poly(4-CPK-BPA) (10 grams) in 125 milliliters of 1,1,2,2-tetrachloroethane was added over 8 minutes. After two hours reflux with continuous stirring, heating was discontinued and in the mixture was allowed to cool to 25° C. The reaction mixture was; transferred to a rotary evaporator with gentle heating at between 50 and 55° C. After 1 hour, when most of the volatiles had been removed, the reaction mixture was added to methanol (each 25 milliliters of solution was added to 0.75 liter of methanol) to precipitate the polymer using a Waring blender. The precipitated polymer was collected by filtration, washed with methanol, and air-dried to yield 13 grams of off-white powder. The polymer had about 1.5 $CH_2Cl$ groups per repeat unit.

EXAMPLE XII

A solution was prepared containing 90 grams of a chloromethylated polymer prepared as described in Example X with 1.5 chloromethyl groups per repeat unit in 639 milliliters (558.5 grams) of N,N-dimethylacetamide and the solution was magnetically stirred at 25° C. with sodium acrylate (51.39 grams) for 1 week. The reaction mixture was then centrifuged, and the supernate was added to methanol (4.8 gallons) using a Waring blender in relative amounts of 25 milliliters of polymer solution per 0.75 liter of methanol. The white powder that precipitated was filtered, and the wet filter cake was washed with water (3 gallons) and then methanol (3 gallons). The polymer was then isolated by filtration and vacuum dried to yield 73.3 grams of a white powder. The polymer had 3 acrylate groups for every 4 repeating monomer units and 3 chloromethyl groups for every 4 repeating monomer units and a weight average molecular weight of about 25,000.

When the reaction was repeated with poly(4-CPK-BPA) with 2 chloromethyl groups per repeat unit and the other reagents remained the same, the reaction took four days to achieve 0.76 acrylate groups per repeat unit and 1.24 chloromethyl groups per repeat unit.

When the reaction was repeated with poly(4-CPK-BPA) with 1.0 chloromethyl groups per repeat unit and the other reagents remained the same, the reaction took 14-days to achieve 0.75 acrylate groups per repeat unit and 2.5 chloromethyl groups per repeat unit.

EXAMPLE XIII

A chloromethylated polyarylene ether ketone was prepared as described in Example XI. A solution was then prepared containing 11 grams of the chloromethylated polymer in 100 milliliters (87.4 grams) of N,N-dimethylacetamide and the solution was magnetically stirred at 25° C. with sodium acrylate (30 grams) for 1 week. The reaction mixture was then filtered and added to methanol using a Waring blender in relative amounts of 25 milliliters of polymer solution per 0.75 liter of methanol. The white powder that precipitated was reprecipitated into methanol from a 20 weight percent solids solution in methylene chloride and was them air dried to yield 7.73 grams of a white powder. The polymer had 3 acrylate groups for every 4 repeating monomer units and 3 chloromethyl groups for every 4 repeating monomer units.

EXAMPLE XIV

A polymer of the formula

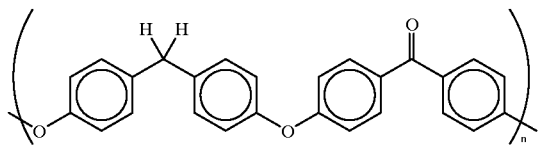

wherein n represents the number of repeating monomer units was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 16.32 grams, 0.065 mol), bis(4-hydroxyphenyl)methane (Aldrich, 14.02 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was filtered and added to methanol to precipitate the polymer, which was collected by filtration, washed with water, and then washed with methanol. The yield of vacuum dried product, poly(4-CPK-BPM), was 24 grams. The polymer dissolved on heating in N-methylpyrrolidinone, N,N-dimethylacetamide, and 1,1,2,2-tetrachloroethane. The polymer remained soluble after the solution had cooled to 25° C.

EXAMPLE XV

The polymer poly(4-CPK-BPM), prepared as described in Example XIV, was acryloylated with paraformaldehyde by the process described in Example VIII. Similar results were obtained.

EXAMPLE XVI

The polymer poly(4-CPK-BPM), prepared as described in Example XIV, was chloromethylated as follows. A solution of chloromethyl methyl ether (6 mmol/milliliter) in methyl acetate was prepared by adding acetyl chloride (35.3 grams) to a mixture of dimethoxymethane (45 milliliters) and methanol (1.25 milliliters). The solution was diluted with 150 milliliters of 1,1,2,2-tetrachloroethane and then tin tetrachloride (0.3 milliliters) was added. After taking the mixture to reflux using an oil bath set at 110° C., a solution of poly(4-CPK-BPM) (10 grams) in 125 milliliters of 1,1,2,2-tetrachloroethane was added. Reflux was maintained for 2 hours and then 5 milliliters of methanol were added to quench the reaction. The reaction solution was added to 1 gallon of methanol using a Waring blender to precipitate the product, chloromethylated poly(4-CPK-BPM), which was collected by filtration and vacuum dried. The yield was 9.46 grams of poly(4-CPK-BPM) with 2 chloromethyl groups per polymer repeat unit. The polymer had the following structure:

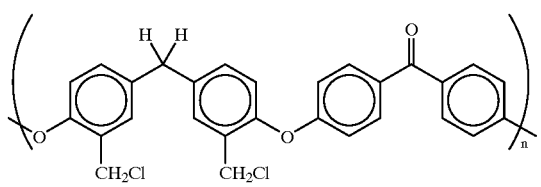

EXAMPLE XVII

Poly(4-CPK-BPM) with 2 chloromethyl groups per repeat unit (1 gram, prepared as described in Example XVI) in 20 milliliters of N,N-dimethylacetamide was magnetically stirred with sodium acrylate for 112 hours at 25° C. The solution was added to methanol using a Waring blender to precipitate the polymer, which was filtered and vacuum dried. Between 58 and 69 percent of the chloromethyl groups had been replaced with acryloyl groups. The product had the following formula:

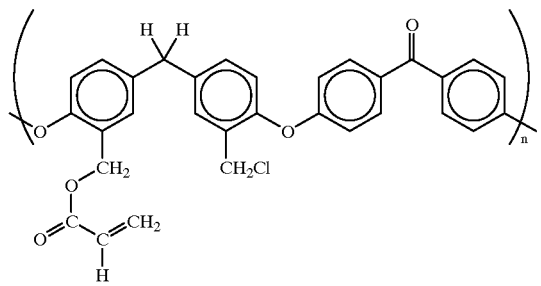

EXAMPLE XVIII

A polymer of the formula

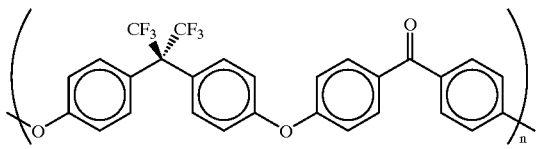

wherein n represents the number of repeating monomer units was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 16.32 grams, 0.065 mol), hexafluorobisphenol A (Aldrich, 23.52 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was filtered and added to methanol to precipitate the polymer, which was collected by filtration, washed with water, and then washed with methanol. The yield of vacuum dried product, poly(4-CPK-HFBPA), was 20 grams. The polymer was analyzed by gel permeation chromatography (gpc) (elution solvent was tetrahydrofuran) with the following results: $M_n$ 1,975, $M_{peak}$ 2,281, $M_w$ 3,588, and $M_{z+1}$ 8,918.

EXAMPLE XIX

The polymer poly(4-CPK-HFBPA), prepared as described in Example XVIII, was acryloylated with paraformaldehyde by the process described in Example VIII. Similar results were obtained.

EXAMPLE XX

The polymer poly(4-CPK-HFBPA), prepared as described in Example XVIII, is chloromethylated by the process described in Example XVI. It is believed that similar results will be obtained.

EXAMPLE XXI

The chloromethylated polymer poly (4-CPK-HFBPA), prepared as described in Example XX, is acryloylated by the process described in Example XVII. It is believed that similar results will be obtained.

EXAMPLE XXII

A polymer of the formula

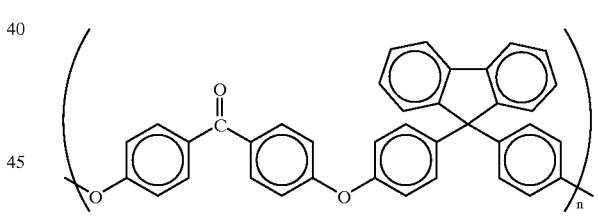

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis., 43.47 grams, 0.1992 mol), 9,9'-bis(4-hydroxyphenyl)fluorenone (Ken Seika, Rumson, N.J., 75.06 grams, 0.2145 mol), potassium carbonate (65.56 grams), anhydrous N,N-dimethylacetamide (300 milliliters), and toluene (52 milliliters) were added to the flask and heated to 175° C. (oil bath temperature) while the volatile toluene component was collected and removed. After 5 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-FBPA), was 71.7 grams. The polymer was analyzed by gel permeation chromatography (gpc) (elution solvent was tetrahydrofuran) with the following results: $M_n$ 59,100, $M_{peak}$ 144,000, $M_w$ 136,100, $M_z$ 211,350, and $M_{z+1}$ 286,100.

EXAMPLE XXIII

A polymer of the formula

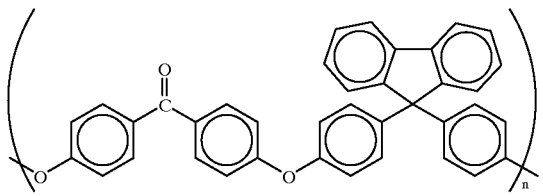

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich Chemical Co., Milwaukee, Wis., 50.02 grams, 0.1992 mol), 9,9'-bis(4-hydroxyphenyl)fluorenone (Ken Seika, Rumson, N.J., 75.04 grams, 0.2145 mol), potassium carbonate (65.56 grams), anhydrous N,N-dimethylacetamide (300 milliliters), and toluene (52 milliliters) were added to the flask and heated to 175° C. (oil bath temperature) while the volatile toluene component was collected and removed. After 24 hours of heating at 175° C. with continuous stirring, the reaction mixture was allowed to cool to 25° C. The reaction mixture was filtered and added to methanol to precipitate the polymer, which was collected by filtration, washed with water, and then washed with methanol. The yield of vacuum dried product, poly(4-CPK-FBP), was 60 grams.

EXAMPLE XXIV

The polymer poly(4-CPK-FBP), prepared as described in Example XXIII, was chloromethylated as follows. A solution of chloromethyl methyl ether (6 mmol/milliliter) in methyl acetate was prepared by adding acetyl chloride (38.8 grams) to a mixture of dimethoxymethane (45 milliliters) and methanol (1.25 milliliters). The solution was diluted with 100 milliliters of 1,1,2,2-tetrachloroethane and then tin tetrachloride (0.5 milliliters) was added in 50 milliliters of 1,1,2,2-tetrachloroethane. After taking the mixture to reflux using an oil bath set at 100° C., a solution of poly(4-CPK-FBP) (10 grams) in 125 milliliters of 1,1,2,2-tetrachloroethane was added. The reaction temperature was maintained at 100° C. for 1 hour and then 5 milliliters of methanol were added to quench the reaction. The reaction solution was added to 1 gallon of methanol using a Waring blender to precipitate the product, chloromethylated poly(4-CPK-FBP), which was collected by filtration and vacuum dried. The yield was 9.5 grams of poly(4-CPK-FBP) with 1.5 chloromethyl groups per polymer repeat unit. When the reaction was carried out at 110° C. (oil bath set temperature), the polymer gelled within 80 minutes. The polymer had the following structure:

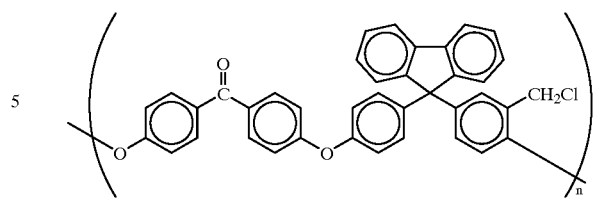

EXAMPLE XXV

Poly(4-CPK-FBP) with 1.5 chloromethyl groups per repeat unit (1 gram, prepared as described in Example XXIV) in 20 milliliters of N,N-dimethylacetamide was magnetically stirred with sodium acrylate for 112 hours at 25° C. The solution was added to methanol using a Waring blender to precipitate the polymer, which was filtered and vacuum dried. About 50 percent of the chloromethyl groups had been replaced with acryloyl groups. The product had the following formula:

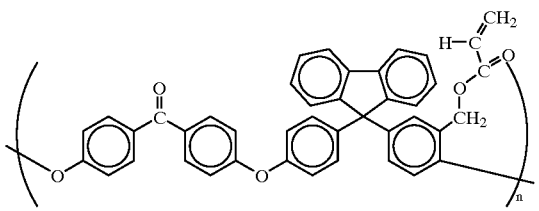

EXAMPLE XXVI

A polymer of the formula

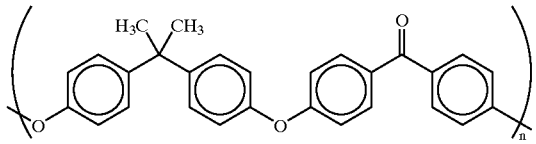

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis., 16.59 grams), bisphenol A (Aldrich 14.18 grams, 0.065 mol), potassium carbonate (21.6 grams), anhydrous N,N-dimethylacetamide (100 milliliters), and toluene (30 milliliters) were added to the flask and heated to 175° C. (oil bath temperature) while the volatile toluene component was collected and removed. After 4 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-BPA), was 12.22 grams. The polymer was analyzed by gel permeation chromatography (gpc) (elution solvent was tetrahydrofuran) with the following results: $M_n$ 5,158, $M_{peak}$ 15,080, $M_w$ 17,260, and $M_{z+1}$ 39,287. To obtain a lower molecular weight, the reaction can be repeated with a 15 mol % offset in stoichiometry.

EXAMPLE XXVII

4'-Methylbenzoyl-2,4-dichlorobenzene, of the formula

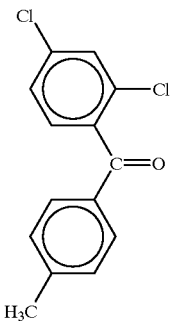

as prepared as follows. To a 2-liter flask equipped with a mechanical stirrer, argon inlet, Dean Stark trap, condenser, and stopper and situated in an oil bath was added toluene (152 grams). The oil bath temperature was raised to 130° C. and 12.5 grams of toluene were removed. There was no indication of water. The flask was removed from the oil bath and allowed to cool to 25° C. 2,4-Dichlorobenzoyl chloride (0.683 mol, 143 grams) was added to form a solution. Thereafter, anhydrous aluminum chloride (0.8175 mol, 109 grams) was added portion-wise over 15 minutes with vigorous gas evolution of hydrochloric acid as determined by odor. The solution turned orange-yellow and then red. The reaction was stirred for 16 hours under argon, and on removing the solvent, a solid lump was obtained. The mass was extracted with methylene chloride (1 liter), which was then dried over potassium carbonate and filtered. The filtrate was concentrated using a rotary evaporator and a vacuum pump to yield an oil which, upon cooling, became a solid crystalline mass. Recrystallization from methanol (1 liter) at −15° C. gave 82.3 grams of 4'-methylbenzoyl-2,4-dichlorobenzene (melting point 55–56° C.) in the first crop, 32 grams of product (from 500 milliliters of methanol) in the second crop, and 16.2 grams of product in the third crop. The total recovered product was 134.7 grams in 65.6% yield.

EXAMPLE XXVIII

Benzoyl-2,4-dichlorobenzene, of the formula

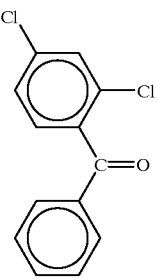

as prepared as follows. To a 2-liter flask equipped with a mechanical stirrer, argon inlet, Dean Stark trap, condenser, stopper and situated in an oil bath was added benzene (200 grams). The oil bath temperature was raised to 100° C. and 19 grams of benzene were removed. There was no indication of water. The flask was removed from the oil bath and allowed to cool to 25° C. 2,4-Dichlorobenzoyl chloride (0.683 mol, 143 grams) was added to form a solution. Thereafter, anhydrous aluminum chloride (0.8175 mol, 109 grams) was added portion-wise over 15 minutes with vigorous gas evolution. Large volumes of hydrochloric acid were evolved as determined by odor. The solution turned orange-yellow and then red. The reaction was stirred for 16 hours under argon and was then added to 1 liter of ice water in a 2-liter beaker. The mixture was stirred until it became white and was then extracted with methylene chloride (1 liter). The methylene chloride layer was dried over sodium bicarbonate and filtered. The filtrate was concentrated using a rotary evaporator and a vacuum pump to yield an oil which, upon cooling, became a solid crystalline mass (154.8 grams). Recrystallization from methanol gave 133.8 grams of benzoyl-2,4-dichlorobenzene as white needles (melting point 41–43° C.) in the first crop.

EXAMPLE XXIX 2,5-Dichlorobenzoyl chloride was prepared as follows. To a 2-liter, 3-neck round-bottom flask situated in an ice bath and equipped with an argon inlet, condenser, and mechanical stirrer was added 2,5-dichlorobenzoic acid (93.1 grams) in 400 milliliters of dichloromethane to form a slurry. Thionyl chloride (85 grams) in 68 grams of dichloromethane was then added and the mixture was stirred at 25° C. The mixture was then gradually heated and maintained at reflux for 16 hours. Thionyl chloride was subsequently removed using a Claisen distillation take-off head with heating to greater than 80° C. The reaction residue was transferred to a 500 milliliter 1-neck round bottom flask and then distilled using a Kugelrohr apparatus and a vacuum pump at between 70 and 100° C. at 0.1 to 0.3 mm mercury to obtain 82.1 grams of 2,5-dichlorobenzoyl chloride, trapped with ice bath cooling as a yellow-white solid.

EXAMPLE XXX

Benzoyl-2,5-dichlorobenzene, of the formula

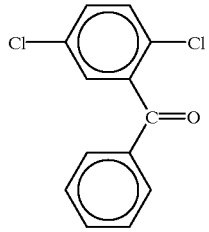

was prepared as follows. To a 2-liter flask equipped with a mechanical stirrer, argon inlet, Dean Stark trap, condenser, and stopper and situated in an oil bath was added benzene (140 grams). The oil bath temperature was raised to 100° C. and 19 grams of benzene were removed. There was no indication of water. The flask was removed from the oil bath and allowed to cool to 25° C. 2,5-Dichlorobenzoyl chloride (92.6 grams), prepared as described in Example XXIX, was added to form a solution. Thereafter, anhydrous aluminum chloride (0.8175 mol, 109 grams) was cautiously added portion-wise over 15 minutes with vigorous gas evolution. Large volumes of hydrochloric acid were evolved as determined by odor. The solution turned orange-yellow and then red. The reaction was stirred for 16 hours under argon and was then added to 1 liter of ice water in a 2-liter beaker. The mixture was stirred until it became white and was then extracted with methylene chloride (1 liter). The methylene chloride layer was dried over sodium bicarbonate and filtered. The filtrate was concentrated using a rotary evaporator and a vacuum pump to yield crystals (103.2 grams). Recrystallization from methanol gave benzoyl-2,5-dichlorobenzene as white needles (melting point 85–87° C.).

EXAMPLE XXXI

4'-Methylbenzoyl-2,5-dichlorobenzene, of the formula

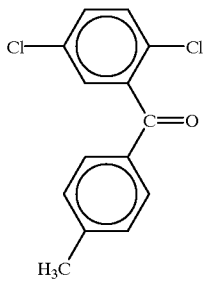

was prepared as follows. To a 2-liter flask equipped with a mechanical stirrer, argon inlet, Dean Stark trap, condenser, and stopper and situated in an oil both was added toluene (200 grams). Thereafter, anhydrous aluminum chloride (64 grams) was cautiously added portion-wise over 15 minutes with vigorous gas evolution. Large volumes of hydrochloric acid were evolved as determined by odor. The solution turned orange-yellow and then red. The reaction was stirred for 16 hours under argon and was then added to 1 liter of ice water in a 2-liter beaker. The mixture was stirred until it became white and was then extracted with methylene chloride (1 liter). The methylene chloride layer was dried over sodium bicarbonate and filtered. The filtrate was concentrated using a rotary evaporator and a vacuum pump to yield crystals. Recrystallization from methanol gave 37.6 grams of 4'-methylbenzoyl-2,5-dichlorobenzene as light-yellow needles (melting point 107–108° C.).

EXAMPLE XXXII

A polymer of the formula

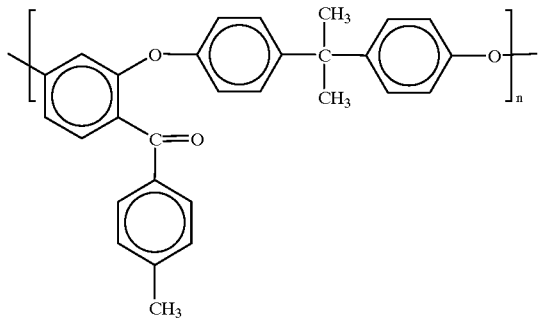

wherein n represents the number of repeating monomer units was prepared as follows. A 250 milliliter, 3-neck round-bottom flask equipped with a Dean-Stark (Barrett) trap, condenser, mechanical stirrer, argon inlet, and stopper was situated in a silicone oil bath. 4'-Methylbenzoyl-2,4-dichlorobenzene (0.0325 mol, 8.6125 grams, prepared as described in Example XXVII), bis-phenol A (Aldrich 23,965-8, 0.035 mol, 7.99 grams), potassium carbonate (10.7 grams), anhydrous N,N-dimethylacetamide (60 milliliters), and toluene (60 milliliters, 49.1 grams) were added to the flask and heated to 175° C. (oil bath temperature) while the volatile toluene component was collected and removed. After 24 hours of heating at 175° C. with continuous stirring, the reaction product was filtered and the filtrate was added to methanol to precipitate the polymer. The wet polymer cake was isolated by filtration, washed with water, then washed with methanol and thereafter vacuum dried. The polymer (7.70 grams, 48% yield) was analyzed by gel permeation chromatography (gpc) (elution solvents was tetrahydrofuran) with the following results: $M_n$ 1,898, $M_{peak}$ 2,154, $M_w$ 2,470, $M_z$ 3,220, and $M_{z+1}$ 4,095.

EXAMPLE XXXIII

A polymer of the formula

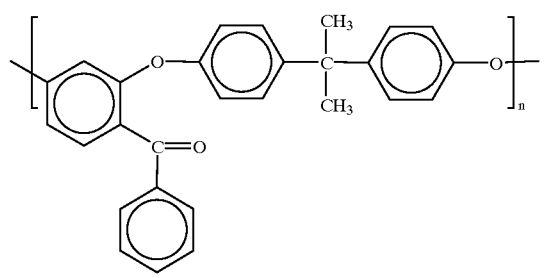

wherein n represents the number of repeating monomer units was prepared by repeating the process of Example XXXII except that the 4'-methylbenzoyl-2,4-dichlorobenzene starting material was replaced with 8.16 grams (0.0325 mol) of benzoyl-2,4-dichlorobenzene, prepared as described in Example XXVIII, and the oil bath was heated to 170° C. for 24 hours.

EXAMPLE XXXIV

The process of Example XII is repeated except that the poly(4-CPK-BPA) is replaced with the polymer prepared as described in Example XXVI. It is believed that similar results will be obtained.

EXAMPLE XXXV

The process of Example XII is repeated except that the poly(4-CPK-BPA) is replaced with the polymer prepared as described in Example XXVII. It is believed that similar results will be obtained.

Other embodiments and modifications of the present invention may occur to those skilled in the art subsequent to a review of the information presented herein; these embodiments and modifications, as well as equivalents thereof, are also included within the scope of this invention.

What is claimed is:

1. A process which comprises the steps of (a) providing a composition which comprises a mixture of (A) a first component comprising a polymer having terminal end groups and monomer repeat units, at least some of said monomer repeat units having at least one photosensitivity-imparting group thereon which enables crosslinking or chain extension of the polymer upon exposure to actinic radiation, said polymer having a first degree of photosensitivity-imparting group substitution measured in milliequivalents of photosensitivity-imparting group per gram of polymer, said polymer having monomer repeat units (a) of the general formula

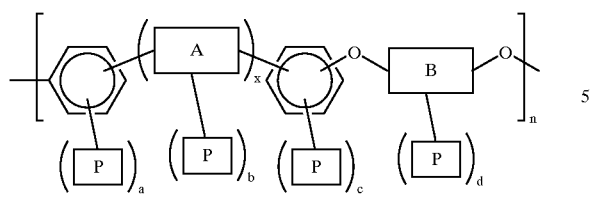

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

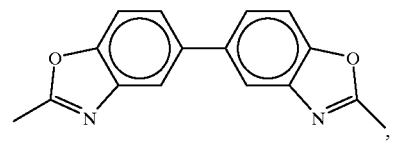

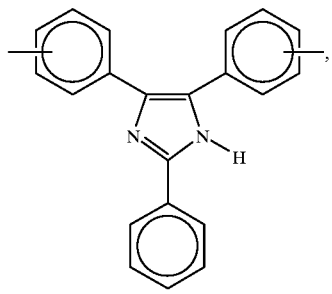

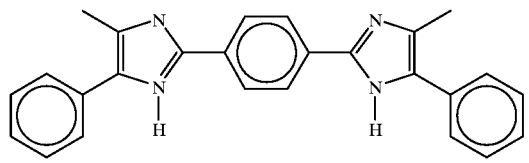

or mixtures thereof, B is

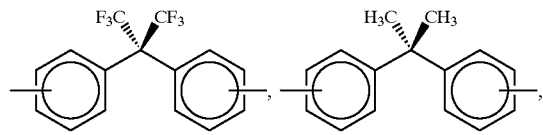

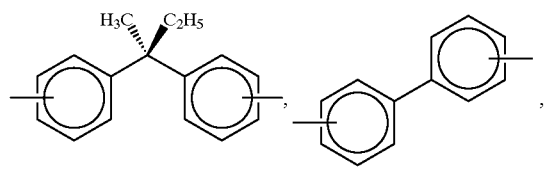

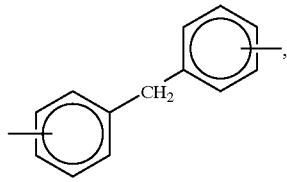

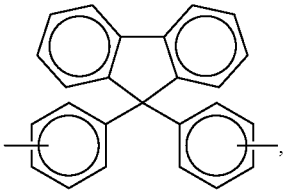

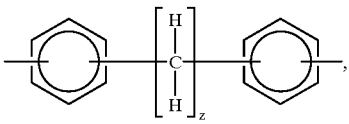

wherein z is an integer of from 2 to about 20,

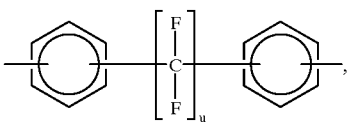

wherein u is an integer of from 1 to about 20,

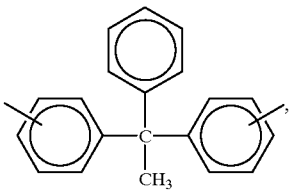

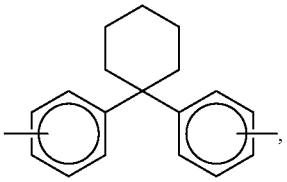

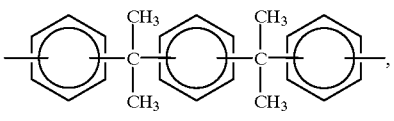

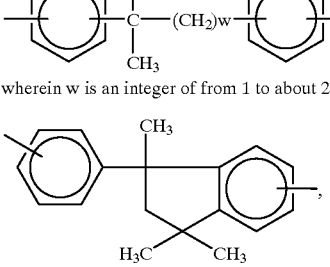

wherein w is an integer of from 1 to about 20,

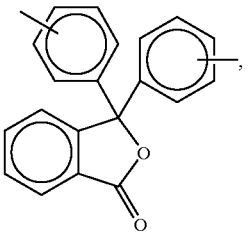

-continued

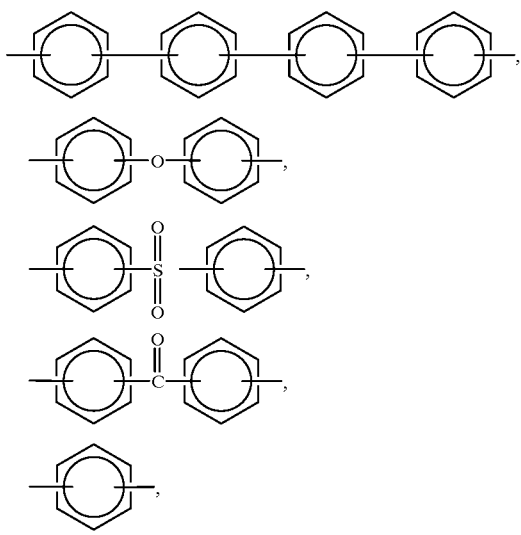

or mixtures thereof, and n is an integer representing the number of repeating monomer units; (b) of the general formula

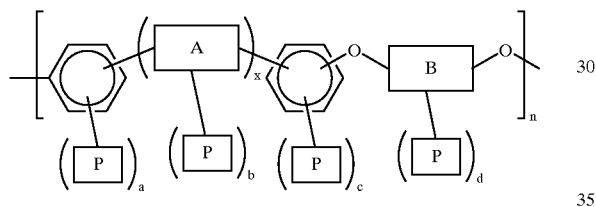

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

, —O— , or mixtures thereof, B is

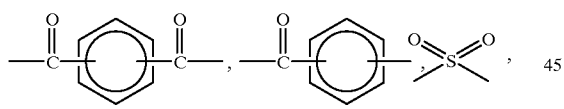

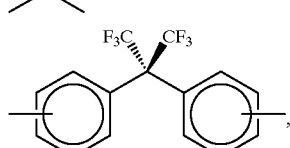

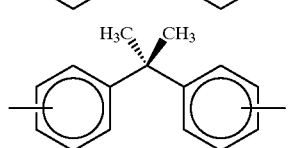

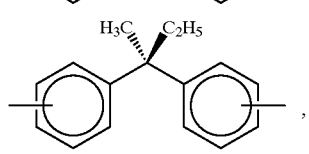

-continued

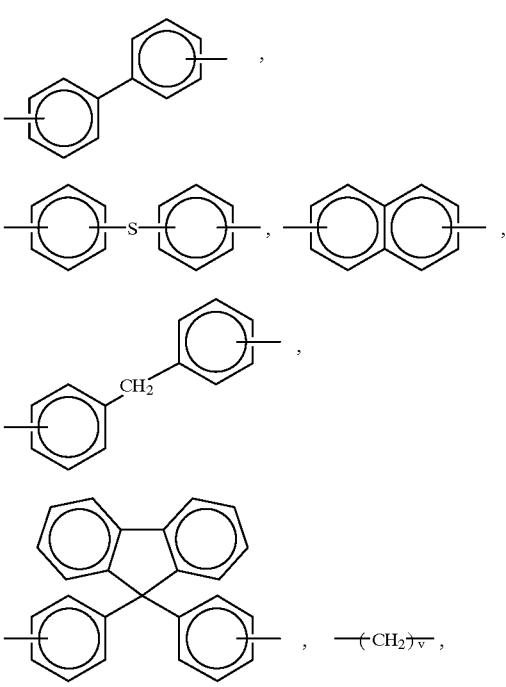

wherein v is an integer of from 1 to about 20,

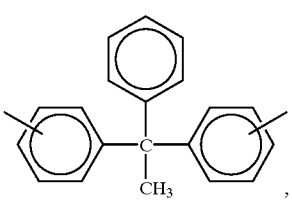

wherein u is an integer of from 1 to about 20,

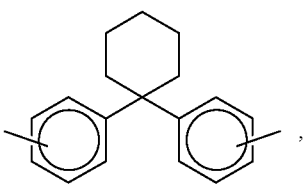

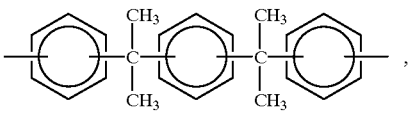

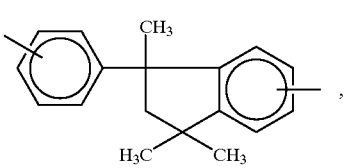

-continued

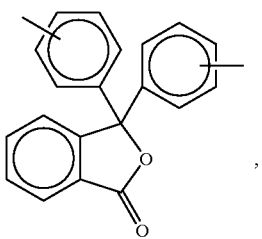

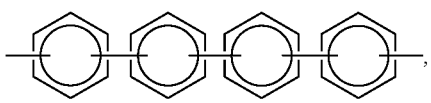

or mixtures thereof, and n is an integer representing the number of repeating monomer units; (c) of the general formula

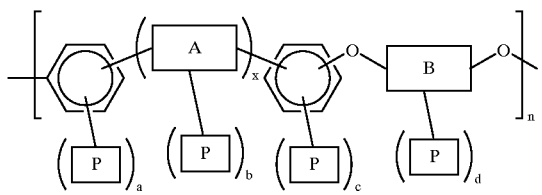

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is B is

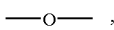

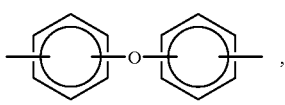

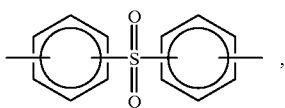

or mixtures thereof, and n is an integer representing the number of repeating monomer units; (d) of the general formula

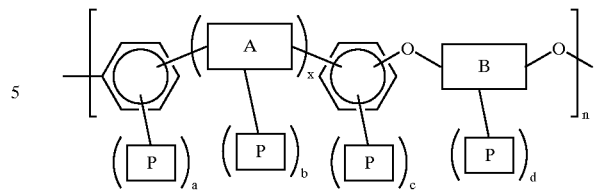

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

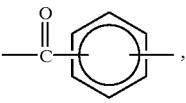

B is

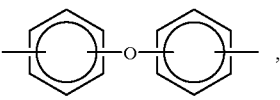

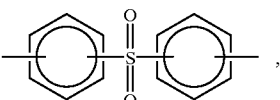

or mixtures thereof, and n is an integer representing the number of repeating monomer units; (e) of the general formula

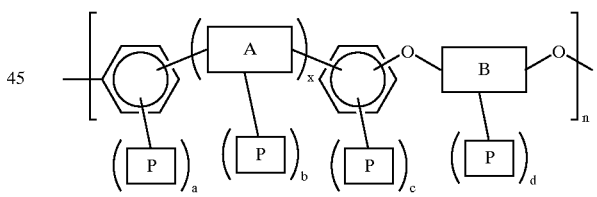

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

B is

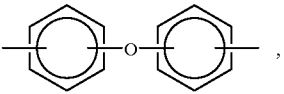

-continued

or mixtures thereof, and n is an integer representing the number of repeating monomer units; (f) of the general formula

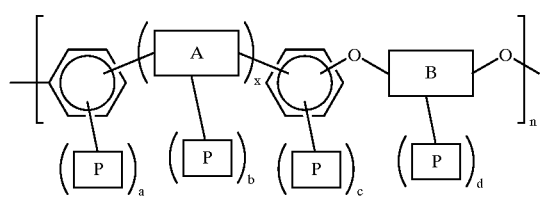

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

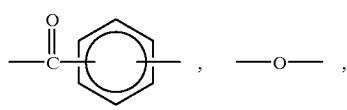

or mixtures thereof, B is

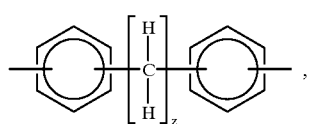

wherein z is an integer of from 2 to about 20,

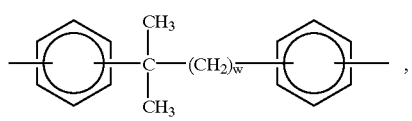

wherein w is an integer of from 1 to about 20, or mixtures thereof, and n is an integer representing the number of repeating monomer units; (g) of the general formula

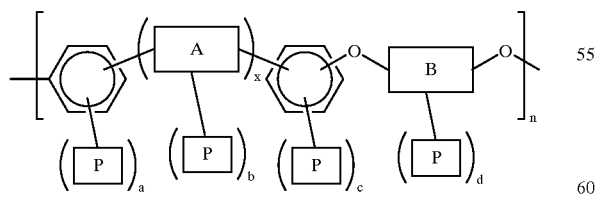

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

—C(CH$_3$)$_2$—,

B is

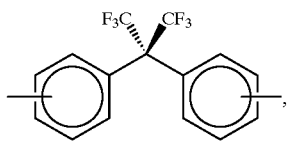

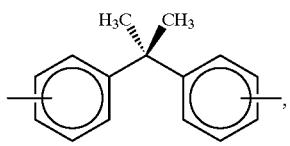

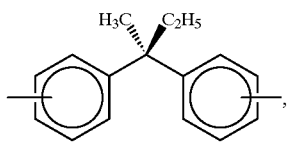

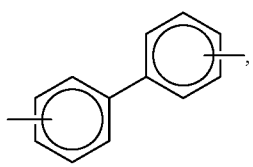

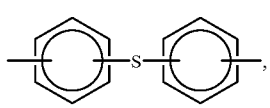

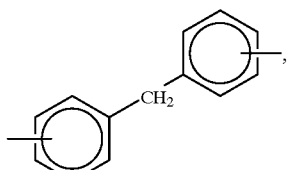

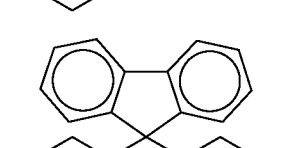

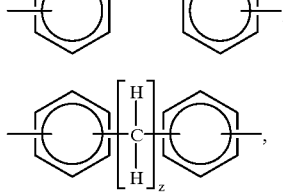

wherein z is an integer of from 2 to about 20,

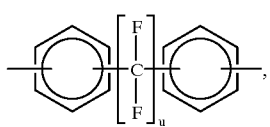

wherein u is an integer of from 1 to about 20,

-continued

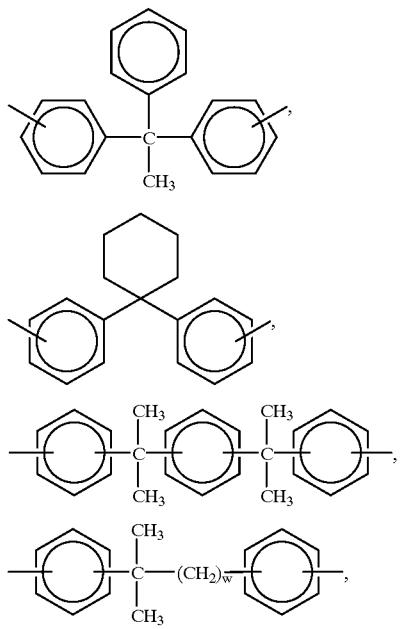

wherein w is an integer of from 1 to about 20,

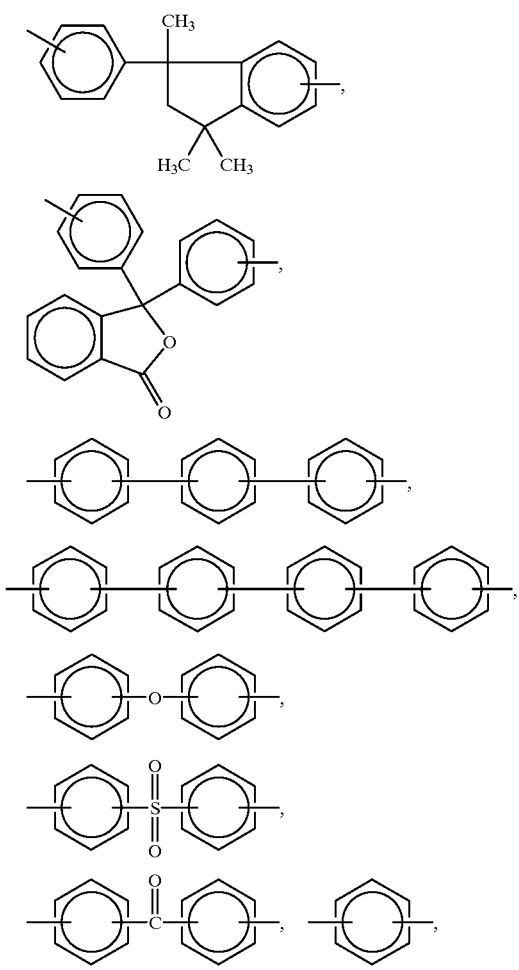

or mixtures thereof, and n is an integer representing the number of repeating monomer units; or (h) of the general formula

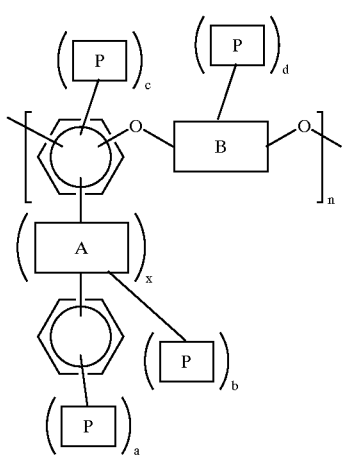

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

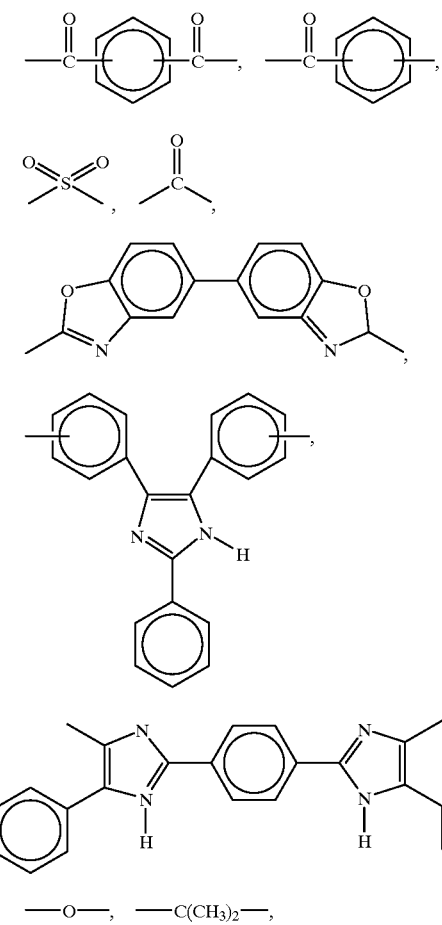

—O—, —C(CH$_3$)$_2$—, or mixtures thereof, B is

-continued

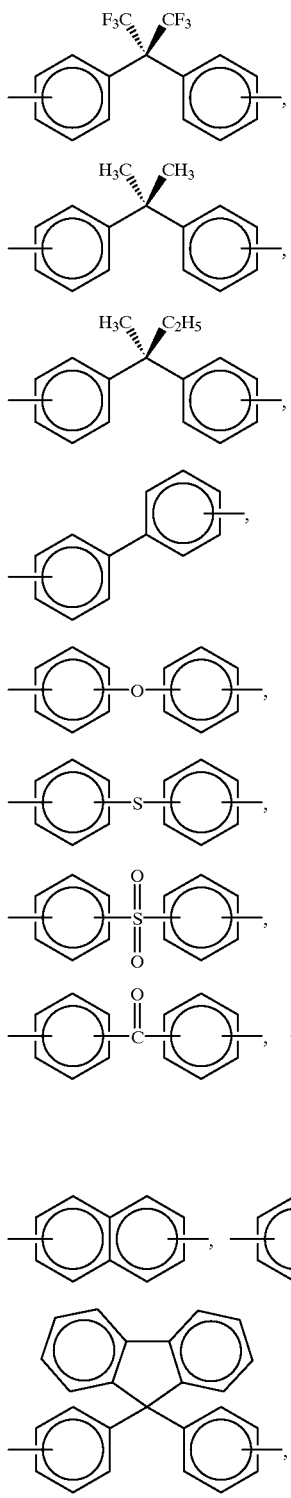

wherein v is an integer of from 1 to about 20,

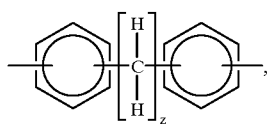

wherein z is an integer of from 2 to about 20,

-continued

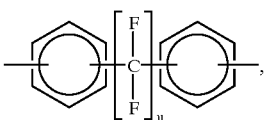

wherein u is an integer of from 1 to about 20,

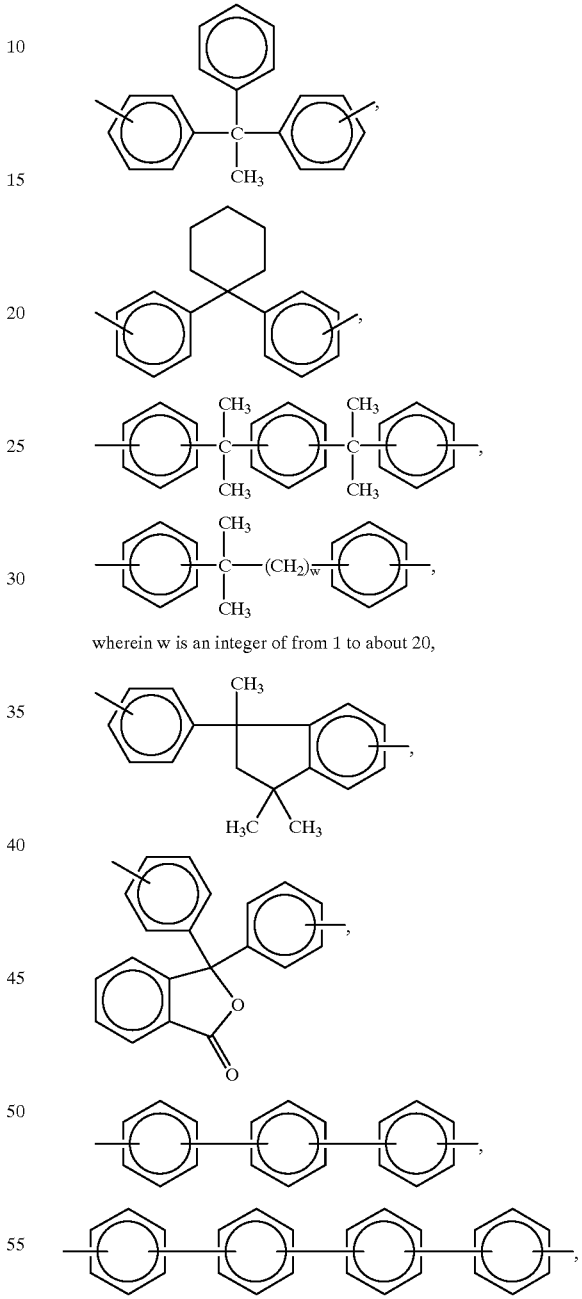

wherein w is an integer of from 1 to about 20, or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram of mixture which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram of reactive diluent, wherein the mixture of the first component and the second component has a fifth degree of photosensitivity-imparting group substitution measured in milliequivalents of photosensitivity-imparting group per gram of mixture which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture; and (b) causing the first component polymer to become crosslinked or chain extended through the photosensitivity-imparting groups.

2. A process according to claim 1 wherein crosslinking or chain extension is effected by heating the polymer to a temperature sufficient to enable the photosensitivity-imparting groups to form crosslinks or chain extensions in the polymer.

3. A process according to claim 1 wherein crosslinking or chain extension is effected by exposing the polymer to actinic radiation such that the polymer in exposed areas becomes crosslinked or chain extended.

4. A process according to claim 3 wherein the composition is exposed in an imagewise pattern such that the polymer in exposed areas becomes crosslinked or chain extended and the polymer in unexposed areas does not become crosslinked or chain extended, and wherein subsequent to exposure, the polymer in the unexposed areas is removed from the crosslinked or chain extended polymer, thereby forming an image pattern.

5. A process according to claim 1 wherein A is

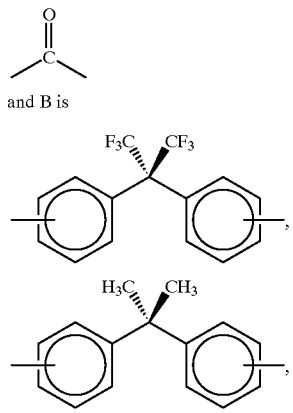

and B is

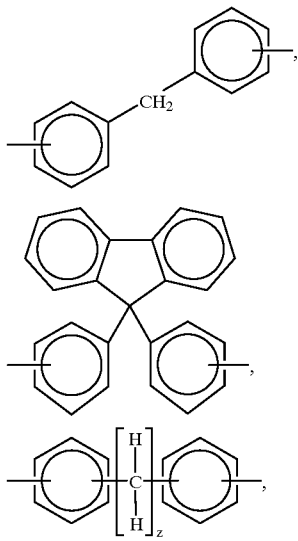

wherein z is an integer of from 2 to about 20, or a mixture thereof.

6. A process according to claim 1 wherein prior to admixing the first and second components the first component polymer is admixed with a solvent to form a solution containing from about 30 to about 60 percent by weight of the polymer, followed by filtration of the solution through a 2 micron nylon filter cloth under positive pressure.

7. A process according to claim 1 wherein the first component polymer has end groups derived from the "A" groups of the polymer.

8. A process according to claim 1 wherein the first component polymer has end groups derived from the "B" groups of the polymer.

9. A process which comprises the steps of (a) providing a composition which comprises a mixture of (A) a first component comprising a polymer having terminal end groups and monomer repeat units, at least some of the monomer repeat units of which have at least one photosensitivity-imparting group thereon, said polymer having a first degree of photosensitivity-imparting group substitution measured in milliequivalents of photosensitivity-imparting group per gram of polymer and being of the general formula

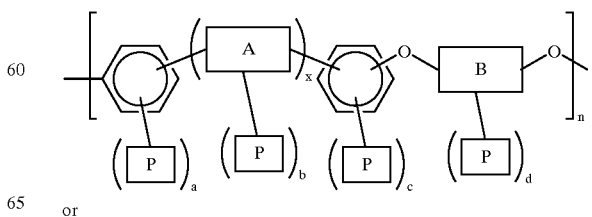

or

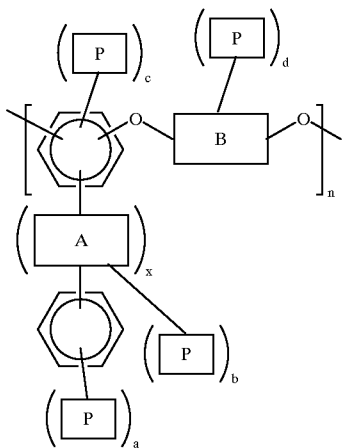

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

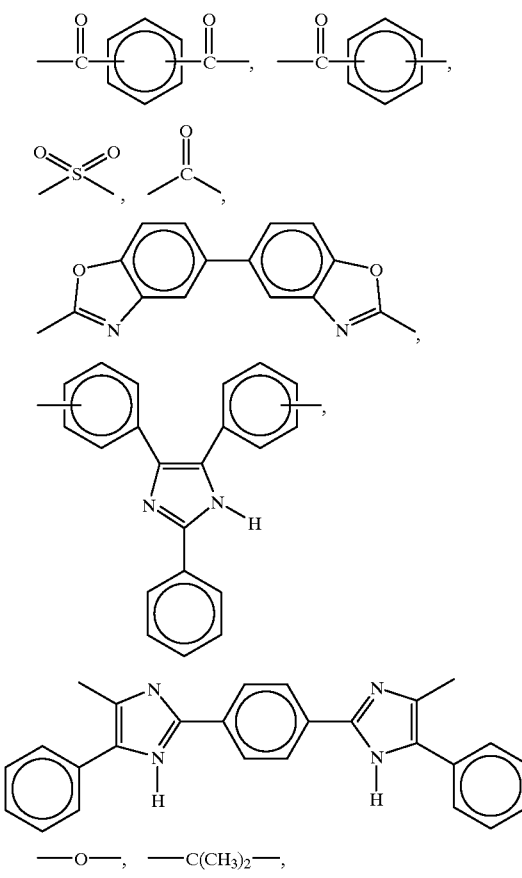

or mixtures thereof, B is

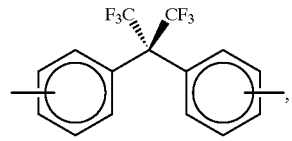

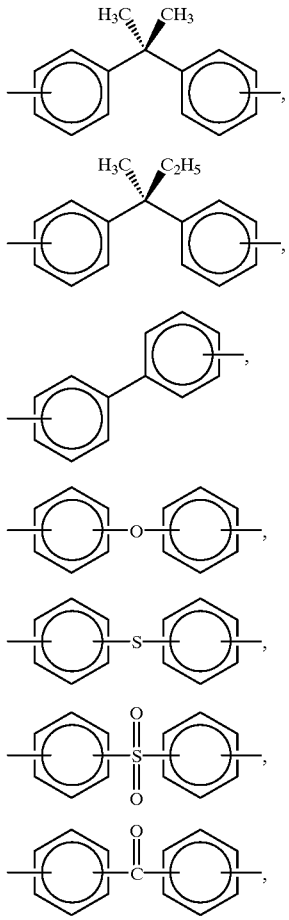

wherein v is an integer of from 1 to about 20,

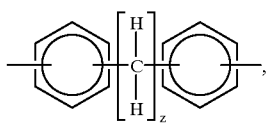

wherein z is an integer of from 2 to about 20,

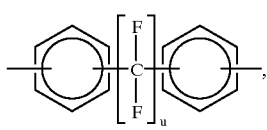

wherein u is an integer of from 1 to about 20,

-continued

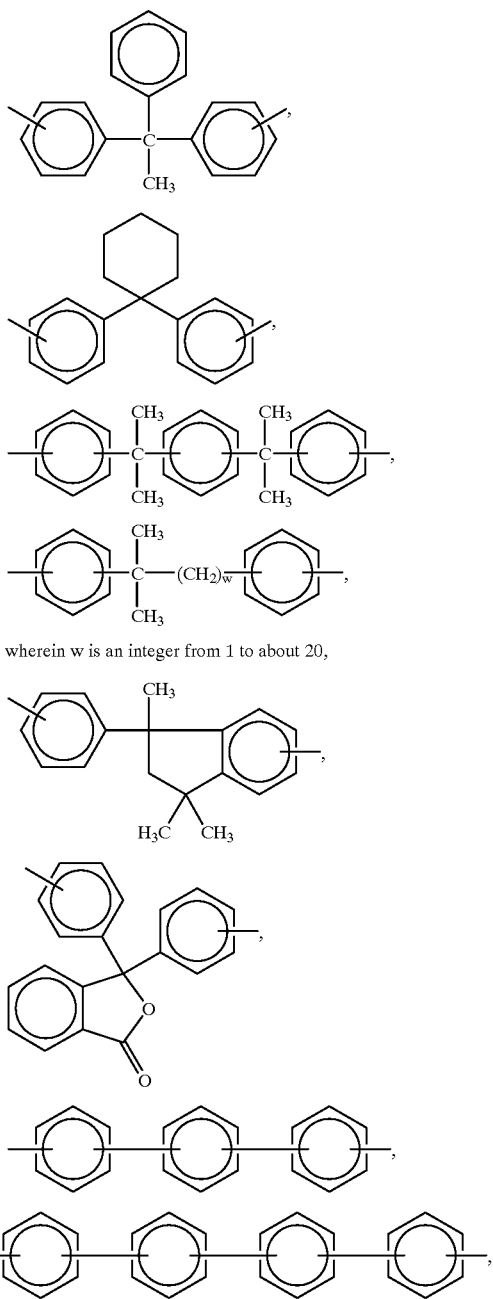

wherein w is an integer from 1 to about 20, or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram of mixture which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture; and (b) causing the first component polymer to become crosslinked or chain extended through the photosensitivity-imparting groups, wherein crosslinking or chain extension is effected by exposing the polymer to actinic radiation such that the polymer in exposed areas becomes crosslinked or chain extended, wherein the composition is exposed in an imagewise pattern such that the polymer in exposed areas becomes crosslinked or chain extended and the polymer in unexposed areas does not become crosslinked or chain extended, and wherein subsequent to exposure, the polymer in the unexposed areas is removed from the crosslinked or chain extended polymer, thereby forming an image pattern, further comprising the steps of:

(a) depositing a layer comprising the polymer-containing composition onto a lower substrate in which one surface thereof has an array of heating elements and addressing electrodes having terminal ends formed thereon, said polymer being deposited onto the surface having the heating elements and addressing electrodes thereon;

(b) exposing the layer to actinic radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;

(c) removing the polymer from the unexposed areas, thereby forming recesses in the layer, said recesses exposing the heating elements and the terminal ends of the addressing electrodes;

(d) providing an upper substrate with a set of parallel grooves for subsequent use as ink channels and a recess for subsequent use as a manifold, the grooves being open at one end for serving as droplet emitting nozzles; and (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

10. A process according to claim 9 wherein A is

and B is

-continued

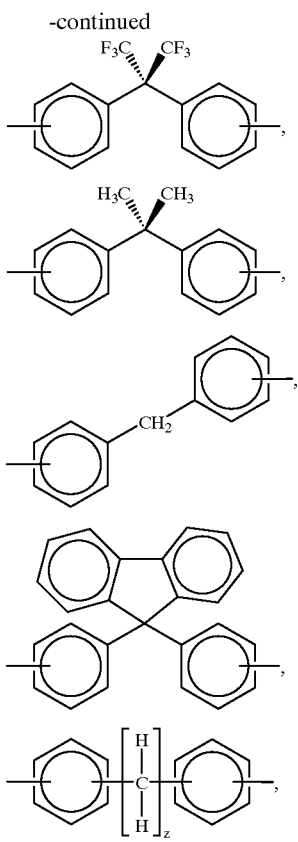

wherein z is an integer of from 2 to about 20, or a mixture thereof.

11. A process according to claim 9 wherein the first component polymer has end groups derived from the "A" groups of the polymer.

12. A process according to claim 9 wherein the first component polymer has end groups derived from the "B" groups of the polymer.

13. A process for preparing a photocurable composition having uniform weight average molecular weight and a uniform degree of unsaturated ester substitution, said process comprising the steps of:

(a) providing a first component comprising a polymer having terminal end groups and monomer repeat units, at least some of the monomer repeat units of which have at least one photosensitivity-imparting group thereon, said polymer having a first degree of photosensitivity-imparting group substitution measured in milliequivalents of photosensitivity-imparting group per gram of polymer and being (A) of the general formula

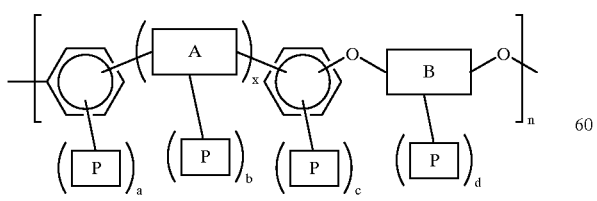

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

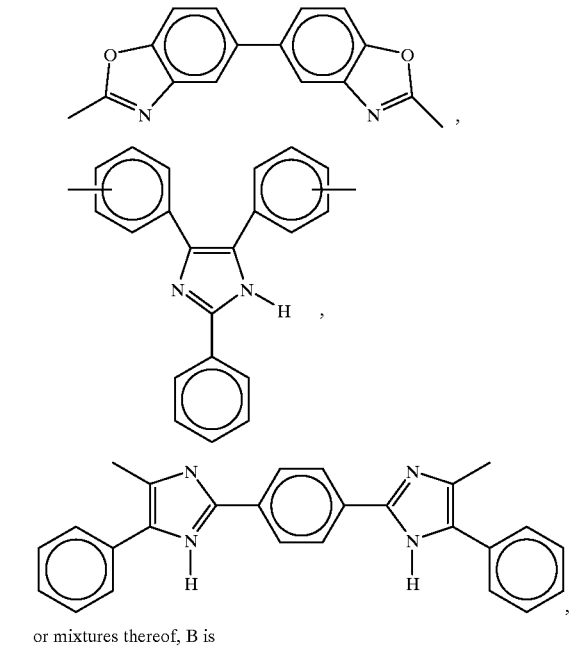

or mixtures thereof, B is

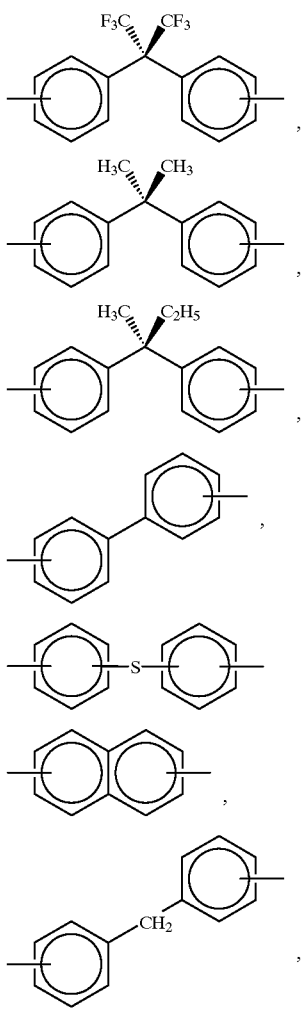

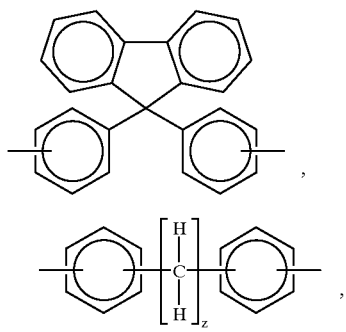

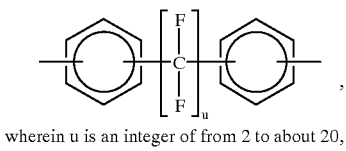

wherein z is an integer of from 2 to about 20,

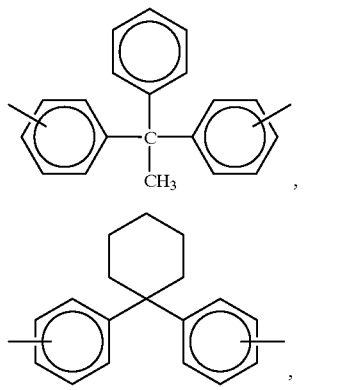

wherein u is an integer of from 2 to about 20,

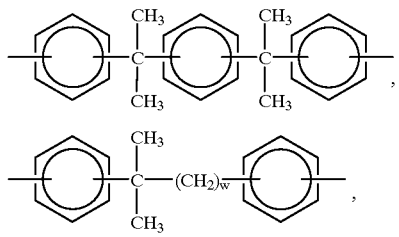

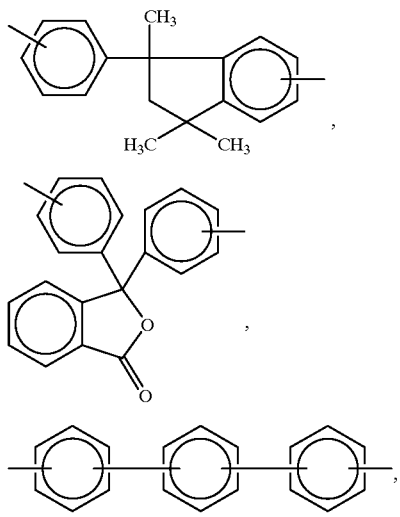

wherein w is an integer of from 1 to about 20,

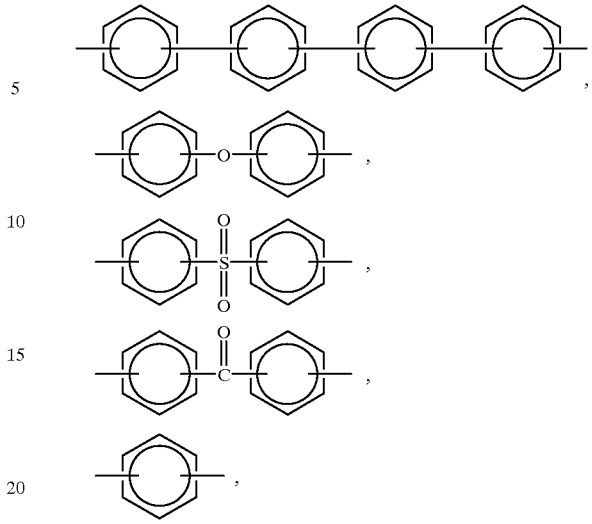

or mixtures thereof, and n integer representing the number of repeating monomer units; (b) of the general formula

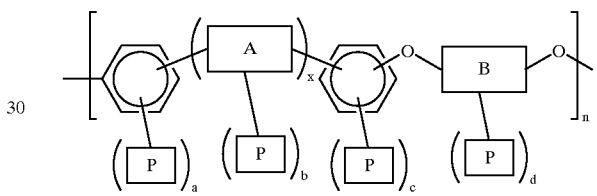

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

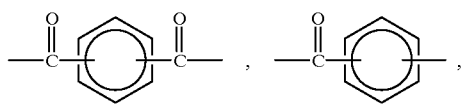

or mixtures thereof, B is

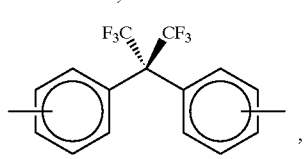

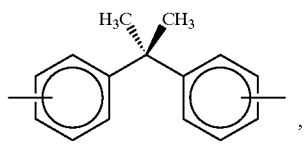

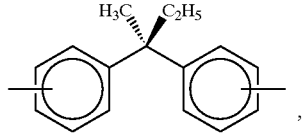

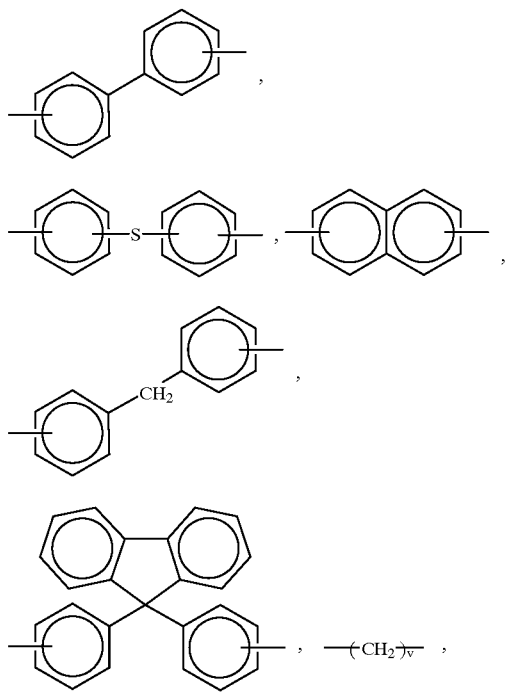

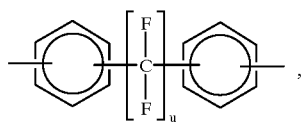

wherein v is an integer of from 1 to about 20,

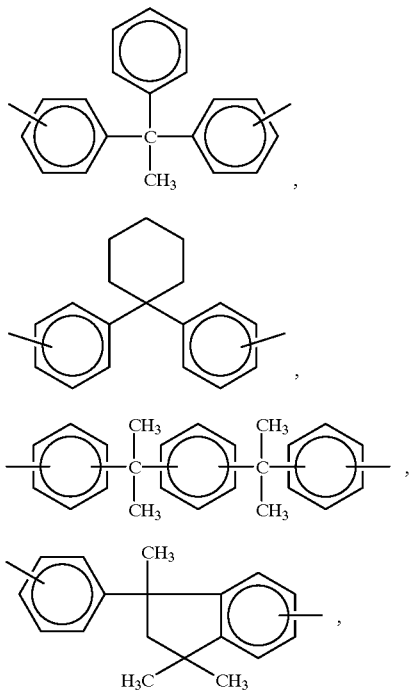

wherein u is an integer of from 1 to about 20,

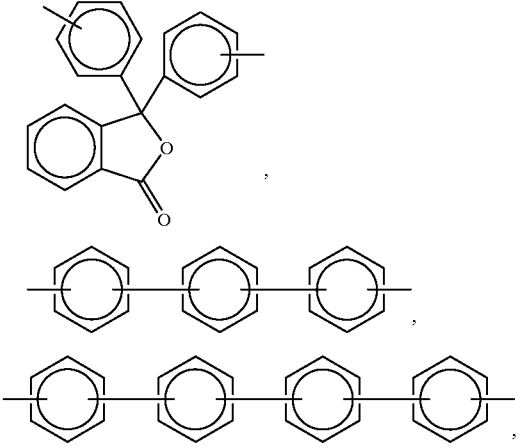

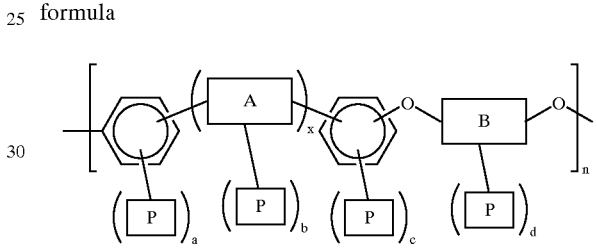

or mixtures thereof, and n is an integer representing the number of repeating monomer units; (c) of the general formula

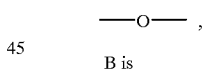

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

—O—,

B is or mixtures thereof, and n is an integer representing the number of repeating monomer units; (d) of the general formula

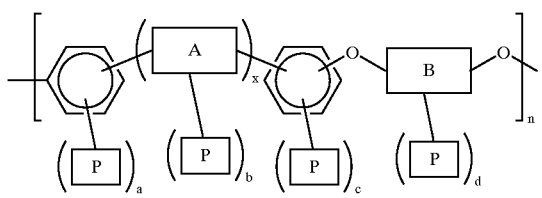

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

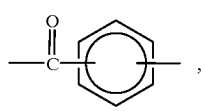,

B is

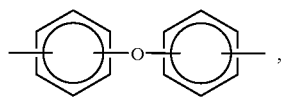,

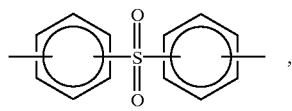,

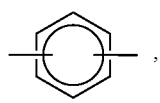, or mixtures thereof, and n is an integer representing the number of repeating monomer units; (e) of the general formula

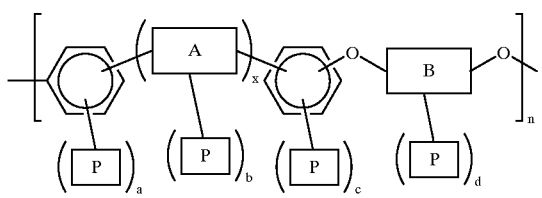

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

B is

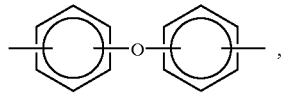,

-continued

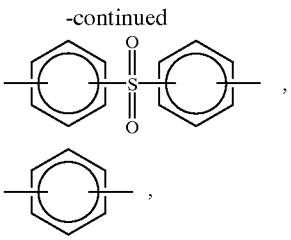

or mixtures thereof, and n is an integer representing the number of repeating monomer units; (f) of the general formula

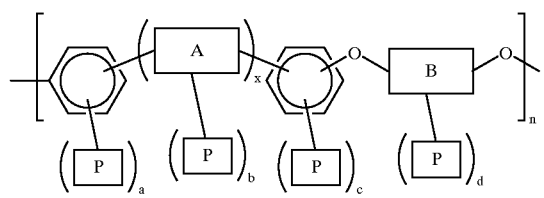

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

, —O—, or mixtures thereof, B is

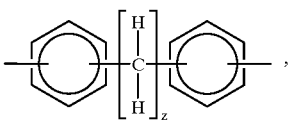, wherein z is an integer of from 2 to about 20,

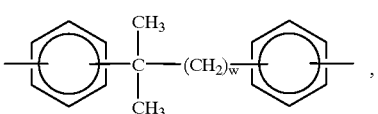, wherein w is an integer of from 1 to about 20, or mixtures thereof, and n is an integer representing the number of repeating monomer units; (g) of the general formula

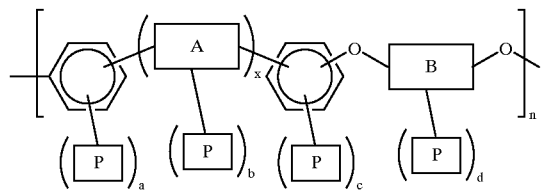

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is —C(CH₃)₂—,
B is
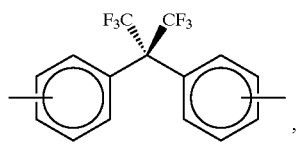
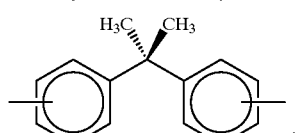
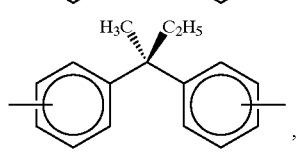
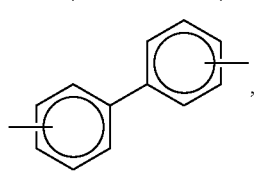
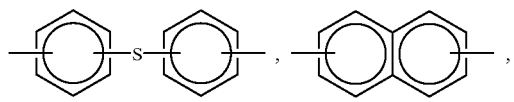
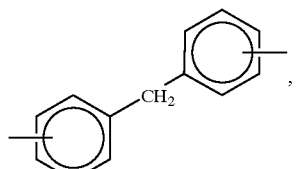
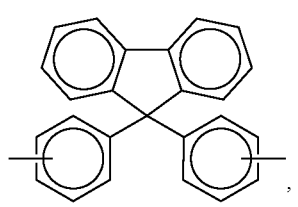
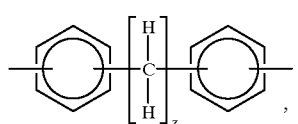
wherein z is an integer of from 2 to about 20,
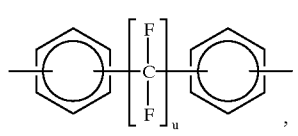
wherein u is an integer of from 1 to about 20,
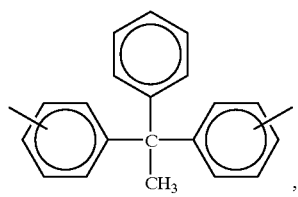
-continued
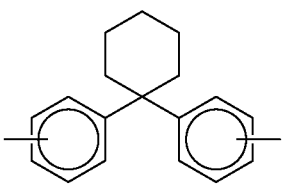
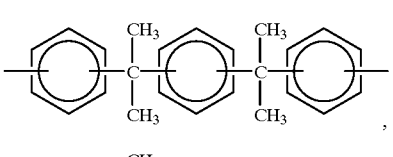
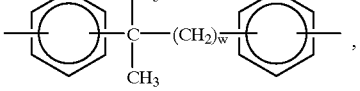
wherein w is an integer of from 1 to about 20,
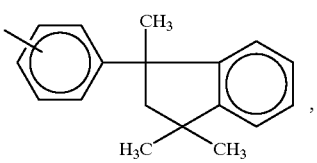
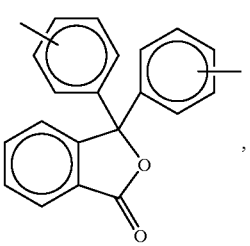
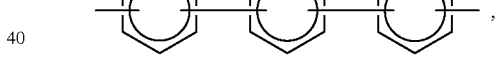
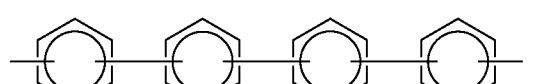
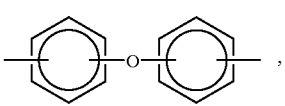
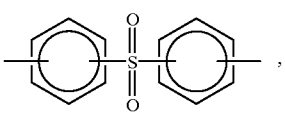
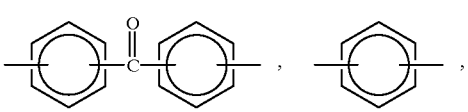
or mixtures thereof, and n is an integer representing the number of repeating monomer units; or (h) of the general formula

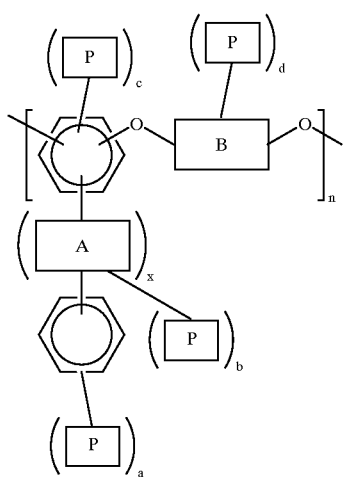

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

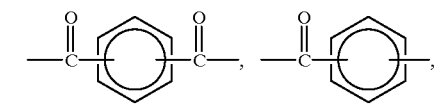

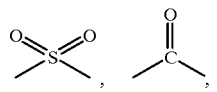

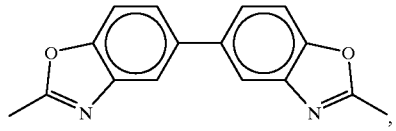

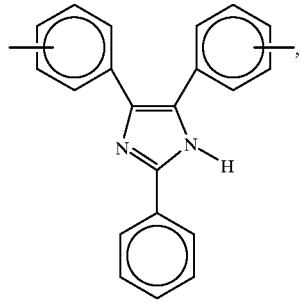

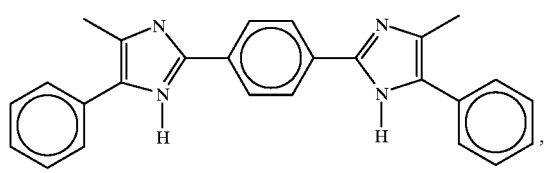

or mixtures thereof, B is

-continued

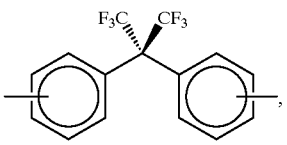

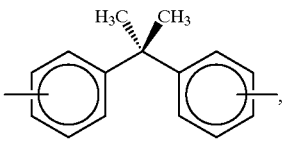

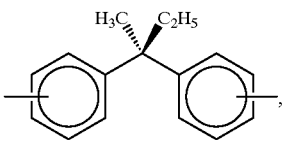

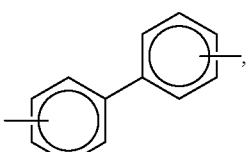

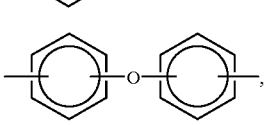

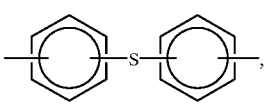

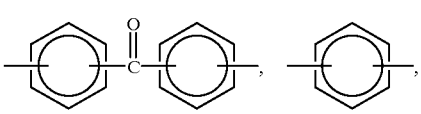

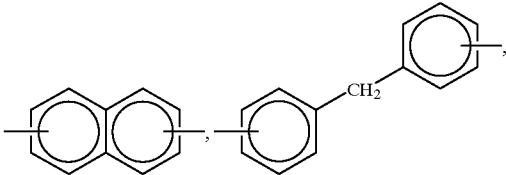

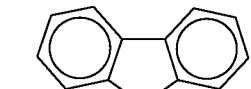

wherein v is an integer of from 1 to about 20,

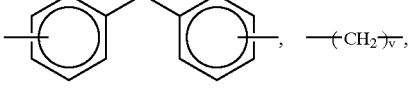

wherein z is an integer of from 2 to about 20,

-continued

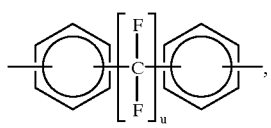

wherein u is an integer of from 1 to about 20,

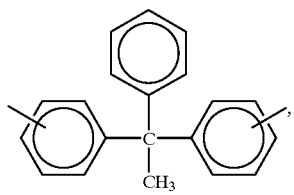

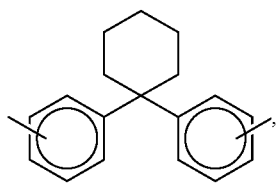

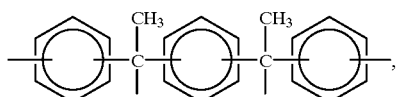

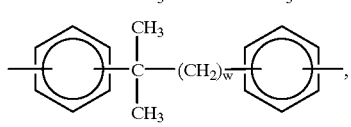

wherein w is an integer of from 1 to about 20,

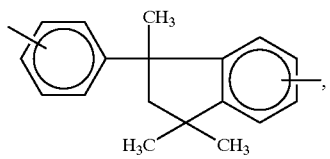

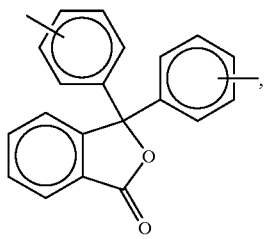

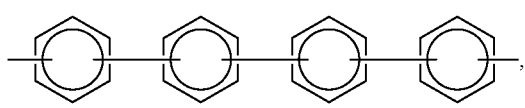

or mixtures thereof, and n is an integer representing the number of repeating monomer units;

(b) providing a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, or (2) a reactive diluent having at least one photosensitivity-imparting group per molecule and having a fourth degree of photosensitivity-imparting group substitution measured in milliequivalents of photosensitivity-imparting group per gram; and (c) admixing the first component and the second component in relative amounts to result in either (1) a mixture of the first component and the polymer having a second degree of photosensitivity-imparting group substitution, said mixture having a third degree of photosensitivity-imparting group substitution which is lower than the first degree of photosensitivity-imparting group substitution and higher than the second degree of photosensitivity-imparting group substitution, or (2) a mixture of the first component and the reactive diluent having at least one photosensitivity-imparting group per molecule and having a fourth degree of photosensitivity-imparting group substitution, said mixture having a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; said mixture having a weight average molecular weight of from about 10,000 to about 50,000, wherein the third or fifth degree of photosensitivity-imparting group substitution is from about 0.25 to about 2 milliequivalents of photosensitivity-imparting groups per gram of mixture, further comprising the step of causing the first component polymer to become crosslinked or chain extended through the photosensitivity-imparting groups, wherein crosslinking or chain extension is effected by heating the polymer to a temperature sufficient to enable the photosensitivity-imparting groups to form crosslinks or chain extensions in the polymer.

14. A process for preparing a photocurable composition having uniform weight average molecular weight and a uniform degree of photosensitivity-imparting group substitution, said process comprising the steps of:

(a) providing a first component comprising a polymer having terminal end groups and monomer repeat units, at least some of said monomer repeat units having at least one photosensitivity-imparting group thereon which enables crosslinking or chain extension of the polymer upon exposure to actinic radiation, said polymer having a first degree of photosensitivity-imparting group substitution measured in milliequivalents of photosensitivity-imparting group per gram of polymer, said polymer having monomer repeat units of the formula

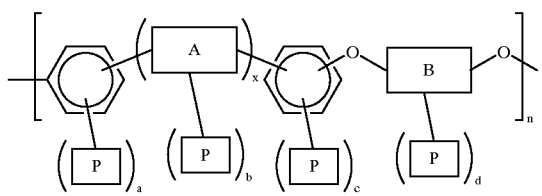

or

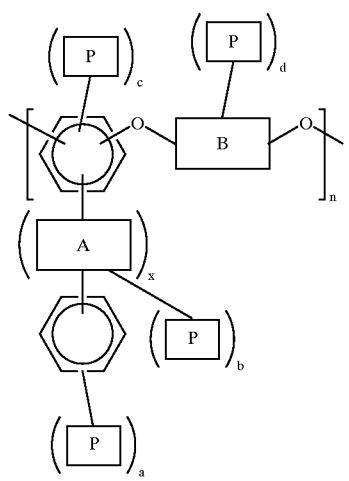
wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is
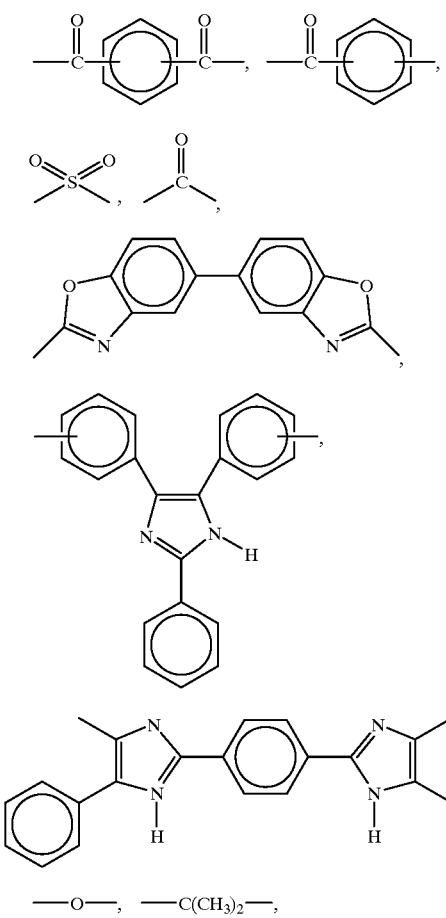
or mixtures thereof, B is
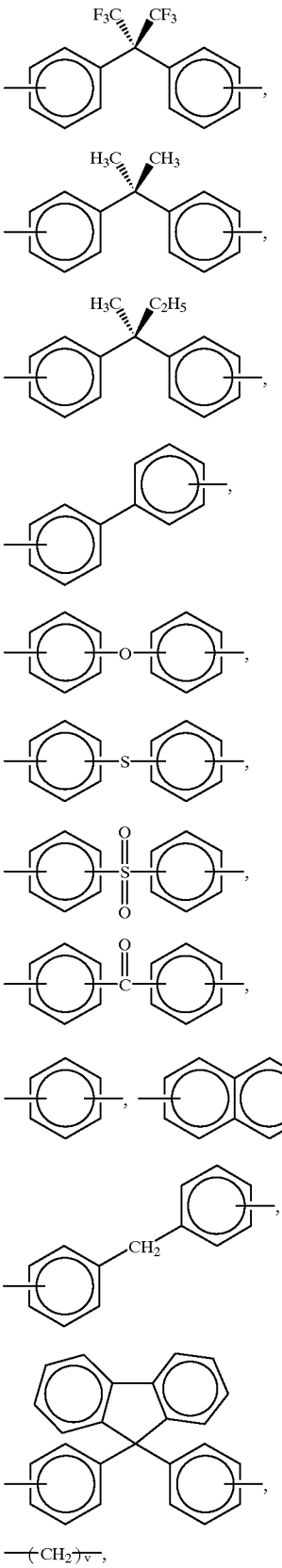
wherein v is an integer of from 1 to about 20, -continued

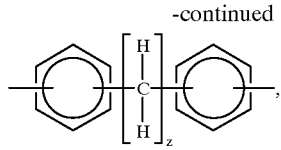

wherein z is an integer of from 2 to about 20,

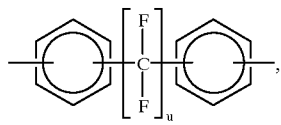

wherein u is an integer of from 1 to about 20,

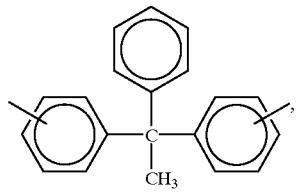

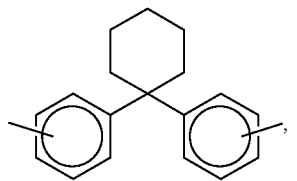

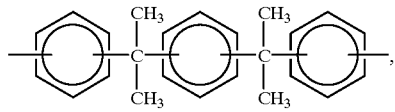

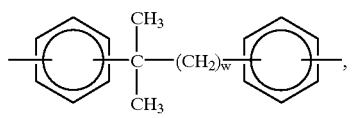

wherein w is an integer of from 1 to about 20,

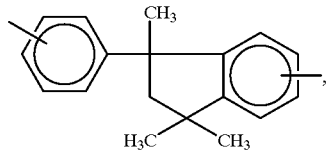

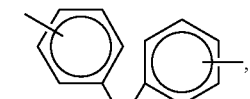

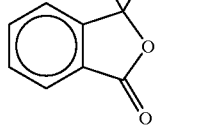

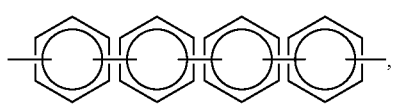

or mixtures thereof, and n is an integer representing the number of repeating monomer units;

(b) providing a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, or (2) a reactive diluent having at least one photosensitivity-imparting group per molecule and having a fourth degree of photosensitivity-imparting group substitution measured in milliequivalents of photosensitivity-imparting group per gram of reactive diluent; and (c) admixing the first component and the second component in relative amounts to result in either (1) a mixture of the first component and the polymer having a second degree of photosensitivity-imparting group substitution, said mixture having a third degree of photosensitivity-imparting group substitution measured in milliequivalents of photosensitivity-imparting group per gram of mixture which is lower than the first degree of photosensitivity-imparting group substitution and higher than the second degree of photosensitivity-imparting group substitution, or (2) a mixture of the first component and the reactive diluent having at least one photosensitivity-imparting group per molecule and having a fourth degree of photosensitivity-imparting group substitution, said mixture having a fifth degree of photosensitivity-imparting group substitution measured in milliequivalents of photosensitivity-imparting group per gram of mixture which is higher than the first degree of photosensitivity-imparting group substitution and lower than the fourth degree of photosensitivity-imparting group substitution; said mixture having a weight average molecular weight of from about 10,000 to about 50,000, wherein the third or fifth degree of photosensitivity-imparting group substitution is from about 0.25 to about 2 milliequivalents of photosensitivity-imparting groups per gram of mixture; further comprising the step of causing the first component polymer to become crosslinked or chain extended through the photosensitivity-imparting groups, wherein crosslinking or chain extension is effected by exposing the polymer to actinic radiation such that the polymer in exposed areas becomes crosslinked or chain extended, wherein the composition is exposed in an imagewise pattern such that the polymer in exposed areas becomes crosslinked or chain extended and the polymer in unexposed areas does not become crosslinked or chain extended, and wherein subsequent to exposure, the polymer in the unexposed areas is removed from the crosslinked or chain extended polymer, thereby forming an image pattern, further comprising the steps of:

(a) depositing a layer comprising the polymer-containing composition onto a lower substrate in which one surface thereof has an array of heating elements and addressing electrodes having terminal ends formed thereon, said polymer being deposited onto the surface having the heating elements and addressing electrodes thereon;

(b) exposing the layer to actinic radiation in an imagewise pattern such that the polymer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes;

(c) removing the polymer from the unexposed areas, thereby forming recesses in the layer, said recesses exposing the heating elements and the terminal ends of the addressing electrodes;

(d) providing an upper substrate with a set of parallel grooves for subsequent use as ink channels and a recess for subsequent use as a manifold, the grooves being open at one end for serving as droplet emitting nozzles; and (e) aligning, mating, and bonding the upper and lower substrates together to form a printhead with the grooves in the upper substrate being aligned with the heating elements in the lower substrate to form droplet emitting nozzles, thereby forming a thermal ink jet printhead.

15. A process according to claim 14 wherein A is

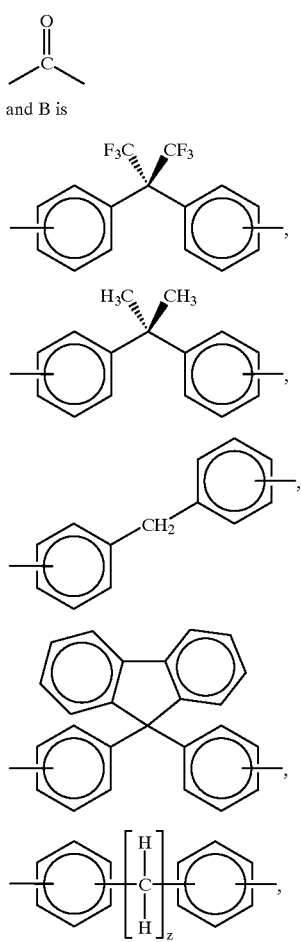

and B is wherein z is an integer of from 2 to about 20, or a mixture thereof.

16. A process according to claim 14 wherein the first component polymer has end groups derived from the "A" groups of the polymer.

17. A process according to claim 14 wherein the first component polymer has end groups derived from the "B" groups of the polymer.

18. A process according to claim 14 wherein prior to admixing the first and second components the first component polymer is admixed with a solvent to form a solution containing from about 30 to about 60 percent by weight of the polymer, followed by filtration of the solution through a 2 micron nylon filter cloth under positive pressure.

19. A process which comprises the steps of (a) providing a composition which comprises a mixture of (A) a first component comprising a polymer having terminal end groups and monomer repeat units, at least some of said monomer repeat units having at least one photosensitivity-imparting group thereon which enables crosslinking or chain extension of the polymer upon exposure to actinic radiation, said polymer having a first degree of photosensitivity-imparting group substitution measured in milliequivalents of photosensitivity-imparting group per gram of polymer, said polymer having monomer repeat units (a) of the general formula

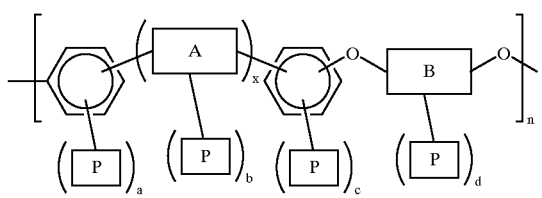

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

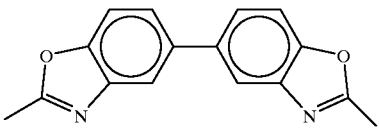

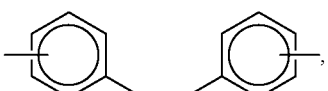

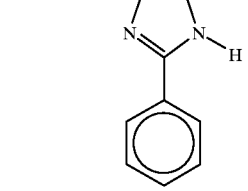

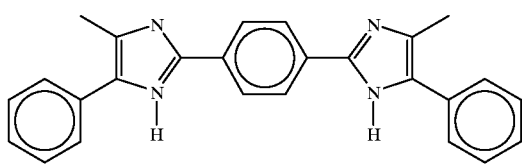

or mixtures thereof, B is

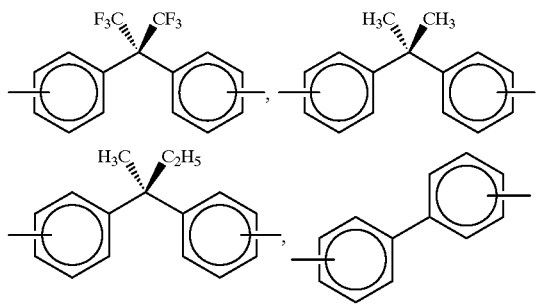

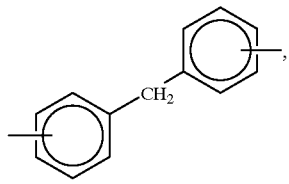

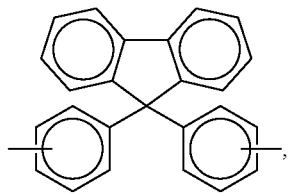

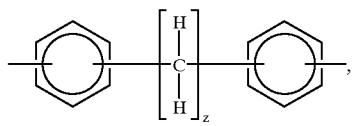

wherein z is an integer of from 2 to about 20,

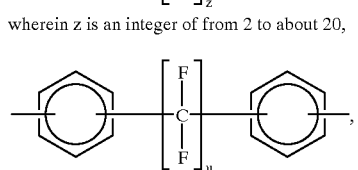

wherein u is an integer of from 1 to about 20,

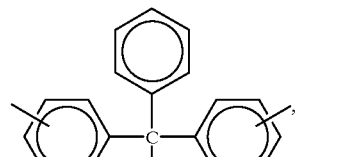

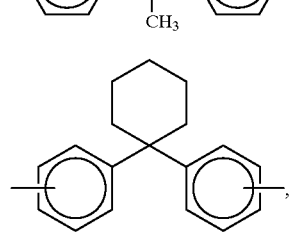

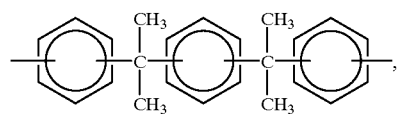

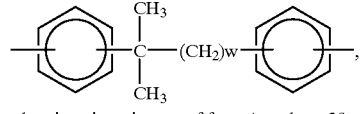

wherein w is an integer of from 1 to about 20,

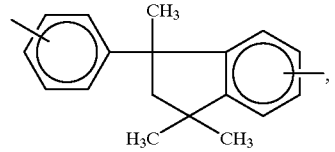

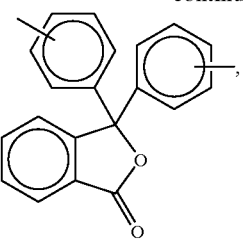

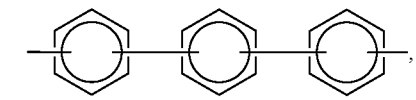

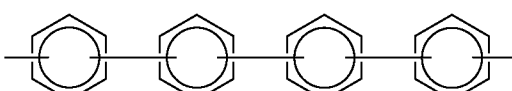

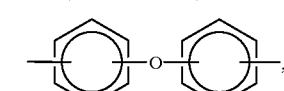

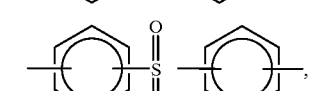

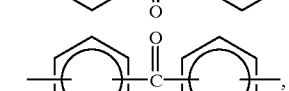

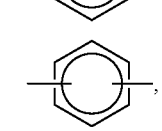

or mixtures thereof, and n is an integer representing the number of repeating monomer units; (b) of the general formula

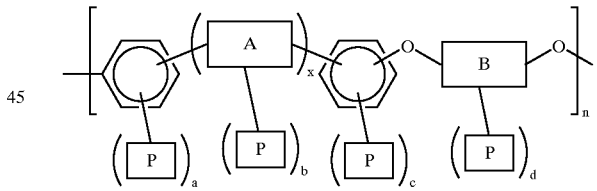

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

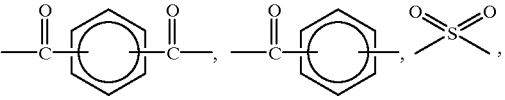

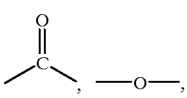

or mixtures thereof, B is

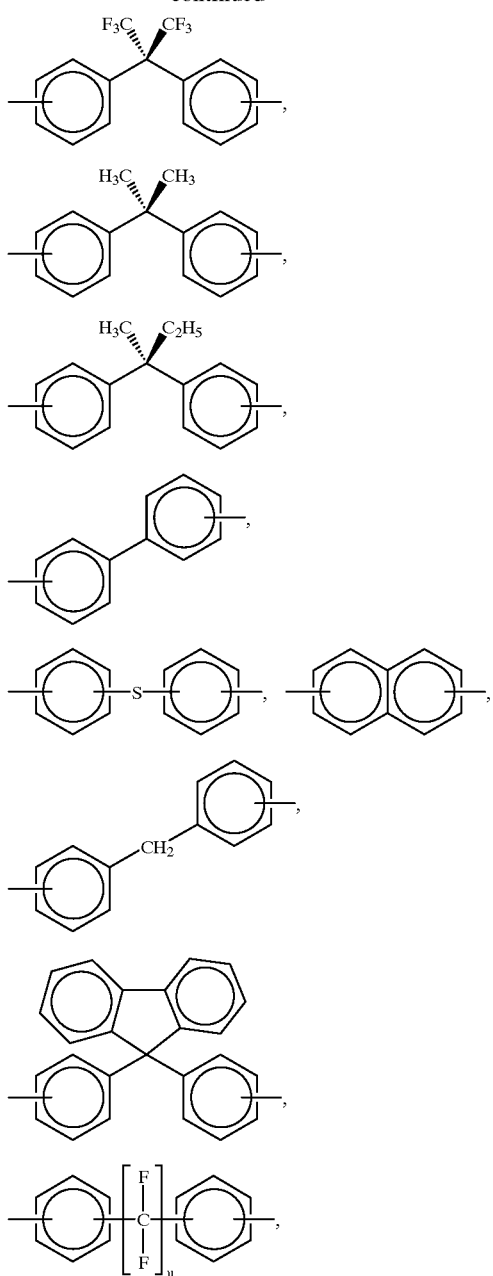

wherein u is an integer of from 1 to about 20,

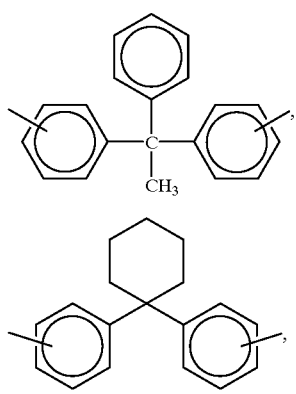

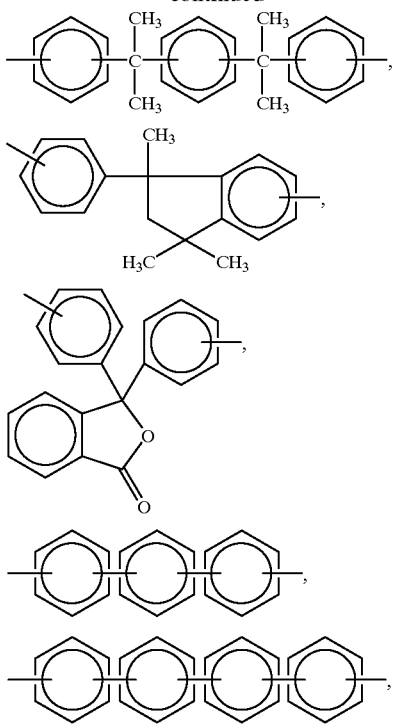

or mixtures thereof, and n is an integer representing the number of repeating monomer units; (c) of the general formula

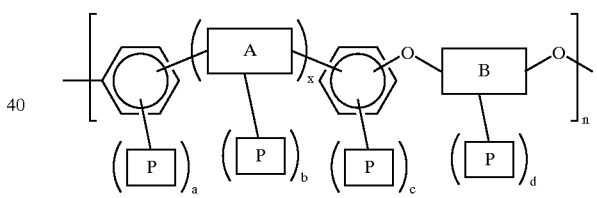

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

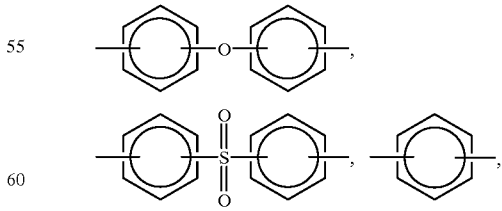

or mixtures thereof, and n is an integer representing the number of repeating monomer units; (d) of the general formula

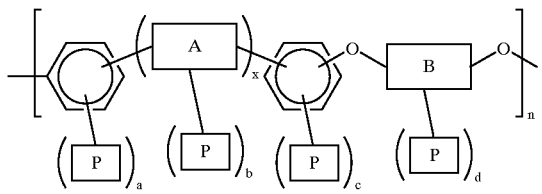

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

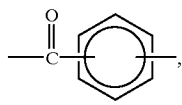

B is

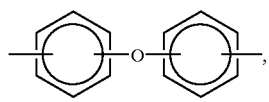

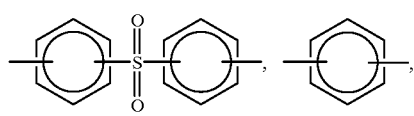

or mixtures thereof, and n is an integer representing the number of repeating monomer units; (e) of the general formula

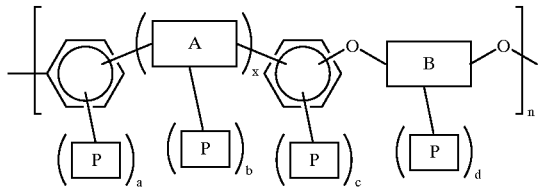

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

B is

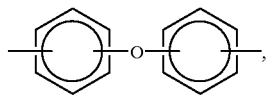

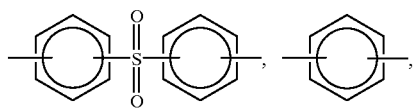

or mixtures thereof, and n is an integer representing the number of repeating monomer units; (f) of the general formula

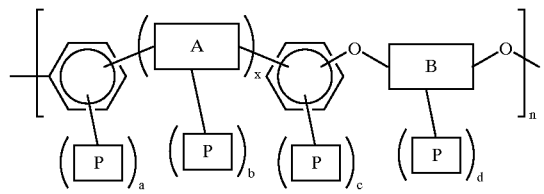

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

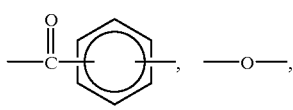, —O—, or mixtures thereof, B is

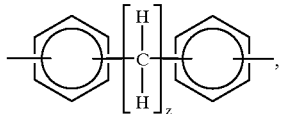

wherein z is an integer of from 2 to about 20,

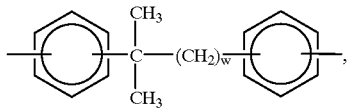

wherein w is an integer of from 1 to about 20, or mixtures thereof, and n is an integer representing the number of repeating monomer units; (g) of the general formula

[structure with A, B, and P groups as shown]

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

—C(CH$_3$)$_2$—,

B is

[structure showing biphenyl with F$_3$C and CF$_3$ groups]

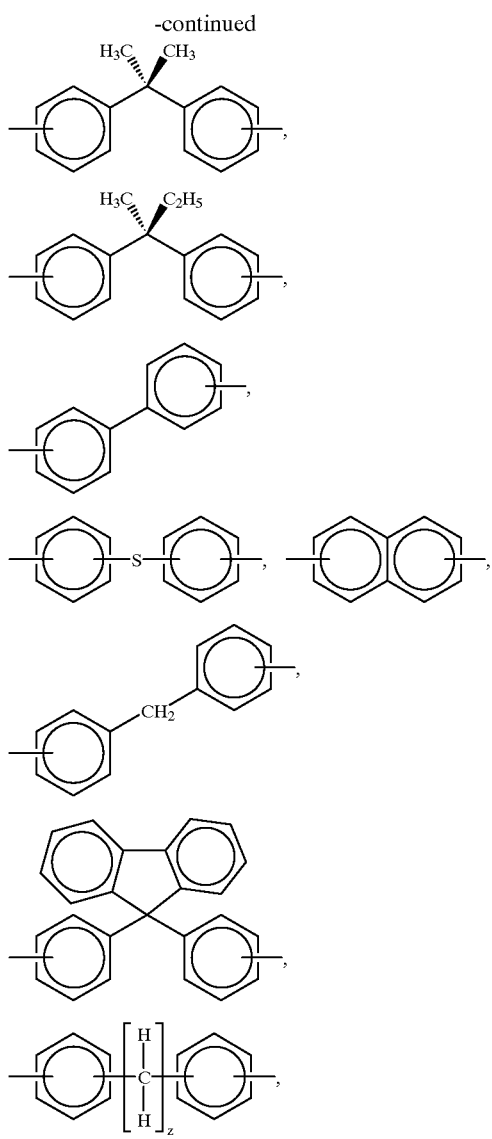

wherein z is an integer of from 2 to about 20,

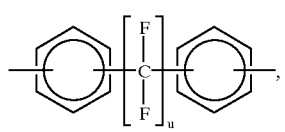

wherein u is an integer of from 1 to about 20,

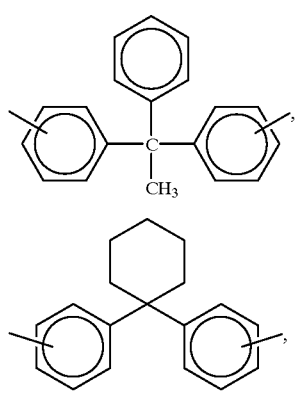

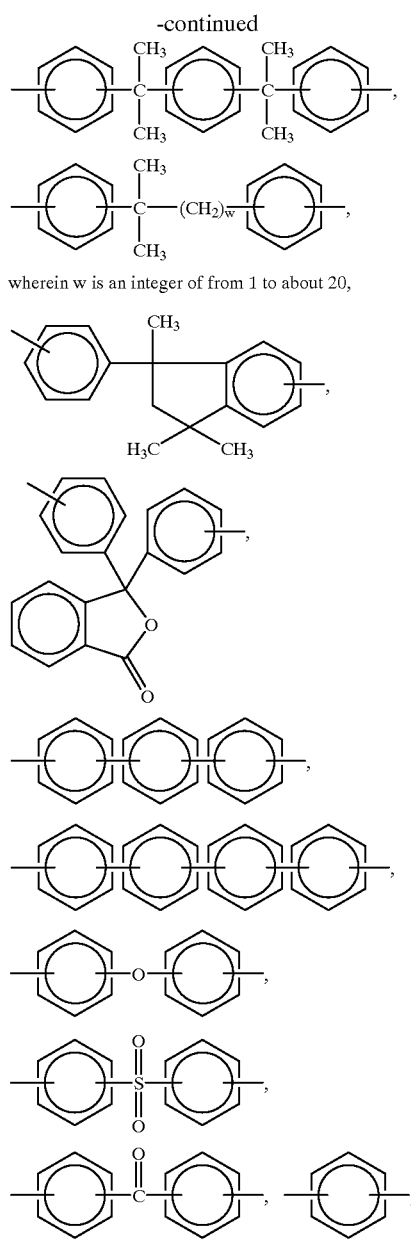

wherein w is an integer of from 1 to about 20, or mixtures thereof, and n is an integer representing the number of repeating monomer units; (h) of the general formula

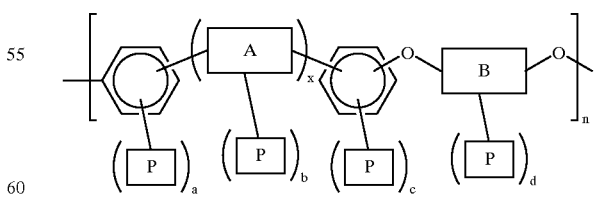

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

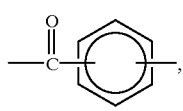

—O—, or mixtures thereof, and B is

—(CH₂)ᵥ—, wherein v is an integer of from 1 to about 20, or (i) of the general formula

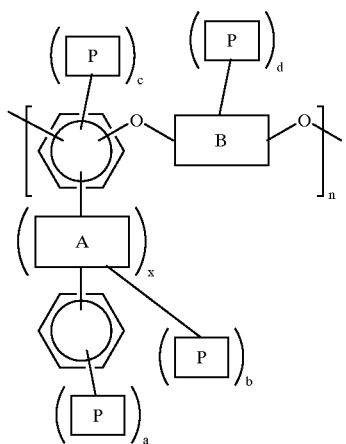

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

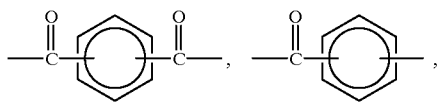

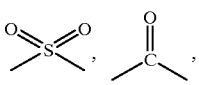

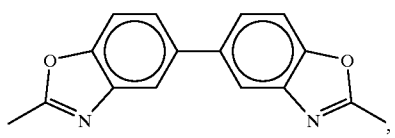

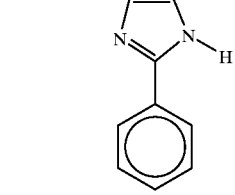

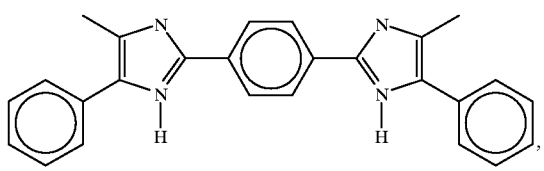

—O—, —C(CH₃)₂—, or mixtures thereof, B is

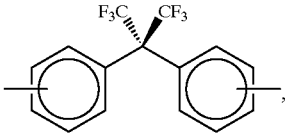

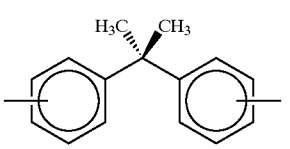

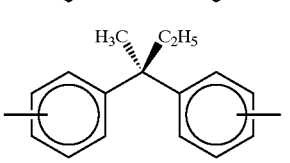

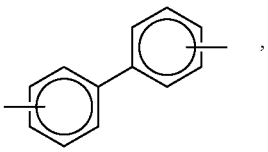

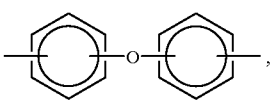

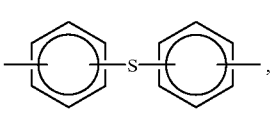

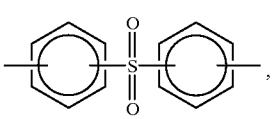

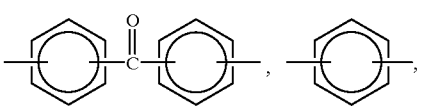

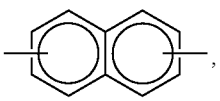

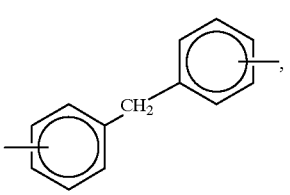

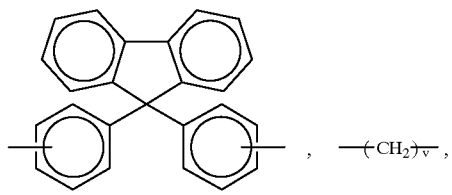

wherein v is an integer of from 1 to about 20,

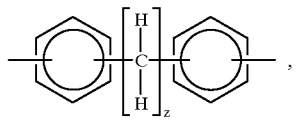

wherein z is an integer of from 2 to about 20,

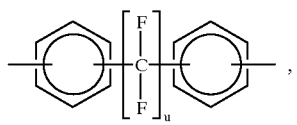

wherein u is an integer of from 1 to about 20,

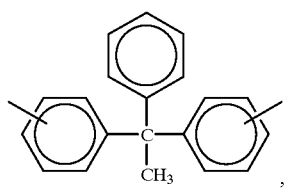

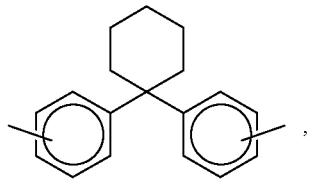

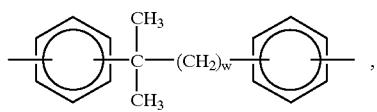

wherein w is an integer of from 1 to about 20,

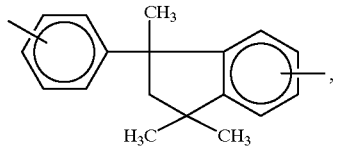

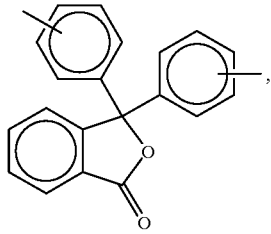

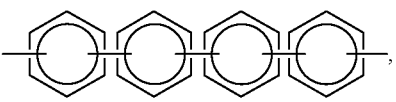

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram of mixture which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram of reactive diluent, wherein the mixture of the first component and the second component has a fifth degree of photosensitivity-imparting group substitution measured in milliequivalents of photosensitivity-imparting group per gram of mixture which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture; and (b) causing the first component polymer to become crosslinked or chain extended through the photosensitivity-imparting groups.

20. A process for preparing a photocurable composition having uniform weight average molecular weight and a uniform degree of unsaturated ester substitution, said process comprising the steps of:

(a) providing a first component comprising a polymer having terminal end groups and monomer repeat units, at least some of the monomer repeat units of which have at least one photosensitivity-imparting group thereon, said polymer having a first degree of photosensitivity-imparting group substitution measured in milliequivalents of photosensitivity-imparting group per gram of polymer and being (a) of the general formula

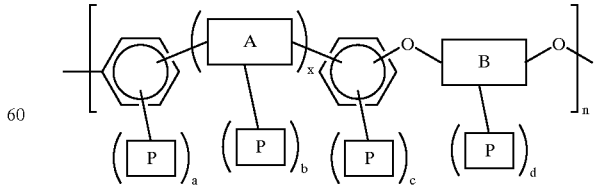

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is
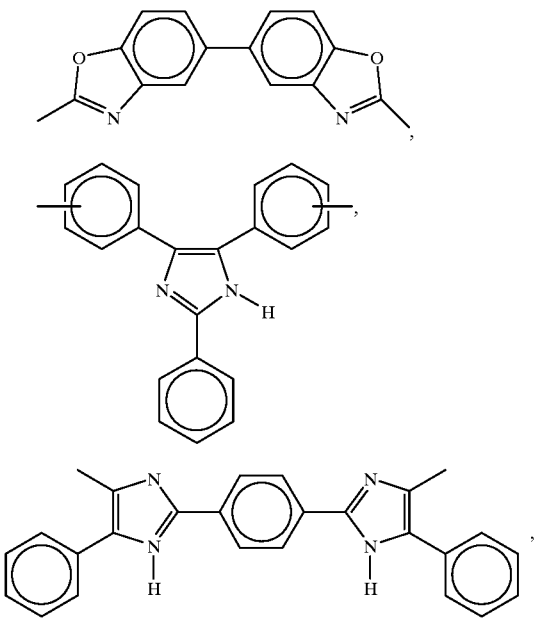
or mixtures thereof, B is
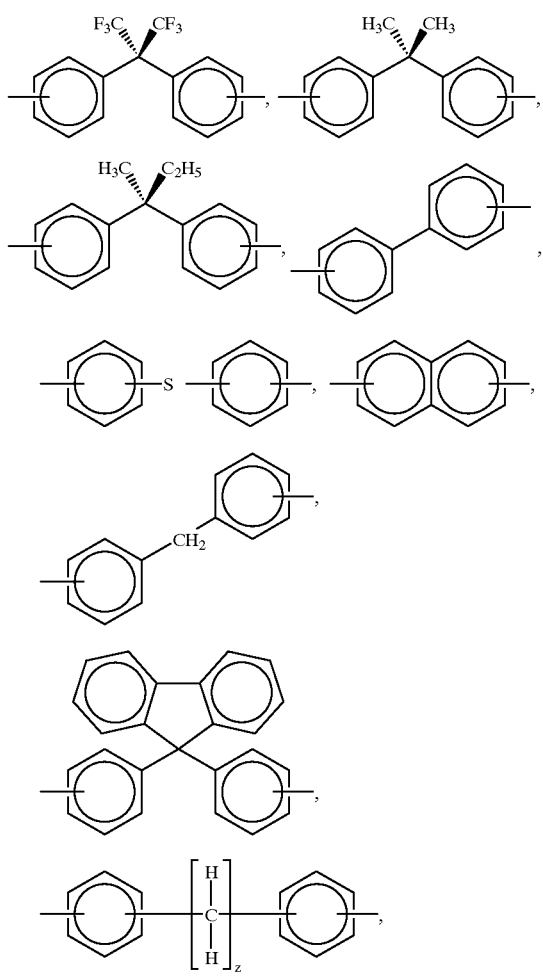
wherein z is an integer of from 2 to about 20,
-continued
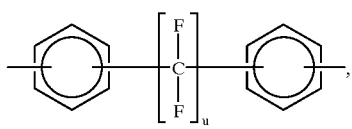
wherein u is an integer of from 1 to about 20,
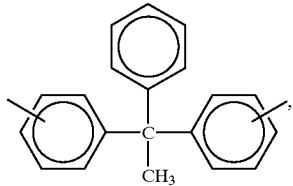
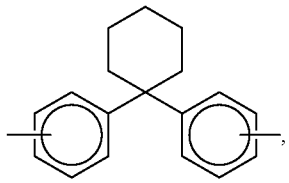
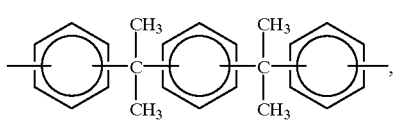
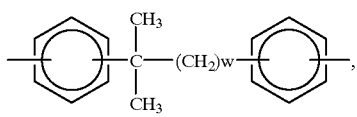
wherein w is an integer of from 1 to about 20,
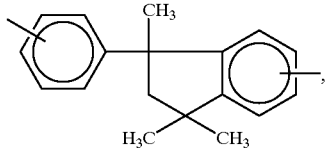
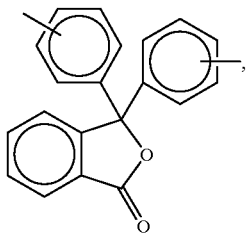
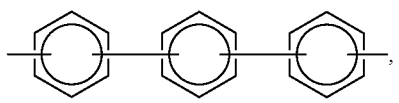
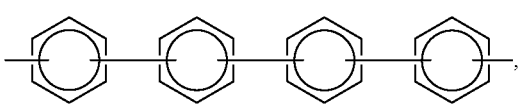
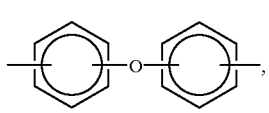
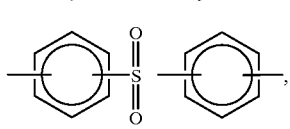

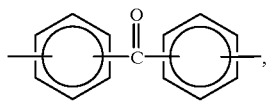

or mixtures thereof, and n is an integer representing the number of repeating monomer units; (b) of the general formula

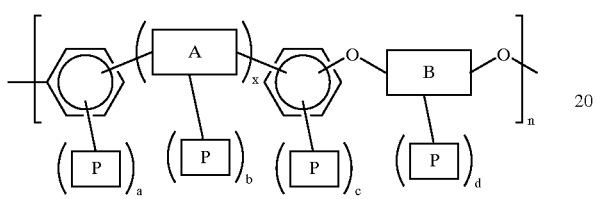

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

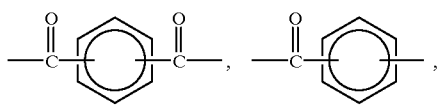

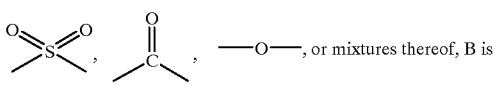, or mixtures thereof, B is

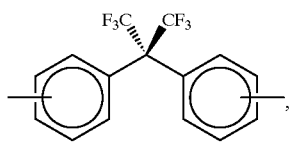

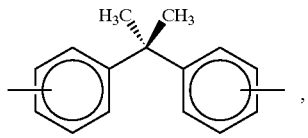

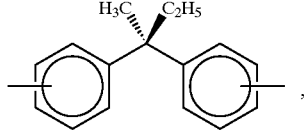

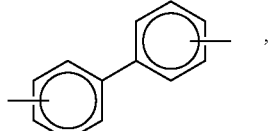

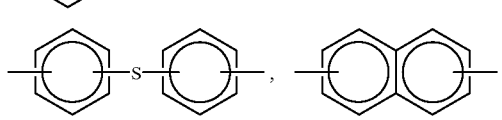

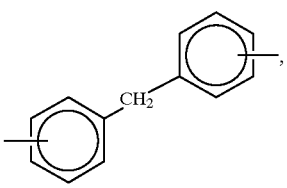

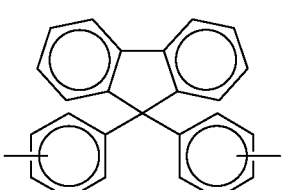

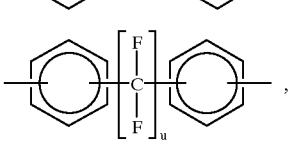

wherein u is an integer of from 1 to about 20,

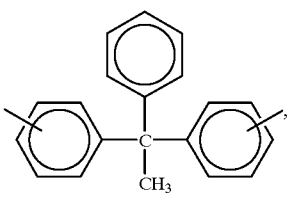

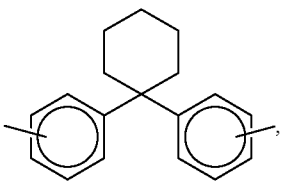

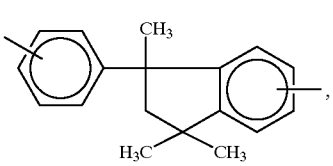

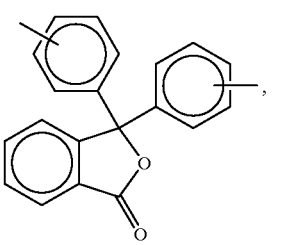

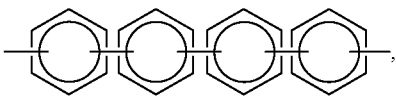

or mixtures thereof, and n is an integer representing the number of repeating monomer units; (c) of the general formula

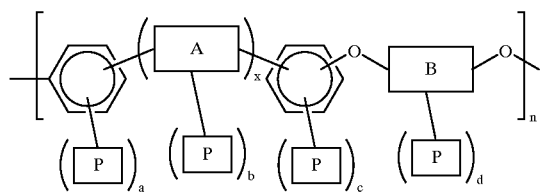

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

B is

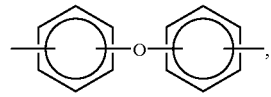

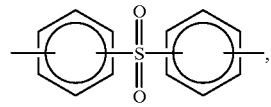

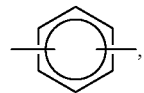

or mixtures thereof, and n is an integer representing the number of repeating monomer units; (d) of the general formula

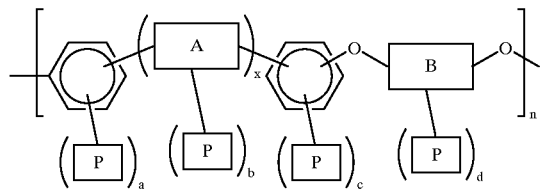

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

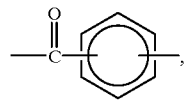

B is

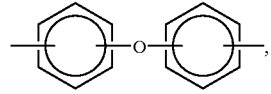

-continued

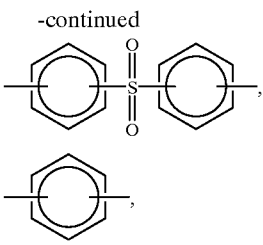

or mixtures thereof, and n is an integer representing the number of repeating monomer units; (e) of the general formula

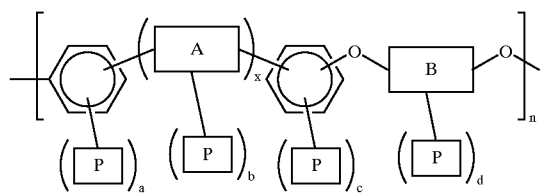

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

B is

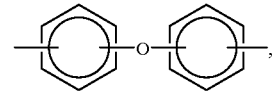

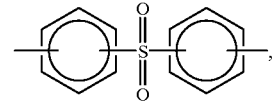

or mixtures thereof, and n is an integer representing the number of repeating monomer units; (f) of the general formula

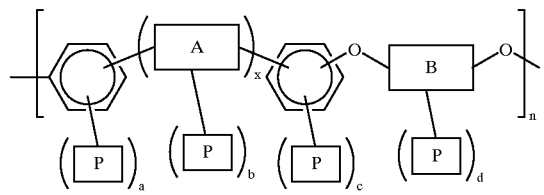

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

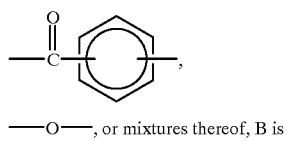

—O—, or mixtures thereof, B is

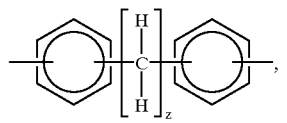

wherein z is an integer of from 2 to about 20,

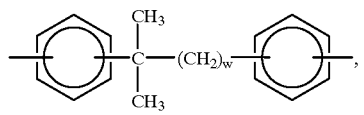

wherein w is an integer of from 1 to about 20, or mixtures thereof, and n is an integer representing the number of repeating monomer units; (g) of the general formula

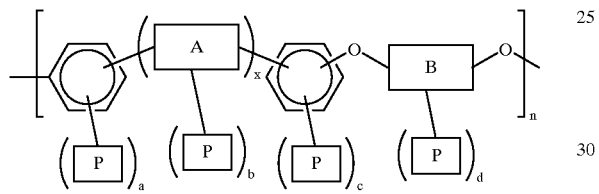

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

—C(CH$_3$)$_2$—,

B is

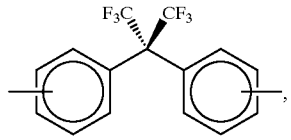

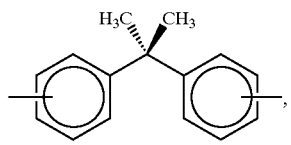

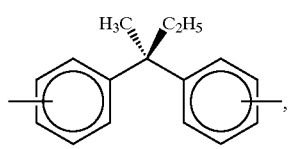

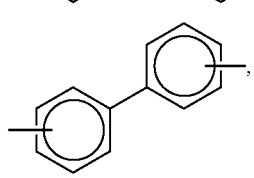

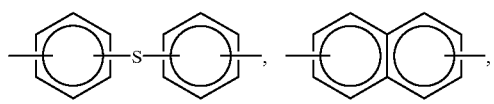

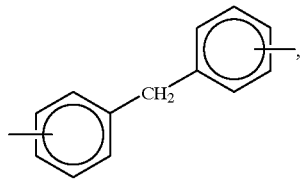

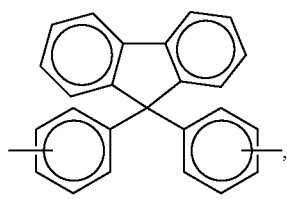

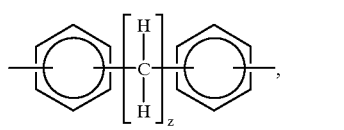

wherein z is an integer of from 2 to about 20,

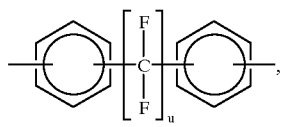

wherein u is an integer of from 1 to about 20,

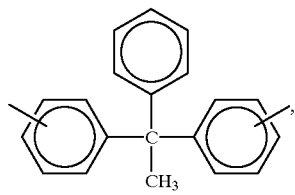

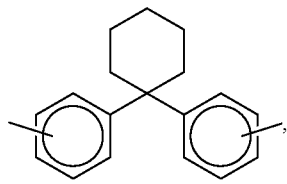

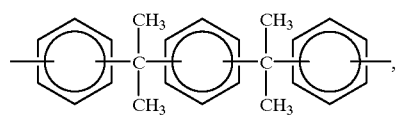

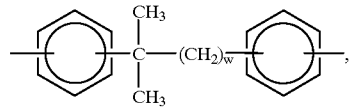

wherein w is an integer of from 1 to about 20,

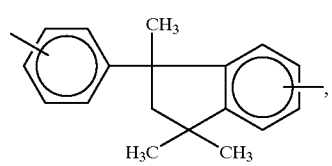

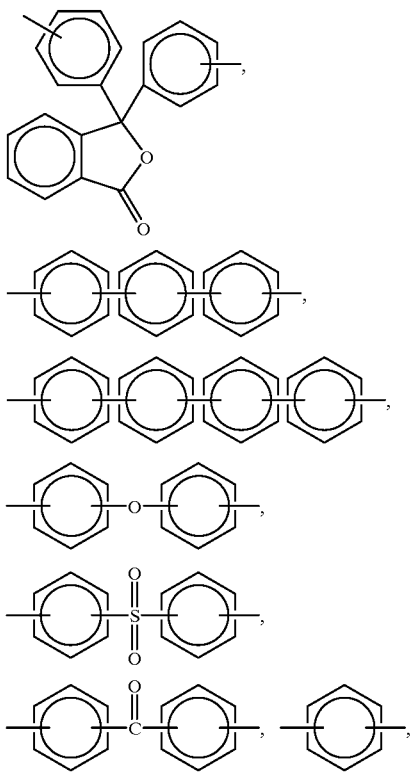

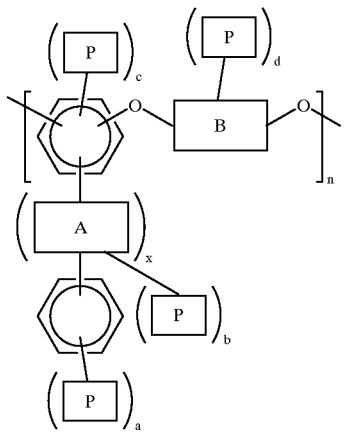

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

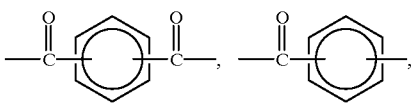

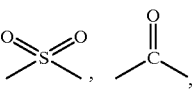

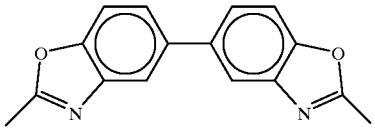

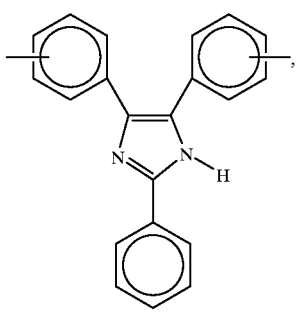

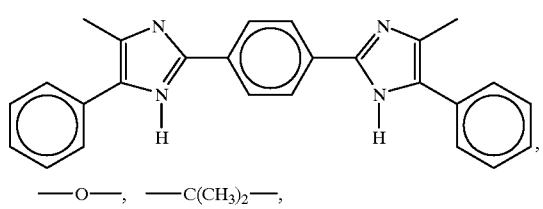

—O—, —C(CH$_3$)$_2$—, or mixtures thereof, B is

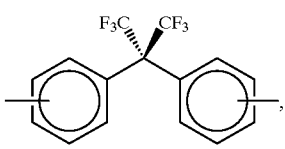

or mixtures thereof, and n is an integer representing the number of repeating monomer units; (h) of the general formula

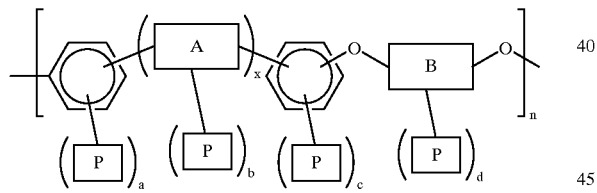

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

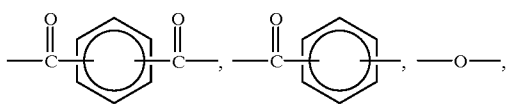

or mixtures thereof, and B is

—(CH$_2$)$_v$—, wherein v is an integer of from 1 to about 20, or (i) of the general formula -continued

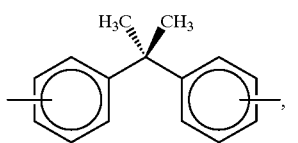

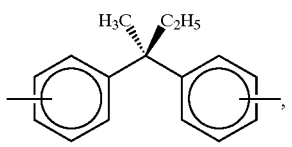

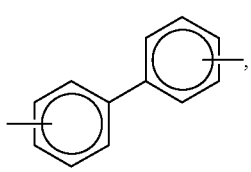

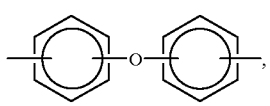

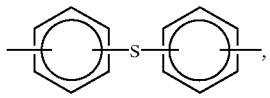

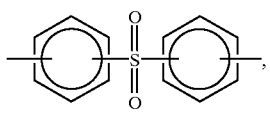

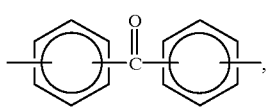

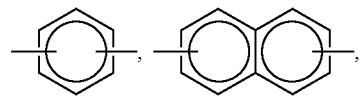

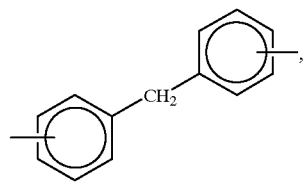

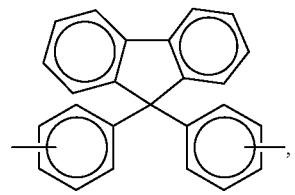

—(CH$_2$)$_{\overline{v}}$—, wherein v is an integer of from 1 to about 20,

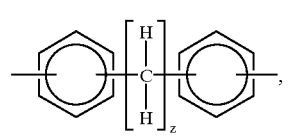

wherein z is an integer of from 2 to about 20,

-continued

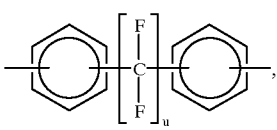

wherein u is an integer of from 1 to about 20,

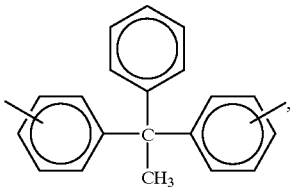

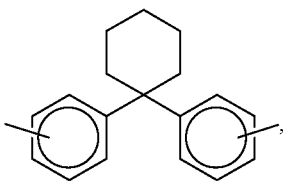

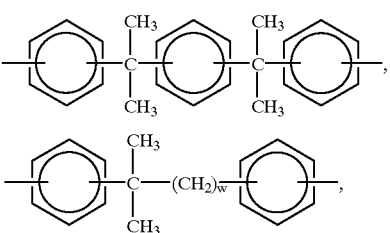

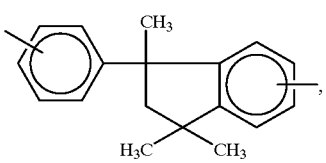

wherein w is an integer of from 1 to about 20,

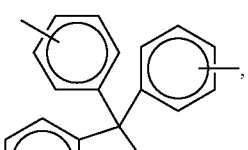

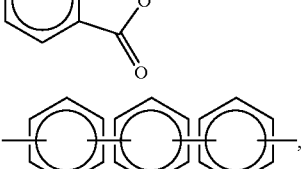

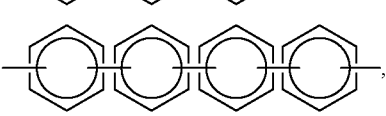

or mixtures thereof, and n is an integer representing the number of repeating monomer units;

(b) providing a second component which comprises either (1) a polymer having a second degree of photosensitivity-imparting group substitution measured in milliequivalents of photosensitivity-imparting group per gram of polymer lower than the first degree of photosensitivity-imparting group substitution, wherein said second degree of photosensitivity-imparting group substitution may be zero, or (2) a reactive diluent having at least one photosensitivity-imparting group per molecule and having a fourth degree of photosensitivity-imparting group substitution measured in milliequivalents of photosensitivity-imparting group per gram of reactive diluent; and (c) admixing the first component and the second component in relative amounts to result in either (1) a mixture of the first component and the polymer having a second degree of photosensitivity-imparting group substitution, said mixture having a third degree of photosensitivity-imparting group substitution which is lower than the first degree of photosensitivity-imparting group substitution and higher than the second degree of photosensitivity-imparting group substitution, or (2) a mixture of the first component and the reactive diluent having at least one photosensitivity-imparting group per molecule and having a fourth degree of photosensitivity-imparting group substitution, said mixture having a fifth degree of photosensitivity-imparting group substitution measured in milliequivalents of photosensitivity-imparting group per gram of mixture which is higher than the first degree of photosensitivity-imparting group substitution and lower than the fourth degree of photosensitivity-imparting group substitution; said mixture having a weight average molecular weight of from about 10,000 to about 50,000, wherein the third or fifth degree of photosensitivity-imparting group substitution is from about 0.25 to about 2 milliequivalents of photosensitivity-imparting groups per gram of mixture, further comprising the step of causing the first component polymer to become crosslinked or chain extended through the photosensitivity-imparting groups, wherein crosslinking or chain extension is effected by heating the polymer to a temperature sufficient to enable the photosensitivity-imparting groups to form crosslinks or chain extensions in the polymer.

* * * * *